(12) United States Patent
Madden et al.

(10) Patent No.: US 10,831,319 B2
(45) Date of Patent: Nov. 10, 2020

(54) CLUSTER SENSOR

(71) Applicant: The University of British Columbia, Vancouver (CA)

(72) Inventors: John D. W. Madden, Vancouver (CA); Mirza S. Sarwar, Vancouver (CA)

(73) Assignee: The University of British Columbia, Vancouver (CA)

( * ) Notice: Subject to any disclaimer, the term of this patent is extended or adjusted under 35 U.S.C. 154(b) by 125 days.

(21) Appl. No.: 15/893,499

(22) Filed: Feb. 9, 2018

(65) Prior Publication Data

US 2018/0246594 A1 Aug. 30, 2018

Related U.S. Application Data

(60) Provisional application No. 62/457,105, filed on Feb. 9, 2017.

(51) Int. Cl.
*G06F 3/044* (2006.01)
*H03K 17/955* (2006.01)
(Continued)

(52) U.S. Cl.
CPC .............. *G06F 3/044* (2013.01); *G06F 3/038* (2013.01); *G06F 3/0416* (2013.01);
(Continued)

(58) Field of Classification Search
CPC ........ G06F 3/044; G06F 3/0416; G06F 3/038; G06F 2203/04105; G06F 2203/04103;
(Continued)

(56) References Cited

U.S. PATENT DOCUMENTS 4,293,734 A 10/1981 Pepper, Jr.
4,574,438 A 3/1986 Diepers et al.
(Continued)

FOREIGN PATENT DOCUMENTS

WO 2009144615 12/2009
WO 2012170399 12/2012
(Continued)

OTHER PUBLICATIONS

Supplementary European Search Report of EP App. 15 86 5607, dated Jun. 28, 2018.
(Continued)

*Primary Examiner* — Amr A Awad
*Assistant Examiner* — Maheen I Javed
(74) *Attorney, Agent, or Firm* — Todd A. Rattray; Oyen Wiggs Green & Mutala LLP

(57) ABSTRACT

A sensor for detecting and distinguishing between increasing and decreasing proximity of a pointing element, touch by a pointing element, pressure applied by a pointing element, stretching (and/or other deformation) of the sensor, and any of the above while stretching and/or otherwise deforming the sensor. The sensor may comprise a cluster sensor unit having a first sensor and a second sensor wherein the first sensor has a higher ratio of distal flux to proximate flux as compared to the second sensor. With this flux characteristic, the first sensor is relatively more sensitive (as compared to the second sensor) to proximity of a pointing element, while the second sensor is relatively more sensitive (as compared to the first sensor) to force and/or pressure applied by the pointing element.

6 Claims, 24 Drawing Sheets

(51) Int. Cl.
- *G06F 3/038* (2013.01)
- *H03K 17/96* (2006.01)
- *G06F 3/041* (2006.01)
- *H03K 17/975* (2006.01)

(52) U.S. Cl.
CPC ......... *H03K 17/955* (2013.01); *H03K 17/962* (2013.01); *H03K 17/975* (2013.01); *G06F 2203/04103* (2013.01); *G06F 2203/04105* (2013.01)

(58) Field of Classification Search
CPC ... H03K 17/975; H03K 17/962; H03K 17/955
See application file for complete search history.

(56) References Cited

U.S. PATENT DOCUMENTS

| | | |
|---|---|---|
| 6,543,299 B2 | 4/2003 | Taylor |
| 6,586,810 B2 | 7/2003 | Thakur |
| 6,809,462 B2 | 10/2004 | Pelrine et al. |
| 7,477,242 B2 | 1/2009 | Cross et al. |
| 7,719,027 B2 | 5/2010 | Chen |
| 8,612,856 B2 | 12/2013 | Hotelling et al. |
| 8,726,908 B2 | 5/2014 | Squitieri |
| 8,730,199 B2 | 5/2014 | Sleeman et al. |
| 8,757,165 B2 | 6/2014 | Squitieri |
| 8,920,174 B2 | 12/2014 | Tachi et al. |
| 8,937,607 B2 | 1/2015 | Brown |
| 9,582,124 B2 | 2/2017 | Han |
| 9,766,757 B2 | 9/2017 | Keller |
| 9,933,888 B2 | 4/2018 | Kim et al. |
| 2004/0169262 A1 | 9/2004 | Oliver et al. |
| 2005/0124864 A1 | 6/2005 | Mack et al. |
| 2005/0190624 A1 | 9/2005 | Kasai |
| 2006/0144154 A1 | 7/2006 | Ueno et al. |
| 2006/0213275 A1 | 9/2006 | Cobianu et al. |
| 2006/0266642 A1 | 11/2006 | Akle et al. |
| 2008/0054875 A1 | 3/2008 | Saito |
| 2008/0208063 A1 | 8/2008 | Brauers et al. |
| 2009/0194344 A1 | 8/2009 | Harley et al. |
| 2009/0301875 A1 | 12/2009 | Wu et al. |
| 2010/0079401 A1 | 4/2010 | Staton |
| 2010/0097323 A1* | 4/2010 | Edwards ................. G06F 3/016 345/173 |
| 2010/0289503 A1 | 11/2010 | Reynolds et al. |
| 2010/0309162 A1 | 12/2010 | Nakanishi et al. |
| 2011/0007030 A1 | 1/2011 | Mo et al. |
| 2011/0237921 A1 | 9/2011 | Askin, III et al. |
| 2012/0092350 A1* | 4/2012 | Ganapathi .......... G02B 26/0833 345/501 |
| 2012/0277637 A1 | 11/2012 | Vahdatpour et al. |
| 2013/0106244 A1 | 5/2013 | Liu et al. |
| 2013/0257785 A1 | 10/2013 | Brown et al. |
| 2013/0257793 A1* | 10/2013 | Zeliff ................. G06F 3/03545 345/174 |
| 2014/0097857 A1 | 4/2014 | Hu |
| 2014/0152621 A1 | 6/2014 | Okayama et al. |
| 2014/0174189 A1 | 6/2014 | Pan et al. |
| 2014/0327843 A1 | 11/2014 | Liu et al. |
| 2016/0054844 A1* | 2/2016 | Lin ...................... G06F 3/0416 345/173 |
| 2016/0086306 A1 | 6/2016 | Madden et al. |
| 2016/0258829 A1 | 9/2016 | Celik-Butler et al. |
| 2016/0365198 A1 | 12/2016 | Pan et al. |
| 2017/0059426 A1 | 3/2017 | Choi et al. |
| 2017/0059434 A1 | 3/2017 | Li et al. |
| 2017/0139527 A1 | 5/2017 | Nathan et al. |
| 2017/0224280 A1 | 8/2017 | Bozkurt et al. |
| 2017/0356812 A1 | 12/2017 | Madden et al. |
| 2017/0356815 A1 | 12/2017 | Madden et al. |
| 2018/0038745 A1 | 2/2018 | Madden et al. |
| 2018/0095582 A1 | 4/2018 | Hwang et al. |
| 2018/0246589 A1 | 8/2018 | So et al. |

FOREIGN PATENT DOCUMENTS

| | | |
|---|---|---|
| WO | 2014169119 | 10/2014 |
| WO | 2015048530 | 4/2015 |
| WO | 2016141468 | 9/2016 |
| WO | 2017210795 | 12/2017 |

OTHER PUBLICATIONS

World Intellectual Property Organization, International Search Report (ISR) dated Jun. 8, 2016 in PCT/CA2016/050238.

World Intellectual Property Organization, Written Opinion (WO) dated Jun. 8, 2016 in PCT/CA2016/050238.

World Intellectual Property Organization, International Preliminary Report on Patentability (IPRP) dated Sep. 12, 2017 in PCT/CA2016/050238.

Extended European Search Report dated Sep. 26, 2018 in corresponding EP Patent Application No. 16760965.0.

Sun et al. "Ionic skin". Adv Mater, Dec. 3, 2014, 26(45):7608-14.

Rossi. "Electronic textiles: A logical step". Nat Mater 6. (2007). pp. 328-329.

Xu et al. "Soft Microfluidic assemblies of Sensors, Circuits, and Radios for the Skin". Science (80–) 344. (2014).

Someya. "Building bionic skin". IEEE Spectr 50. (2013). pp. 50-56.

Wang et al. "Recent Progress in Electronic Skin". Adv Sci 2. (2015).

Someya et al. "A large-area, flexible pressure sensor matrix with organic field-effect transistors for artificial skin applications". Proc Natl Acad Sci 101. (2004). p. 9966-9970.

Hu et al. "Elastomeric transparent capacitive sensors based on an interpenetrating composite of silver nanowires and polyurethane". Appl Phys Lett 102, 83303. (2013).

Xu et al. "Where the rubber meets the hand: Unlocking the sensing potential of dielectric elastomers". J Polym Sci Part B Polym Phys 54. (2016). pp. 465-472.

Choi et al. "Flexible and transparent touch sensor using single-wall carbon nanotube thin-films". Sensors Actuators, A Phys 6. (2014). pp. 859-864.

Cohen et al. "A highly elastic, capacitive strain gauge based on percolating nanotube networks". Nano Lett 12. (2012). pp. 1821-1825.

Cai et al. Super-stretchable, transparent carbon nanotube-based capacitive strain sensors for human motion detection. Sci Rep 3, 3048 (2013).

Pang et al. "A flexible and highly sensitive strain-gauge sensor using reversible interlocking of nanofibres". Nat Mater 11. (2012). pp. 795-801.

Lipomi et al. "Skin-like pressure and strain sensors based on transparent elastic films of carbon nanotubes". Nat Nanotechnol 6. (2011). pp. 788-792.

Park et al. "Stretchable energy-harvesting tactile electronic skin capable of differentiating multiple mechanical stimuli modes". Adv Mater 26. (2014). pp. 7324-7332.

Zhang et al. "Dual functional transparent film for proximity and pressure sensing". Nano Res. 7. (2014). pp. 1488-1496.

Gu et al. "Transparent elastic capacitive pressure sensors based on silver nanowire electrodes". 8th Annu IEEE Int Conf Nano/Micro Eng Mol Syst 1. (2013). pp. 1183-1185.

Larson et al. "Highly stretchable electroluminescent skin for optical signaling and tactile sensing." Science (80–), 351. (2016).

Sekitani et al. "Stretchable active-matrix organic light-emitting diode display using printable elastic conductors". Nat Mater 8. (2009). pp. 494-499.

Chou et al. "A chameleon-inspired stretchable electronic skin with interactive colour changing controlled by tactile sensing". Nat Commun 6, 8011. (2015).

Wang et al. "Transparent, stretchable, carbon-nanotube-inlaid conductors enabled by standard replication technology for capacitive pressure, strain and touch sensors". J Mater Chem A 1, 3580. (2013).

Kim et al. "Stretchable silicon nanoribbon electronics for skin prosthesis". Nat Commun 5, 5747 (2014).

Li et al. "Mutual capacitance of liquid conductors in deformable tactile sensing arrays". Appl Phys Lett 108, 13502. (2016).

(56) References Cited

OTHER PUBLICATIONS

Walker. "A review of technologies for sensing contact location on the surface of a display". J Soc Inf Disp 20. (2012) pp. 413-440.
Keplinger et al. "Stretchable, transparent, ionic conductors". Science 341 No. 6149. (2013). pp. 984-987.
Kim et al. "Highly stretchable, transparent ionic touch panel". Science 353. (2016). pp. 682-687.
Schmeder et al. "Support Vector Machine Learning for Gesture Signal Estimation with a Piezo-Resistive Fabric Touch Surface". Proc 2010 Conf New Interfaces Music Expr (NIME 2010). (2010). pp. 244-249.
Flagg et al. "Affective touch gesture recognition for a furry zoomorphic machine". Proc 7th Int Conf Tangible, Embed Embodied Interact. TEI'13, 25. (2013).
Friend et al. "Fabrication of microfluidic devices using polydimethylsiloxane". Biomicrofluidics 4. (2010). doi: 10.1063/1.3259624.
Lake et al. "Microfluidic device design, fabrication, and testing protocols". Protoc Exch. (2015). doi: 10.1038/protex.2015.069.
Sia et al. "Microfluidic devices fabricated in poly(dimethlsiloxane) for biological studies". Electrophoresis 24. (2003). pp. 3563-3576.
Temiz et al. "Lab-on-a-chip devices: how to close and plug the lab?". Microelectron Eng 132. (2014). pp. 156-175.
Eddings et al. "Determining the optimal PDMS-PDMS bonding technique for microfluidic devices". J Micromechanics Microengineering 18, 67001. (2008).
Chow et al. "Microfluidic channel fabrication by PDMS-interface bonding". Smart Mater Struct 15. (2006). pp. S112-S116.
Bai et al. "Transparent hydrogel with enhanced water retention capacity by introducing highly hydratable salt". Appl Phys Lett 105, 151903. (2014).
Wu et al. "Deformable Antireflection Coatings from Polymer and Nonoparticle Multilayers". Adv Mater 18. (2006). pp. 2699-2702.
Wei et al. "A silicon MEMS structure for characterization of femto-farad-level capacitive sensors with lock-in architecture". J Micromechanics Microengineering 20, 64019. (2010).
Sun et al. "Highly stretchable and tough hydrogels". Nature, 2012, vol. 489, No. 7414, pp. 133-136.

Dobashi et al., Mechanoionic Transduction of Solid Polymer Electrolytes and Potential Applications—VER11, Biomaterials and Soft Materials, vol. 1, Issue 1, pp. 63-68, Jan. 26, 2016.
Liu et al., Self-Powered Piezoionic Strain Sensor Toward the Monitoring of Human Activities, Small 12 (36), 5074-5080, May 6, 2016.
Print-out of www.boditrak.com on May 23, 2015. Accessed on www.web.archive.org.
Print-out of www.themapsystem.com on Nov. 17, 2015. Accessed on www.web.archive.org.
Print-out of www.tekscan.com/product-group/medical/bedding-seating on Apr. 12, 2015. Accessed on www.web.archive.org.
United Nations Department of Economic and Social Affairs. "World Population Ageing 2013". United Nations, 2013. http://www.un.org/en/development/desa/poplulation/publications/pdf/ageing.
Brown, Brandon R. "Temperature Response in Electrosensors and Thermal Voltages in Electrolytes." Journal of Biological Physics 36.2 (2010): 121-134.
Otsuki et al., "Characterization of a curvature sensor using a solid polymer electrolyte," ICMIT 2009: Mechatronics and Information Technology, 2009, pp. 75000L-75000L-8.
Shahinpoor et al. "A New Effect in Ionic Polymeric Gels: the Ionic Flexogelectric Effect," Proceedings of the SPIE—The International Society for Optical Engineering, (1995), vol. 2441, pp. 42-53.
Noh et al. "Ferroelectret film-based patch-type sensor for continous blood pressure moitoring" Electron, Lett, 2014, vol. 50(3), pp. 143-144.
Karki et al. "Measurement of heart sounds with EMFi transducer" in Proc. Int. Conf. Eng. Med. Biol. Soc., Lyon, France, 2007, pp. 1683-1686.
Otsuki et al. "Characteristic evaluation of a solid polymer electrolyte sensor", Microsyst. Technol., 2011, vol. 17, pp. 1129-1133.
Mannsfeld, Stefan C B. "Highly sensitive flexible pressure sensors with microstructured rubber dielectric layers". Nature Materials, Oct. 2010, vol. 9: 859-864.
Sarwar et al., Transparent and Conformal 'Piezoionic' Touch Sensor, Proc. of SPIE vol. 9430, pp. 943026-1-943026-9 (2015).

* cited by examiner

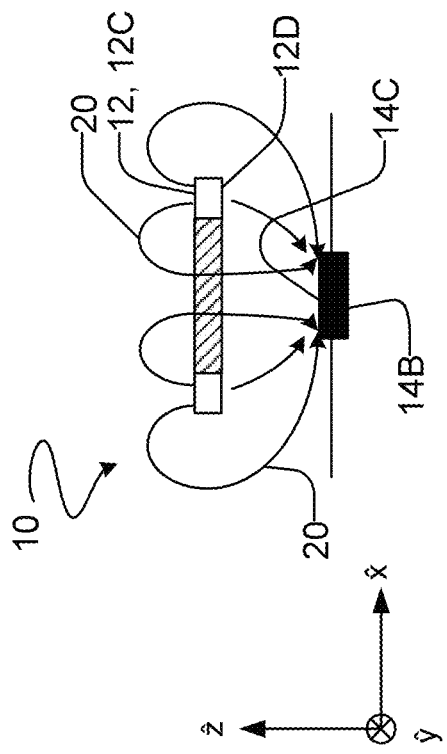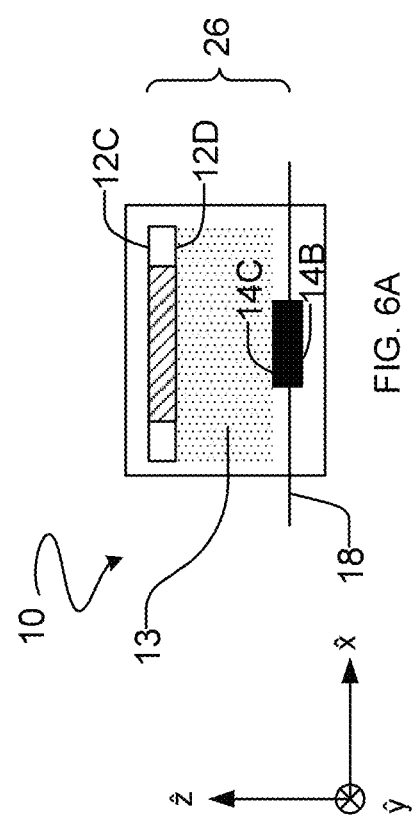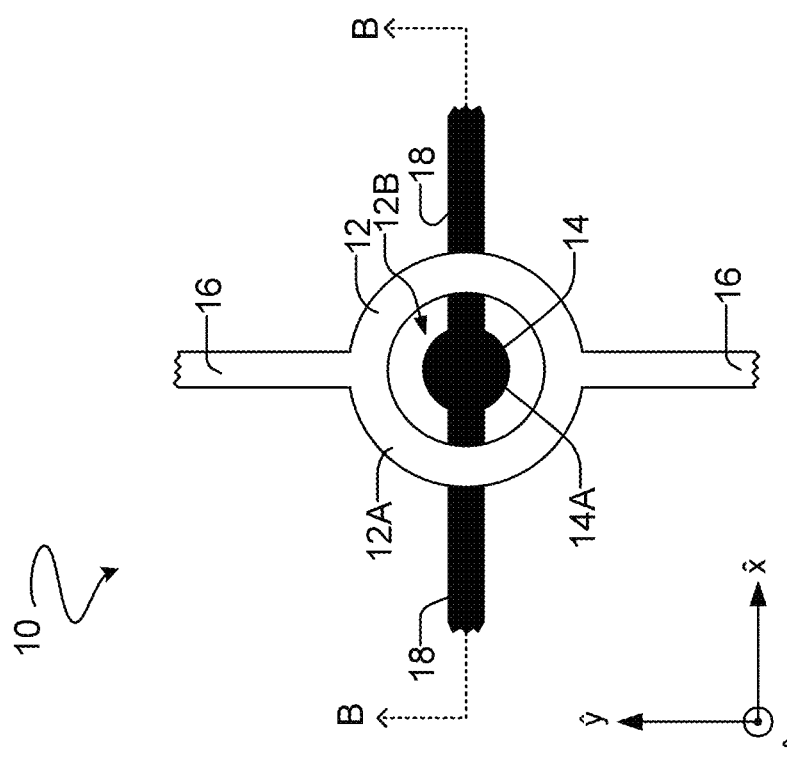

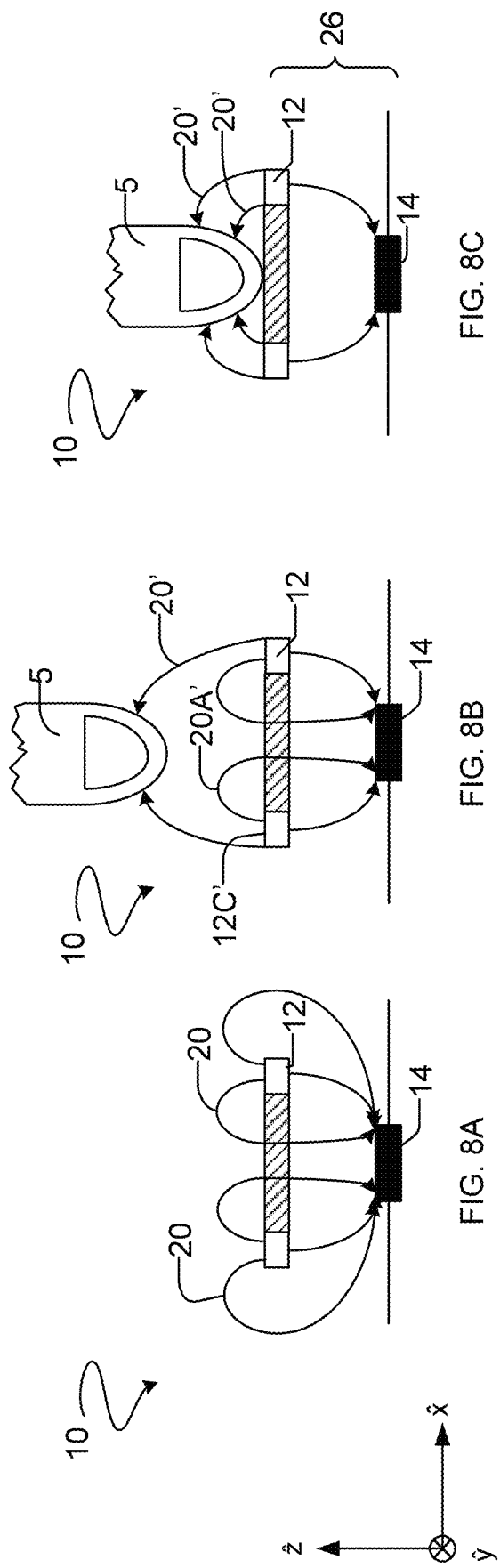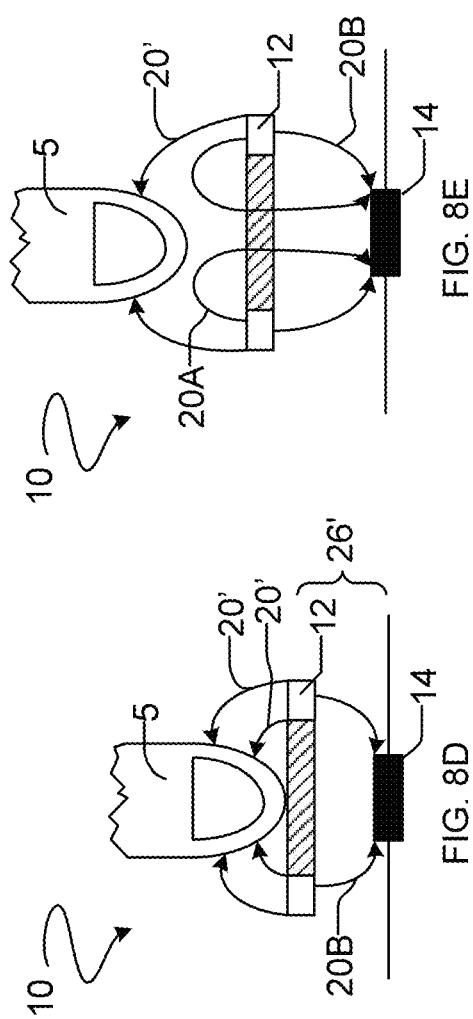

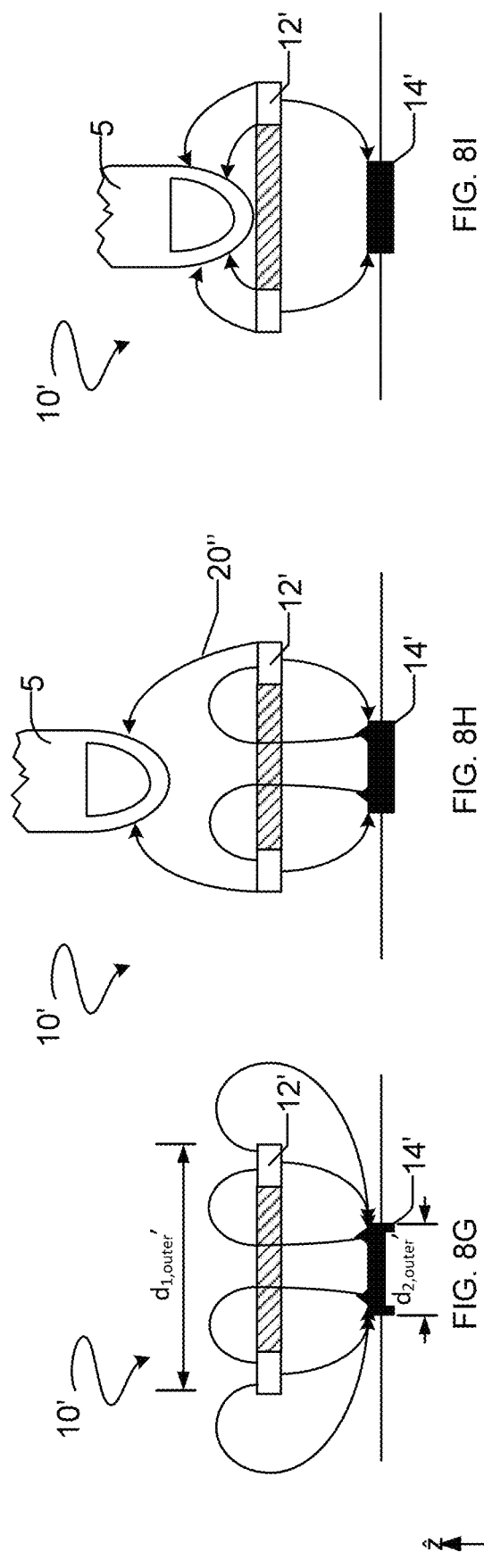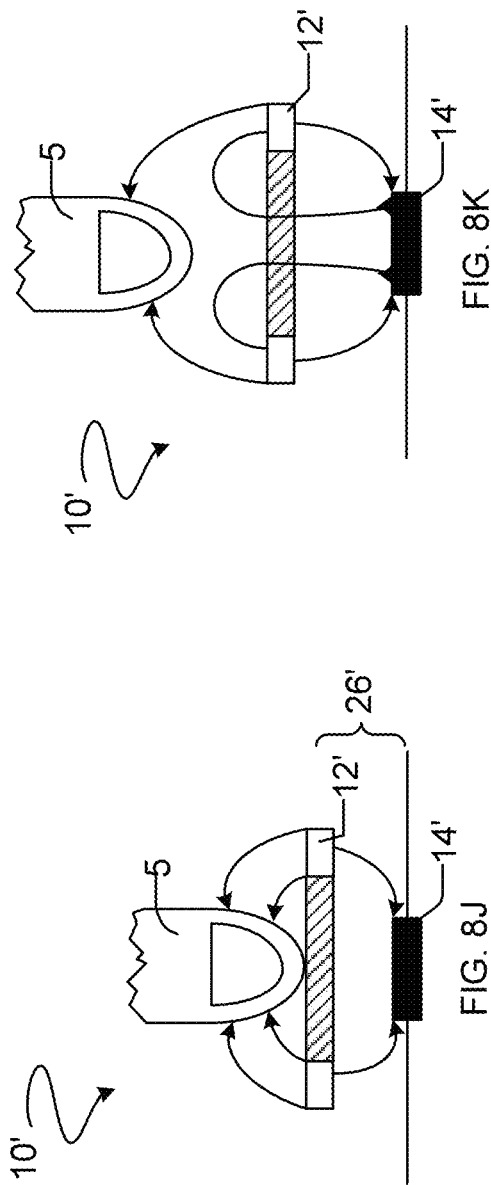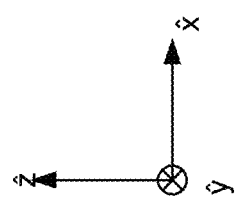

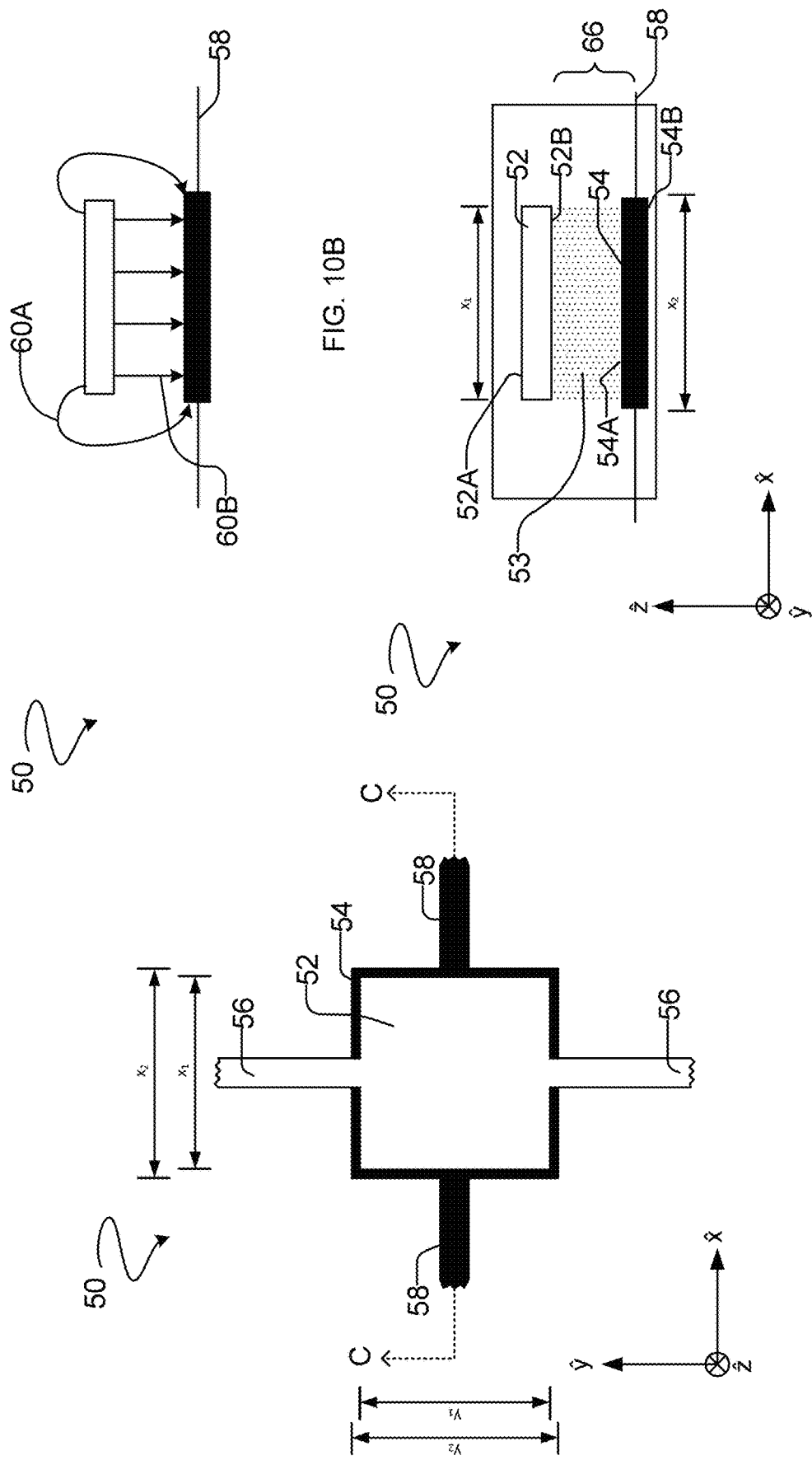

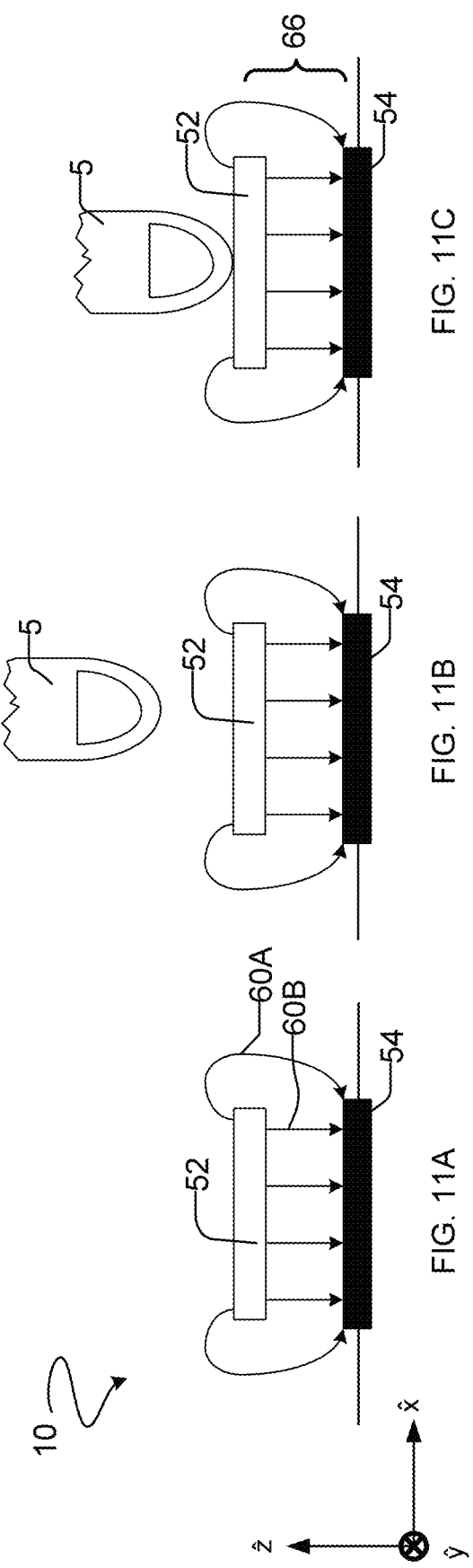

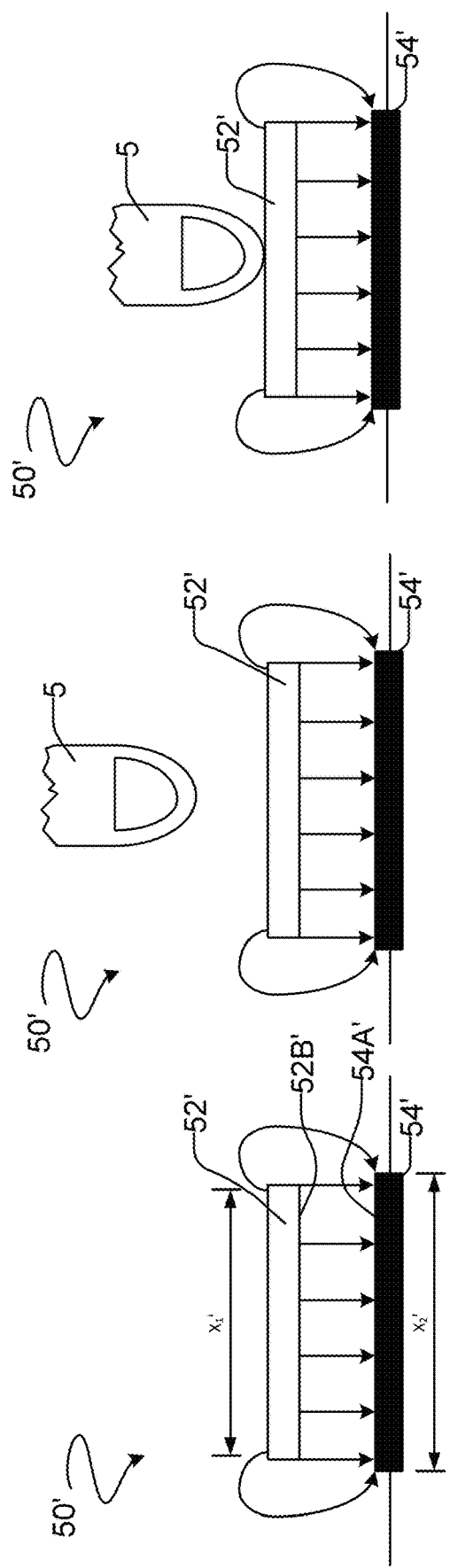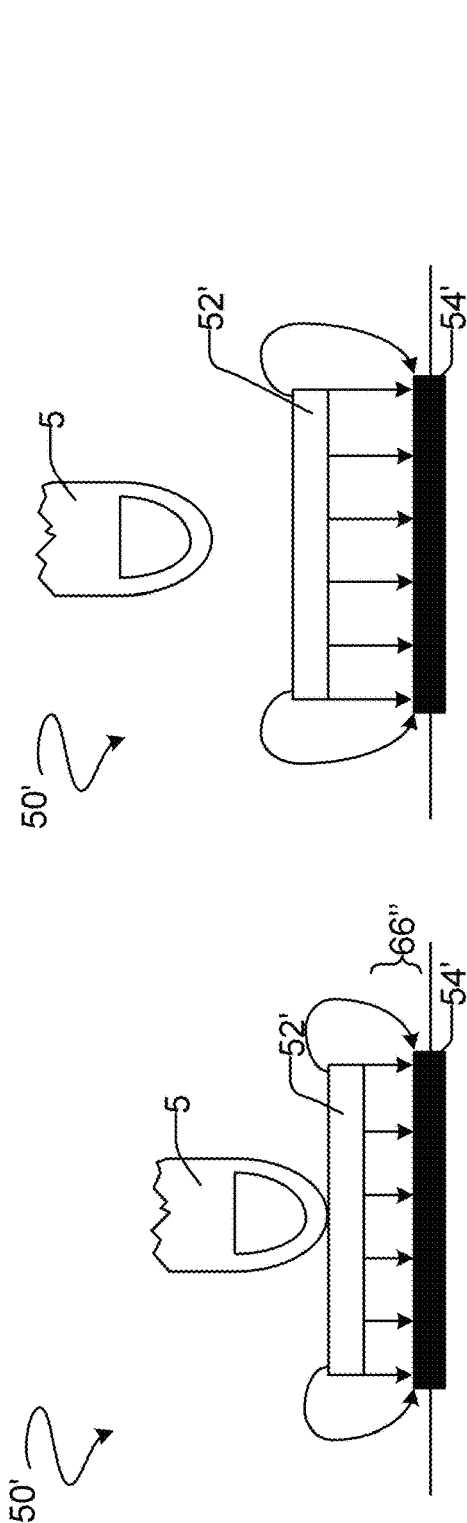

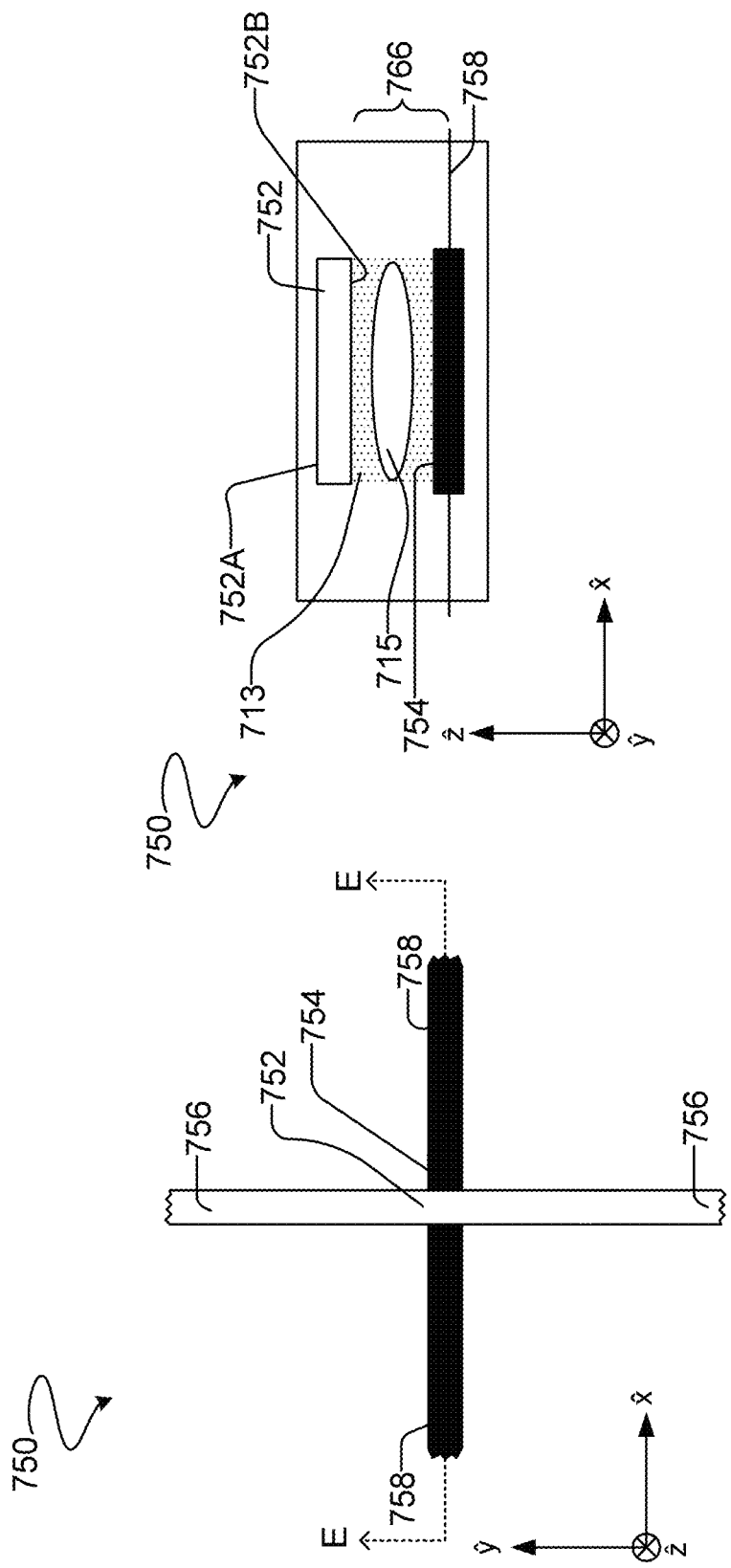

CLUSTER SENSOR

RELATED APPLICATIONS

This application claims the benefit of the priority of U.S. application No. 62/457,105 filed 9 Feb. 2017 which is hereby incorporated herein by reference.

TECHNICAL FIELD

The invention relates to proximity and/or pressure sensor units for a variety of applications. Particular embodiments comprise stretchable or otherwise deformable proximity and pressure sensor units capable of distinguishing between proximity, stretching and touching.

BACKGROUND

As electronic devices become smaller, lighter and include more functionality, there is a drive to integrate such electronics into clothes and apply them to skin to unobtrusively monitor health and track movements. Such applications benefit from stretchable and transparent touch sensors that enable the underlying surface to remain visible during use. A wide variety of other applications may benefit from touch and/or proximity sensors which may be transparent and which may be stretchable and/or otherwise deformable.

Various tactile sensors based on metal mesh, carbon nanotubes and silver nanowires demonstrate operation in bent configurations. However, such previous devices only show the ability to either detect touch, stretch, or touch and stretch without the ability to distinguish between the two.

Touch sensitivity has been achieved in gel electrodes by detecting physical deformation of the electrodes. This requirement of physical deformation also means that such gel electrode sensors are sensitive to stretch and have not proved capable of detecting touch during stretching.

There is a general desire for sensors capable of detecting touch and/or proximity during stretching and/or other forms of deformation and capable of distinguishing between touch, proximity, and stretching and/or other forms of deformation.

The foregoing examples of the related art and limitations related thereto are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

One aspect of the invention provides a sensor unit for detecting, and discerning between, proximity of a pointing element to the sensor unit and contact force applied by the pointing element to the sensor unit. The sensor unit comprises a capacitive fringe sensor having a fringe capacitance ($C_{fringe}$). The capacitive fringe sensor comprises first and second fringe electrodes spaced apart from one another. The first fringe electrode comprises a first distal fringe surface facing in a Z direction generally away from the second fringe electrode and a first proximate fringe surface facing in a negative-Z direction generally toward the second fringe electrode. The sensor unit comprises a capacitive overlap sensor having an overlap capacitance ($C_{overlap}$). The capacitive overlap sensor comprises first and second overlap electrodes spaced apart from one another. The first overlap electrode comprises a first distal overlap surface facing in the Z direction generally away from the second overlap electrode and a first proximate overlap surface facing generally in the negative-Z direction toward the second overlap electrode. The sensor unit comprises a circuit connected to apply a fringe voltage between the first and second fringe electrodes to thereby cause a fringe electric field ($E_{fringe}$) in a vicinity of the fringe sensor. The circuit is connected to apply an overlap voltage between the first and second overlap electrodes to thereby cause an overlap electric field ($E_{overlap}$) in a vicinity of the overlap sensor. The first and second fringe electrodes are at least one of shaped and located to shape the fringe electric field ($E_{fringe}$) to have a distal fringe flux ($\Phi_{distal,fringe}$) of the fringe electric field into or out of the first distal fringe surface in the positive-Z direction or negative-Z direction and a proximate fringe flux ($\Phi_{prox,fringe}$) of the fringe electric field into or out of the first proximate fringe surface in the positive-Z direction or negative-Z direction. The first and second overlap electrodes are at least one of shaped and located to shape the overlap electric field ($E_{overlap}$) to have a distal overlap flux ($\Phi_{distal,overlap}$) of the overlap electric field into or out of the first distal overlap surface in the positive-Z direction or negative-Z direction and a proximate overlap flux ($\Phi_{prox,overlap}$) of the overlap electric field into or out of the first proximate overlap surface in the positive-Z direction or negative-Z direction. A fringe-sensor flux ratio $$FSFR = \frac{\Phi_{distal,fringe}}{\Phi_{prox,fringe}}$$

of the sensor unit is greater than an overlap-sensor flux ratio $$OSFR = \frac{\Phi_{distal,ovelap}}{\Phi_{prox,overlap}}$$

of the sensor unit to thereby make the fringe capacitance ($C_{fringe}$) relatively more sensitive to proximity of the pointing element than the overlap capacitance ($C_{overlap}$) and the overlap capacitance ($C_{overlap}$) relatively more sensitive to contact force applied to the sensor unit by the pointing element than the fringe capacitance ($C_{fringe}$).

In some embodiments, the sensor unit comprises a capacitance-measurement circuit connected to generate a fringe-sensor signal representative of the fringe capacitance ($C_{fringe}$) and an overlap-sensor signal representative of the overlap capacitance ($C_{overlap}$).

In addition to the exemplary aspects and embodiments described above, further aspects and embodiments will become apparent by reference to the drawings and by study of the following detailed descriptions. In some embodiments, the sensor unit comprises a processor connected to receive the fringe-sensor signal and the overlap-sensor signal and configured to determine estimated values for the fringe capacitance ($C_{fringe}$) and the overlap capacitance ($C_{overlap}$).

In some embodiments, the circuit is connected to apply the fringe voltage and the overlap voltage at nominal voltage levels and wherein the processor is configured to determine the estimated values for the fringe capacitance ($C_{fringe}$) and the overlap capacitance ($C_{overlap}$) to be a nominal fringe capacitance level ($C_{f,nom}$) and a nominal overlap capacitance level ($C_{o,nom}$) respectively when the pointing element is not proximate to the sensor unit and is not applying contact force to the sensor unit.

In some embodiments, the processor is configured to at least one of generate and output one or more signals indicating that the pointing element is not proximate to the sensor unit and is not applying contact force to the sensor unit when the estimated value of the fringe capacitance ($C_{fringe}$) is within a threshold range around the nominal fringe capacitance level ($C_{f,nom}$) and the estimated value of the overlap capacitance ($C_{overlap}$) is within a threshold range around the nominal overlap capacitance level ($C_{o,nom}$).

In some embodiments, the processor is configured to at least one of generate and output one or more signals indicating that the pointing element is proximate to the sensor unit but is not applying contact force to the sensor unit when the estimated value of the fringe capacitance ($C_{fringe}$) is below the nominal fringe capacitance level ($C_{f,nom}$) by more than a proximity threshold amount and the estimated value of the overlap capacitance ($C_{overlap}$) is within a threshold range around the nominal overlap capacitance level ($C_{o,nom}$).

In some embodiments, the processor is configured to at least one of generate and output one or more signals indicating that the pointing element is in contact with the sensor unit when the estimated value of the fringe capacitance ($C_{fringe}$) is below the nominal fringe capacitance level ($C_{f,nom}$) by more than a contact threshold amount.

In some embodiments, the processor is configured to at least one of generate and output one or more signals indicating that the pointing element is applying contact force to the sensor unit when the estimated value of the overlap capacitance ($C_{overlap}$) is above the nominal overlap capacitance level ($C_{o,nom}$) by more than a contact threshold amount.

In some embodiments, the processor is configured to at least one of generate and output one or more signals indicating that the pointing element is proximate to the sensor unit and moving toward the sensor unit when the estimated value of the fringe capacitance ($C_{fringe}$) is below the nominal fringe capacitance level ($C_{f,nom}$) by more than a proximity threshold amount for a period of time and the estimated value of the fringe capacitance ($C_{fringe}$) is decreasing over the period of time and the estimated value of the overlap capacitance ($C_{overlap}$) is within a threshold range around the nominal overlap capacitance level ($C_{o,nom}$).

In some embodiments, the processor is configured to at least one of generate and output one or more signals indicating that the pointing element is proximate to the sensor unit and moving away from the sensor unit when the estimated value of the fringe capacitance ($C_{fringe}$) is below the nominal fringe capacitance level ($C_{f,nom}$) by more than a proximity threshold amount for a period of time and the estimated value of the fringe capacitance ($C_{fringe}$) is increasing over the period of time and the estimated value of the overlap capacitance ($C_{overlap}$) is within a threshold range around the nominal overlap capacitance level ($C_{o,nom}$).

In some embodiments, the first and second fringe electrodes and the first and second overlap electrodes are substantially transparent at visible light wavelengths. In some embodiments, the first and second fringe electrodes and the first and second overlap electrodes have transmissivities of over 90% at visible light wavelengths.

In some embodiments, the first fringe electrode and the first overlap electrode are fabricated from ionically conductive hydrogel. In some embodiments, the first fringe electrode and the first overlap electrode are fabricated from at least one of: a metal mesh; silver nanowires, carbon nanotubes and one or more conducting polymers. In some embodiments, at least one of the first and second overlap electrodes is elastically deformable. In some embodiments, at least one of the first and second fringe electrodes is elastically deformable.

In some embodiments, the second fringe electrode and the second overlap electrode comprise a single electrode. In some embodiments, the first overlap electrode is interposed within a space defined by first fringe electrode in a first electrode plane orthogonal to the Z direction.

In some embodiments, the first fringe electrode comprises a cut-out extending in a first fringe electrode plane orthogonal to the Z direction. In some embodiments, the cut-out is substantially circular in the first fringe electrode plane and wherein the cut-out has a diameter $d_{inner}$. In some embodiments, the second fringe electrode is substantially circular in a second fringe electrode plane orthogonal to the Z direction and wherein the second fringe electrode has a diameter $d_{outer}$. In some embodiments, $d_{inner}$ is greater than $d_{outer}$.

In some embodiments, the first fringe electrode is substantially S-shaped in a first fringe plane orthogonal to the Z direction. In some embodiments, the first overlap electrode is substantially rectangular in a first overlap plane orthogonal to the Z direction and the second overlap electrode is substantially rectangular in a second overlap plane orthogonal to the Z direction. In some embodiments, the first overlap electrode overlaps the second overlap electrode in the Z direction.

Another aspect of the invention provides a method for detecting, and discerning between, proximity of a pointing element to a sensor unit and contact force applied to the sensor unit by the pointing element. The method comprises providing a sensor unit. The sensor unit comprises a capacitive fringe sensor having a fringe capacitance ($C_{fringe}$) and comprising first and second deformable fringe electrodes spaced apart from one another. The first fringe electrode comprises a first distal fringe surface facing in a Z direction generally away from the second fringe electrode and a first proximate fringe surface facing in a negative-Z direction generally toward the second fringe electrode. The sensor unit comprises a capacitive overlap sensor having an overlap capacitance ($C_{overlap}$) and comprising first and second deformable overlap electrodes spaced apart from one another. The first overlap electrode comprises a first distal overlap surface facing in the Z direction generally away from the second overlap electrode and a first proximate overlap surface facing generally in the negative-Z direction toward the second overlap electrode. The method comprises applying a fringe voltage between the first and second fringe electrodes and thereby creating a fringe electric field ($E_{fringe}$) in a vicinity of the fringe sensor. The method comprises applying an overlap voltage between the first and second overlap electrodes and thereby creating an overlap electric field ($E_{overlap}$) in a vicinity of the overlap sensor. The fringe electric field ($E_{fringe}$) has a distal fringe flux ($\Phi_{distal,fringe}$) of the fringe electric field into or out of the first distal fringe surface in the Z direction and a proximate fringe flux ($\Phi_{prox,fringe}$) of the fringe electric field into or out of the first proximate fringe surface in the negative-Z direction. The overlap electric field ($E_{overlap}$) has a distal overlap flux ($\Phi_{distal,overlap}$) of the overlap electric field into or out of the first distal overlap surface in the positive Z direction or negative direction and a proximate overlap flux ($\Phi_{prox,overlap}$) of the overlap electric field into or out of the first proximate overlap surface in the negative-Z direction or positive Z direction. A fringe-sensor flux ratio $$FSFR = \frac{\Phi_{distal,fringe}}{\Phi_{prox,fringe}}$$

of me sensor unit is greater than an overlap-sensor flux ratio $$OSFR = \frac{\Phi_{distal,ovelap}}{\Phi_{prox,overlap}}$$

of the sensor unit to thereby make the fringe capacitance ($C_{fringe}$) relatively more sensitive to proximity of the pointing element than the overlap capacitance ($C_{overlap}$) and the overlap capacitance ($C_{overlap}$) relatively more sensitive to contact force applied to the sensor unit by the pointing element than the fringe capacitance ($C_{fringe}$). The method comprises estimating values of the fringe capacitance ($C_{fringe}$) and the overlap capacitance ($C_{overlap}$). The method comprises detecting, and discerning between, proximity of the pointing element to the sensor unit and contact force applied to the sensor unit by the pointing element based on the estimated values of the fringe capacitance ($C_{fringe}$) and the overlap capacitance ($C_{overlap}$).

In some embodiments, the method comprises connecting a circuit to apply the fringe voltage and the overlap voltage at nominal voltage levels and determining the estimated values for the fringe capacitance ($C_{fringe}$) and the overlap capacitance ($C_{overlap}$) to be a nominal fringe capacitance level ($C_{f,nom}$) and a nominal overlap capacitance level ($C_{o,nom}$) respectively when the pointing element is not proximate to the sensor unit and is not applying contact force to the sensor unit.

In some embodiments, the method comprises at least one of generating and outputting one or more signals indicating that the pointing element is not proximate to the sensor unit and is not applying contact force to the sensor unit when the estimated value of the fringe capacitance ($C_{fringe}$) is within a threshold range around the nominal fringe capacitance level ($C_{f,nom}$) and the estimated value of the overlap capacitance ($C_{overlap}$) is within a threshold range around the nominal overlap capacitance level ($C_{o,nom}$). In some embodiments, the method comprises at least one of generating and outputting one or more signals indicating that the pointing element is proximate to the sensor unit but is not applying contact force to the sensor unit when the estimated value of the fringe capacitance ($C_{fringe}$) is below the nominal fringe capacitance level ($C_{f,nom}$) by more than a proximity threshold amount and the estimated value of the overlap capacitance ($C_{overlap}$) is within a threshold range around the nominal overlap capacitance level ($C_{o,nom}$). In some embodiments, the method comprises at least one of generating and outputting one or more signals indicating that the pointing element is in contact with the sensor unit when the estimated value of the fringe capacitance ($C_{fringe}$) is below the nominal fringe capacitance level ($C_{f,nom}$) by more than a contact threshold amount and the estimated value of the overlap capacitance ($C_{overlap}$) is within a threshold range around the nominal overlap capacitance level ($C_{o,nom}$). In some embodiments, the method comprises at least one of generating and outputting one or more signals indicating that the pointing element is applying contact force to the sensor unit when the estimated value of the overlap capacitance ($C_{overlap}$) is above the nominal overlap capacitance level ($C_{o,nom}$) by more than a contact threshold amount. In some embodiments, the method comprises at least one of generating and outputting one or more signals indicating that the pointing element is proximate to the sensor unit and moving toward the sensor unit when the estimated value of the fringe capacitance ($C_{fringe}$) is below the nominal fringe capacitance level ($C_{f,nom}$) by more than a proximity threshold amount for a period of time and the estimated value of the fringe capacitance ($C_{fringe}$) is decreasing over the period of time. In some embodiments, the method comprises at least one of generating and outputting one or more signals indicating that the pointing element is proximate to the sensor unit and moving away from the sensor unit when the estimated value of the fringe capacitance ($C_{fringe}$) is below the nominal fringe capacitance level ($C_{f,nom}$) by more than a proximity threshold amount for a period of time and the estimated value of the fringe capacitance ($C_{fringe}$) is increasing over the period of time.

In some embodiments, the method comprises estimating values of the fringe capacitance ($C_{fringe}$) comprises grounding the overlap sensor. In some embodiments, the method comprises estimating values of the overlap capacitance ($C_{erlap}$) comprises grounding the fringe sensor. In some embodiments, the method comprises estimating values of the fringe capacitance ($C_{fringe}$) comprises floating the overlap sensor. In some embodiments, the method comprises estimating values of the overlap capacitance ($C_{overlap}$) comprises floating the fringe sensor.

Another aspect of the invention provides a sensor unit for detecting, and discerning between, proximity of a pointing element to the sensor unit and contact force applied by the pointing element to the sensor unit. The sensor unit comprises a capacitive sensor having a capacitance (C) and comprising first and second electrodes spaced apart from one another and a dielectric located between the first and second electrodes. The dielectric comprises one or more gas bubbles in a deformable dielectric material wherein the gas bubble has a higher compressibility than a compressibility of the deformable dielectric material. The sensor unit comprises a capacitance-measurement circuit connected to apply a voltage between the first and second electrodes to thereby generate a capacitance signal representative of the capacitance (C).

In some embodiments, the application of contact force to the sensor unit causes deformation of the first electrode toward the second electrode and a corresponding increase in the capacitance (C) and the capacitance signal due to decreasing space between the first and second electrodes.

In some embodiments, the application of contact force to the sensor unit changes a relative permittivity of the dielectric.

In some embodiments, the application of contact force to the sensor unit causes deformation of the dielectric which in turn causes the deformable dielectric material to occupy a relatively higher percentage of a volume of the space between the first and second electrodes as compared to when there is no contact force applied to the sensor unit.

Another aspect of the invention provides a sensor array. The sensor array comprises a plurality of Y direction oriented sensor columns, each sensor column comprising a plurality of sensors generally aligned with one another in the Y direction and each sensor column oriented such that the plurality of sensors form a plurality of X direction oriented sensor rows, each sensor row comprising a subset of the plurality of sensors generally aligned with one another in an X direction. Each of the plurality of sensors comprises any of the sensor units described herein.

In some embodiments, a processor is connected to each of the plurality of sensors and is configured to estimate the capacitance of each of the plurality of sensors. In some embodiments, the processor is configured to at least one of generate and output one or more signals indicating that the sensor array is being stretched in the X direction when at least two neighbouring sensors of the plurality of sensors exhibit a substantially equal increase in estimated capacitance.

In addition to the exemplary aspects and embodiments described above, further aspects and embodiments will become apparent by reference to the drawings and by study of the following detailed descriptions.

BRIEF DESCRIPTION OF THE DRAWINGS

Exemplary embodiments are illustrated in referenced figures of the drawings. It is intended that the embodiments and figures disclosed herein are to be considered illustrative rather than restrictive.

FIG. 5 depicts a schematic plan view of a sensor according to one embodiment of the invention.

FIGS. 6A and 6B depicts schematic cross-sections of the FIG. 5 sensor along the line B-B of FIG. 5.

FIGS. 8A to 8E and 8G to 8K depict a sensor interacting with a pointing element according to one embodiment of the invention.

FIG. 9 depicts a schematic plan view of a sensor according to one embodiment of the invention.

FIGS. 10A and 10B depict schematic cross sections of the FIG. 9 sensor along the line C-C of FIG. 9.

FIGS. 11A to 11E and 11G to 11K depict a sensor interacting with a pointing element according to one embodiment of the invention.

FIG. 13A depicts a schematic plan view of a sensor according to one embodiment of the invention.

FIG. 13B depicts a schematic cross-section of the FIG. 134A sensor along the line E-E of FIG. 13A.

DESCRIPTION

Throughout the following description specific details are set forth in order to provide a more thorough understanding to persons skilled in the art. However, well known elements may not have been shown or described in detail to avoid unnecessarily obscuring the disclosure. Accordingly, the description and drawings are to be regarded in an illustrative, rather than a restrictive, sense.

One aspect of the invention provides a sensor for detecting and distinguishing between increasing and decreasing proximity of a pointing element, touch by a pointing element, pressure applied by a pointing element, stretching (and/or other deformation) of the sensor, and any of the above while stretching and/or otherwise deforming the sensor. This sensor may comprise a cluster sensor unit having a first sensor and a second sensor wherein the first sensor has a higher ratio of distal flux to proximate flux as compared to the second sensor. With this flux characteristic, the first sensor is relatively more sensitive (as compared to the second sensor) to proximity of a pointing element, while the second sensor is relatively more sensitive (as compared to the first sensor) to force and/or pressure applied by the pointing element.

Figure 1:
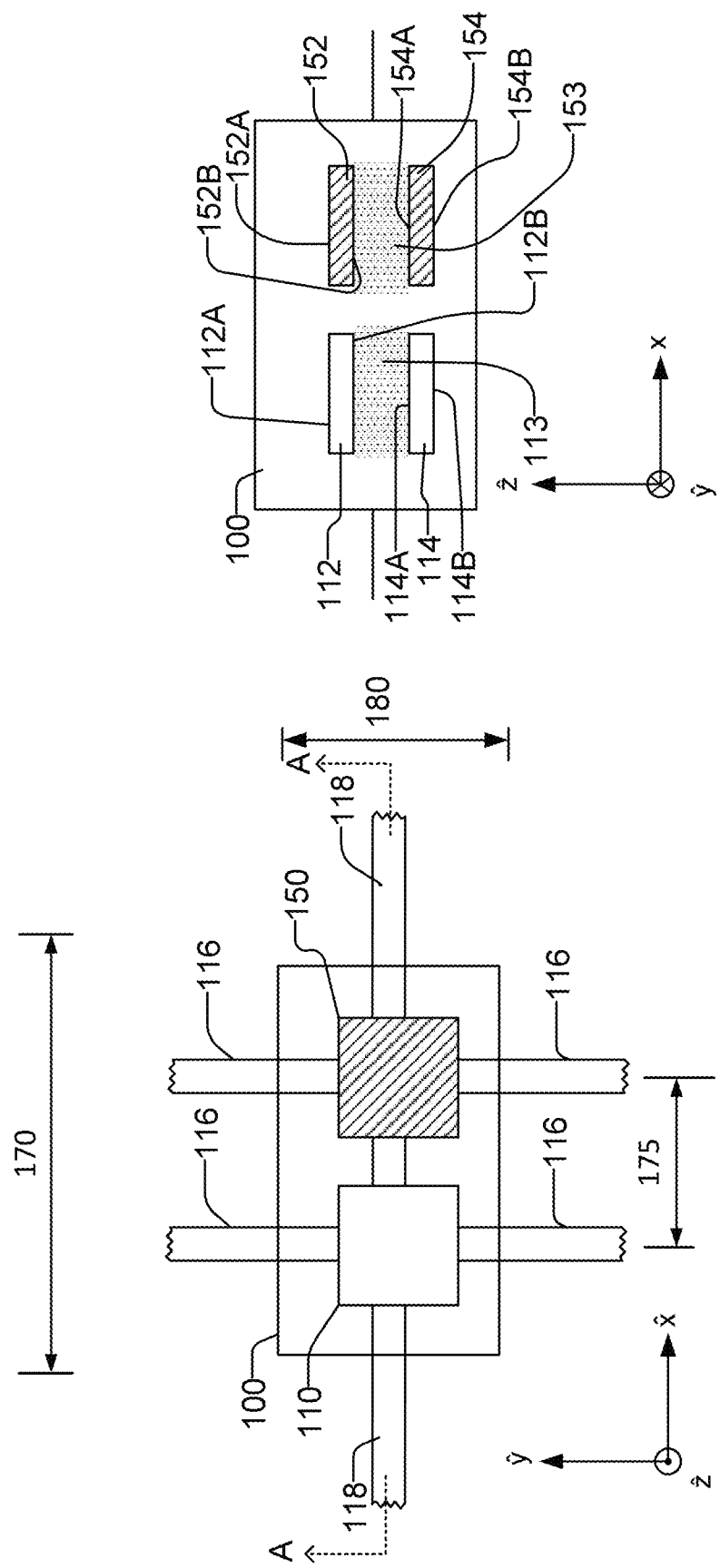
FIG. 1A depicts a schematic plan view of a sensor according to one embodiment of the invention.
FIG. 1B depicts a schematic cross-section of the FIG. 1A sensor along line A-A of FIG. 1A.

FIGS. 1A and 1B depict a cluster sensor unit 100 according to a particular embodiment. Cluster sensor unit 100 comprises fringe sensor 110 having a fringe capacitance, $C_{fringe}$, and an overlap sensor 150 having an overlap capacitance, $C_{overlap}$. Fringe sensor 110 comprises first and second fringe electrodes 112, 114 spaced apart from one another in the Z direction. First fringe electrode 112 comprises a first distal fringe surface 112A facing in a positive-Z direction generally away from second fringe electrode 114 and a first proximate fringe surface 112B facing in a negative-Z direction generally toward second fringe electrode 114. Second fringe electrode 114 comprises a second proximate fringe surface 114A facing in a positive-Z direction generally toward first fringe electrode 112 and a second distal fringe surface 114B facing in a negative-Z direction generally away from first fringe electrode 112.

Overlap sensor 150 comprises first and second overlap electrodes 152, 154 spaced apart from one another in the Z direction. First overlap electrode 152 comprises a first distal overlap surface 152A facing in the positive-Z direction generally away from second overlap electrode 154 and a first proximate overlap surface 152B facing generally in the negative-Z direction toward second overlap electrode 154. Second overlap electrode 154 comprises a second proximate overlap surface 154A facing in a positive-Z direction generally toward first overlap electrode 152 and a second distal overlap surface 154B facing in a negative-Z direction generally away from first overlap electrode 152.

Clusters sensor unit 100 has an X direction dimension 170 and a Y direction dimension 180. In some embodiments, cluster sensor unit 100 is smaller than the tip of a pointing element (e.g. a finger). In particular embodiments, X direction dimension 170 may be in the range of 3 to 6 mm while Y direction dimension 180 may be in the range of 1 to 3 mm. In an exemplary embodiment, X direction dimension 170 is 5 mm and Y direction dimension is 2 mm. Notably, as the size of fringe sensor 110 increases, the Z direction range of sensitivity to proximity of a pointing element may increase. However, as the size of cluster sensor unit 100 as a whole increases, cluster sensor unit 100 may be less effective for accurate small scale sensing. Accordingly, the relative size of fringe sensor 110, overlap sensor 150 and cluster sensor unit 100 may be adjusted to achieve a desired sensitivity resolution and sensing range for specific applications.

First and second fringe electrodes 112, 114 may be of any suitable dimensions in the Z direction. For example, in some embodiments, first and second fringe electrodes 112, 114 are between 200 µm and 600 µm in the Z direction. Similarly, first and second overlap electrodes 152, 154 may be of any suitable dimensions in the Z direction. For example, in some embodiments, first and second fringe electrodes 152, 154 are between 200 µm and 600 µm in the Z direction.

Fringe sensor 110 and overlap sensor 150 are spaced apart by an X direction center-to-center spacing 175. X direction spacing 175 may be any suitable spacing. In some embodiments, X direction spacing 175 is chosen based on the size of the pointing element used in a particular application. In particular applications, such as where a fingertip is used as a pointing element, X direction spacing may be between 0.5 and 2 mm (e.g. 1 mm), for example.

First fringe electrode 112 may be spaced apart from second fringe electrode 114 in the Z direction by a dielectric 113. Dielectric 113 may contact both of proximate fringe surface 112B and proximate fringe surface 114A and may occupy the volume therebetween. Dielectric 113 may comprise any suitable dielectric material. For example, dielectric material may comprise a silicone material (examples include PDMS, Ecoflex™' Dragon Skin™, etc.), any suitable form of rubbery material with optical properties considered to be desirable for a particular application (e.g. in case of a touch screen, it may be desirable for dielectric 113 to be transparent) and mechanical properties considered to be desirable for a particular application (e.g. low elastic modulus or stretchable materials may be desirable for wearable applications). In some embodiments, dielectric 113 surrounds first and second fringe electrodes 112, 114, as will be discussed further herein.

Similarly, first overlap electrode 152 may be spaced apart from second overlap electrode 154 by a dielectric 153. Dielectric 153 may contact both of proximate overlap surface 1526 and proximate overlap surface 154A and may occupy the volume therebetween. In some embodiments, dielectric 153 surrounds first and second overlap electrodes 152, 154, as will be discussed further herein. Dielectric 153 may comprise the same material as dielectric 113 and, for a given cluster sensor unit 100, dielectric 153 and dielectric 113 may be fabricated from a contiguous layer or layers of dielectric material. This is not necessary, dielectric material 153 could be distinct from dielectric material 113.

In some embodiments, first and second fringe electrodes 112, 114 and first and second overlap electrodes 152, 154 are made of a deformable and transparent material, such as an ionically conductive gel. One particular non-limiting example of a deformable and transparent ionically conductive gel from which electrodes 112, 114, 152, 154 could be fabricated is polyacrylamide. Accordingly, cluster sensor 100 may be deformable (e.g. stretchable, bendable and/or the like) and/or may be optically transparent. In other embodiments, first and second fringe electrodes 112, 114 and first and second overlap electrodes 152, 154 may be fabricated from metal mesh, silver nanowires, carbon nanotubes, conducting polymers (e.g. PEDOT:PSS), other ionically conducting hydrogels and/or the like.

A circuit (e.g. represented by conductive traces 116 and 118 respectively connected to first fringe and overlap electrodes 112, 152 and second fringe and overlap electrodes 114, 154 in FIG. 1A) may be connected to apply a fringe voltage between first and second fringe electrodes 112, 114 to thereby cause a fringe electric field, $\vec{E}_{fringe}$, in a vicinity of fringe sensor 110 and connected to apply an overlap voltage between first and second overlap electrodes 152, 154 to thereby cause an overlap electric field, $\vec{E}_{overlap}$, in a vicinity of overlap sensor 150.

In some embodiment, traces 116 of first fringe electrode 112 are made of the same conductive (e.g. electrically conductive or ionically conductive) material as first fringe electrode 112 and first fringe electrode 112 and its respective traces 116 may be molded as one single contiguous unit as discussed further herein. In other embodiments, traces 116 are made of a different conductive (e.g. electrically conductive or ionically conductive) material than first fringe electrode 112. Traces 116 of first overlap electrode, traces 118 of second fringe electrode and traces 118 of second overlap electrode may be made of the same material and/or in the same ways as discussed in relation to traces 116 of first fringe electrode 112 or may be made of different materials and/or be or in different ways as discussed in relation to traces 116 of first fringe electrode. Although traces 116, 118 are depicted in FIG. 1A as having smaller X-dimension widths and smaller Y-dimension widths than first fringe and overlap electrodes 112, 152 and second fringe and overlap electrodes 114, 154 respectively, this is not necessary. For example, traces 116, 118 could have the same X-dimension widths and Y-dimension widths as first fringe and overlap electrodes 112, 152 and second fringe and overlap electrodes 114, 154 respectively (similar to first and second electrodes 752, 754 and traces 756, 758 of sensor 750 depicted in FIG. 13A), or traces 116, 118 could have the greater X-dimension widths and Y-dimension widths than first fringe and overlap electrodes 112, 152 and second fringe and overlap electrodes 114, 154 respectively.

First and second fringe electrodes 112, 114 may be shaped (including sized) and/or located (relative to one another) to cause fringe electric field, $E_{fringe}$, to have a distal fringe flux, $\Phi_{distal,fringe}$ and a proximate fringe flux, $\Phi_{prox,fringe}$, where the distal fringe flux, (Ddistal,fringe and the proximate fringe flux, $\Phi_{prox,fringe}$ are terms used in this application for brevity and convenience of explanation to describe characteristics of the electric field $\vec{E}_{fringe}$ of fringe sensor 110 and are defined in more detail below.

The electric field $\vec{E}_{fringe}$ associated with any fringe voltage applied between first and second fringe electrodes 112, 114 comprises a flux characteristic referred to herein as the distal fringe flux, $\Phi_{distal,fringe}$ which comprises the flux of the fringe electric field $\vec{E}_{fringe}$ into (or out of depending on polarity) first distal fringe surface 112A and/or into (or out of) a notional plane spaced infinitesimally apart from first distal fringe surface 112A in a direction away from second fringe electrode 114 (e.g. spaced infinitesimally apart from first distal fringe surface 112A in a positive Z direction). The electric field $\vec{E}_{fringe}$ associated with any fringe voltage applied between first and second fringe electrodes 112, 114 also comprises a flux characteristic referred to herein as the proximate fringe flux, $\Phi_{prox,fringe}$ which comprises the flux of the fringe electric field $\vec{E}_{fringe}$ into (or out of depending on polarity) first proximate fringe surface 112B and/or a notional plane spaced infinitesimally apart from first proximate fringe surface 112B in a direction toward second fringe electrode 114 (e.g. spaced infinitesimally apart from first proximate fringe surface 112B in a negative Z direction).

Similarly, first and second overlap electrodes 152, 154 may be shaped (including sized) and/or located (relative to one another) to cause overlap electric field, $\vec{E}_{overlap}$, to have a distal overlap flux, $\Phi_{distal,overlap}$ and a proximate overlap flux, $\Phi_{prox,overlap}$, where the distal overlap flux, $\Phi_{distal,overlap}$ and the proximate overlap flux, $\Phi_{prox,overlap}$ are terms used in this application for brevity and convenience of explanation to describe characteristics of the electric field of overlap sensor 150 and are defined in more detail below.

The electric field $\vec{E}_{overlap}$ associated with any overlap voltage applied between first and second overlap electrodes 152, 154 comprises a flux characteristic referred to herein as the distal overlap flux, $\Phi_{distal,overlap}$ which comprises the flux of the overlap electric field $\vec{E}_{overlap}$ into (or out of depending on polarity) first distal overlap surface 152A and/or into (or out of) a notional plane spaced infinitesimally apart from first distal overlap surface 152A in a direction away from second overlap electrode 154 (e.g. spaced infinitesimally apart from first distal overlap surface 152A in a positive Z direction). The electric field $\vec{E}_{overlap}$ associated with any overlap voltage applied between first and second overlap electrodes 152, 154 also comprises a flux characteristic referred to herein as the proximate overlap flux, $\Phi_{prox,overlap}$ which comprises the flux of the overlap electric field $\vec{E}_{overlap}$ into (or out of depending on polarity) first proximate overlap surface 152B and/or a notional plane spaced infinitesimally apart from first proximate overlap surface 152B in a direction toward second overlap electrode 154 (e.g. spaced infinitesimally apart from first proximate overlap surface 152B in a negative Z direction).

To describe the shape of overlap sensor electric field, $\vec{E}_{fringe}$, the distal overlap flux, $\Phi_{distal,fringe}$, can be compared to the proximate overlap flux, $\Phi_{prox,fringe}$ to achieve a fringe sensor flux ratio ("FSFR"). The fringe sensor flux ratio may be defined by:

$$FSFR = \frac{\Phi_{distal,fringe}}{\Phi_{prox,fringe}}$$

The FSFR may be altered by changing the shapes (including the sizes) and/or the relative locations of first and second fringe electrodes 112, 114. For example, the FSFR can be increased by increasing the amount of perimeter edge on first fringe electrode 112 (e.g. by increasing the number of sides of the XY-plane cross-sectional shape of first fringe electrode 112 and/or by including one or more cut-outs in the XY-plane cross-sectional shape of first fringe electrode 112) to increase the $\Phi_{distal,fringe}$ Conversely, the FSFR can be decreased by decreasing the amount of perimeter edge on first fringe electrode 112 to decrease the $\Phi_{distal,fringe}$. The FSFR can also be decreased by increasing the Z direction thickness of first fringe electrode 112 which has the effect of increasing the $\Phi_{prox,fringe}$. The FSFR can also be increased by decreasing the Z direction thickness of first fringe electrode 112 which has the effect of decreasing the $\Phi_{prox,fringe}$.

The FSFR may be altered by changing the relative locations of first and second fringe electrodes 112, 114. For example, the FSFR can be increased by decreasing the overlap in the Z direction of first fringe electrode 112 with second fringe electrode 114. In this description and any accompanying claims and/or aspects, two objects or portions of objects may be said to be overlapping in a particular direction or to overlap one another in a particular direction, when a line oriented in the particular direction (at least locally) could be drawn to intersect the two objects or portions of objects. In this context, overlapping in the Z direction means that a straight line can extend in the Z direction and intersect both the overlapping portions of the first and second fringe electrodes 112, 114. By decreasing the overlap of first and second fringe electrodes 112,114, the $\Phi_{prox,fringe}$ is reduced.

Similarly, to describe the shape of overlap sensor electric field, $\vec{E}_{overlap}$, the distal overlap flux, $\Phi_{distal,overlap}$) can be compared to the proximate overlap flux, $\Phi_{prox,overlap}$ to achieve an overlap sensor flux ratio ("OSFR"). The overlap sensor flux ratio may be defined by:

$$OSFR = \frac{\Phi_{distal,overlap}}{\Phi_{prox,overlap}}$$

The OSFR may be altered by changing the shape (including size) and/or relative locations of the first and second overlap electrodes 152, 154 in a similar manner as described above in relation to fringe sensor 110 and its FSFR. For example, the OSFR can be decreased by increasing the amount of overlap between first overlap electrode 152 to increase the $\Phi_{distal,overlap}$ Conversely, the OSFR can be decreased by decreasing the amount of perimeter edge on first overlap electrode 152 to decrease the $\Phi_{distal,overlap}$. The OSFR can also be decreased by increasing the Z direction thickness of first overlap electrode 152 which has the effect of increasing the $\Phi_{prox,overlap}$.

In the FIGS. 1A and 1B embodiment, the FSFR of fringe sensor 110 is greater than the OSFR of overlap sensor 150. As will be explained in more detail below, this characteristic of the electric fields $\vec{E}_{fringe}$ and $\vec{E}_{overlap}$ of fringe sensor 110 and overlap sensor 150 results in the fringe capacitance, $C_{fringe}$, being relatively more sensitive to proximity of a pointing element near cluster sensor 100 than the overlap capacitance, $C_{overlap}$, and the overlap capacitance, $C_{overlap}$, being relatively more sensitive to contact force applied to cluster sensor 100 by a pointing element than is the fringe capacitance, $C_{fringe}$.

In some embodiments, cluster sensor 100 is connected to a capacitance-measurement circuit that generates a fringe-sensor signal representative of the fringe capacitance, $C_{fringe}$ and an overlap sensor signal representative of the overlap capacitance, $C_{overlap}$. The capacitance measurement circuit ("CMC") may optionally contain or be connected to an analog to digital converter. A processor may be connected to receive the fringe sensor signal and the overlap sensor signal to determine estimated values for $C_{fringe}$ and $C_{overlap}$.

Figure 2:
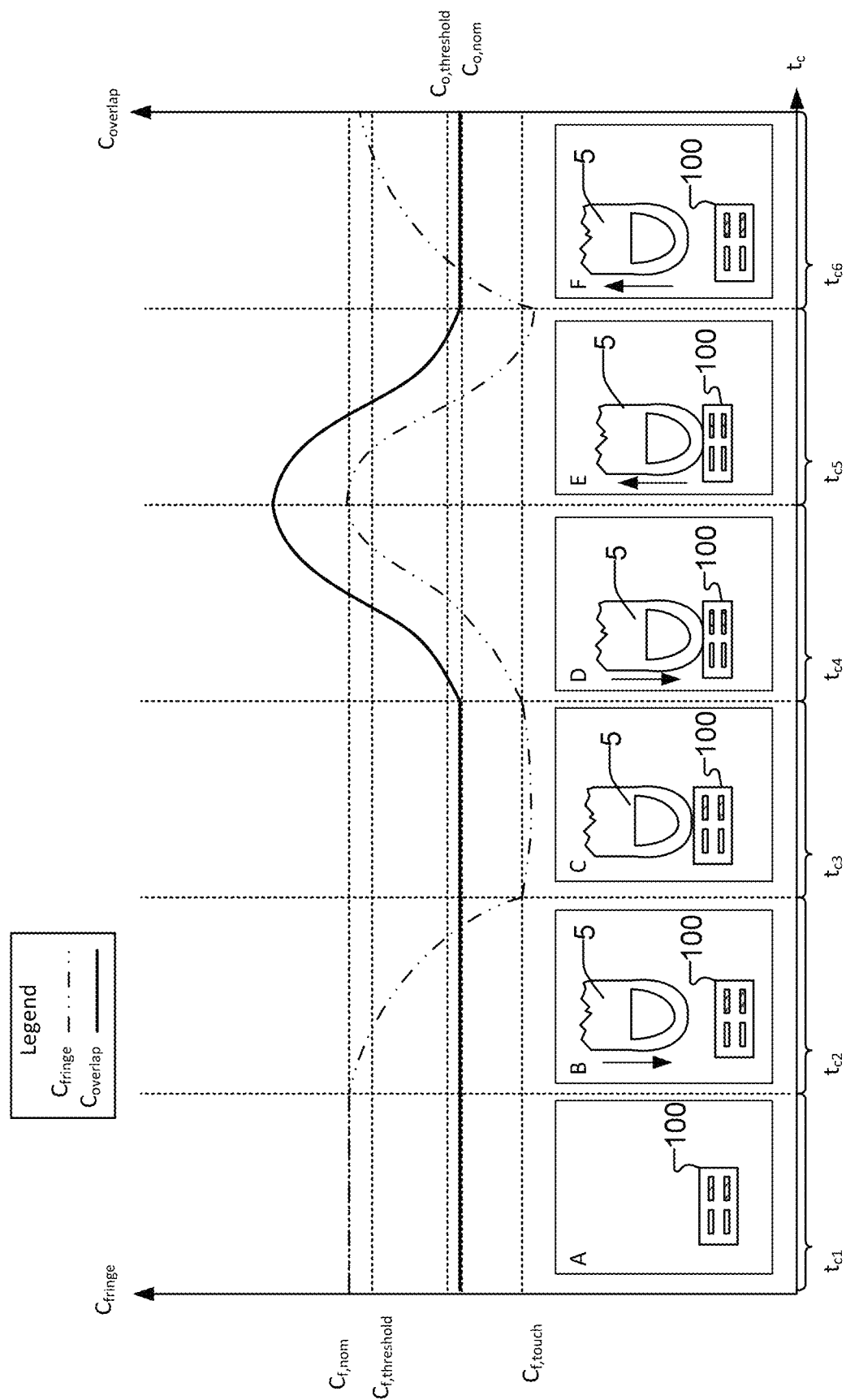
FIGS. 2 and 2A depict graphs of capacitance over time for a sensor in various Scenarios according to one embodiment of the invention.

FIG. 2 depicts a series of Scenarios, A through F, of a pointing element 5 (in the illustrated embodiment a finger) interacting with cluster sensor unit 100 and a graph showing both of $C_{fringe}$ (represented by the broken line) and $C_{overlap}$ (represented by the solid line) of cluster sensor unit 100 during each of Scenarios A through F.

Scenario A represents when pointing element 5 is not proximate to cluster sensor unit 100 and is not applying contact force to cluster sensor 100. Scenario A is represented as time period $t_{c1}$ on the FIG. 2 graph which plots estimated values of both of $C_{fringe}$ and $C_{overlap}$ as functions of time. As can be seen from the FIG. 2 graph, in Scenario A, the estimated value of $C_{fringe}$ is within a threshold range around the nominal fringe capacitance, $C_{f,nom}$ (i.e. does not fall below $C_{f,threshold}$) $C_{f,threshold}$ may be any suitable threshold. For example, in some embodiments, $C_{f,threshold}$ may be 3%, 2% or 1% lower than $C_{f,nom}$. Similarly, the estimated value of $C_{overlap}$ is within a threshold range around the nominal overlap capacitance $C_{o,nom}$ (i.e. does not exceed $C_{o,threshold}$). $C_{o,threshold}$ may be any suitable threshold. For example, in some embodiments, $C_{o,threshold}$ may be 3%, 2% or 1% lower than $C_{o,nom}$. Accordingly, a processor could be configured to generate and/or output one or more signals indicating that pointing element 5 is not proximate to cluster sensor 100 (e.g. Scenario A) based on $C_{fringe}$ and $C_{overlap}$ not varying below C f,threshold and above $C_{o,threshold}$ respectively.

Scenario B represents when pointing element 5 is approaching (e.g. is proximate to) cluster sensor unit 100, but is not applying contact force to cluster sensor 100. Scenario B is represented as time period $t_{c2}$ on the FIG. 2 graph. As can be seen from the FIG. 2 graph, the estimated value of $C_{fringe}$ decreases outside of a threshold range around the nominal fringe capacitance, $C_{f,nom}$ (i.e. $C_{fringe}$ decreases below $C_{f,threshold}$) as pointing element 5 approaches. Notably, as pointing element 5 approaches closer to cluster sensor 100, $C_{fringe}$ may tend to decrease at an increasing rate. In contrast, the estimated value of $C_{overlap}$ remains within a threshold range around the nominal overlap capacitance $C_{o,nom}$ (i.e. $C_{overlap}$ does not increase above $C_{o,threshold}$). This difference between the reactions of the capacitances, $C_{fringe}$ and $C_{overlap}$ to the Scenario B circumstance may be attributable to the fact that the FSFR is greater than the OSFR. More specifically, fringe sensor 110 has a greater proportion of distal flux ($\Phi_{distal,fringe}$) than the distal flux ($\Phi_{distal,overlap}$) of overlap sensor 150. As pointing element 5 approaches cluster sensor unit 100, some of this distal flux terminates (or starts depending on polarity) in pointing element 5, rather than the respective second electrodes 114, 154. Since fringe sensor 110 has a greater proportion of distal flux ($\Phi_{distal,fringe}$) than the distal flux ($\Phi_{distal,overlap}$) of overlap sensor 150, the fringe capacitance $C_{fringe}$ is relatively more sensitive to the proximity of pointing element 5 than the capacitance $C_{overlap}$ of overlap sensor 150 and the fringe capacitance $C_{fringe}$ of fringe sensor 110 decreases more dramatically as shown in Scenario B of FIG. 2. Accordingly, a processor could be configured to generate and/or output one or more signals indicating that pointing element 5 is approaching (e.g. is proximate to) cluster sensor 100 (e.g. Scenario B) based on $C_{fringe}$ decreasing below $C_{f,threshold}$ and $C_{overlap}$ remaining below $C_{o,threshold}$.

Scenario C represents when pointing element 5 is in contact with cluster sensor unit 100, but is not applying contact force to cluster sensor unit 100. Scenario C is represented as time period $t_{c3}$ on the FIG. 2 graph. As can be seen from the FIG. 2 graph, the estimated value of $C_{fringe}$ decreases by more than a touch or contact threshold amount $C_{f,touch}$ from the nominal fringe capacitance, $C_{f,nom}$ (i.e. $C_{fringe}$ decreases below $C_{f,touch}$). In contrast, the estimated value of $C_{overlap}$ remains within a threshold range around the nominal overlap capacitance $C_{o,nom}$ (i.e. $C_{overlap}$ does not increase above $C_{o,threshold}$). As with Scenario B described above, this relative difference between the reactions of the capacitances, $C_{fringe}$ and $C_{overlap}$ to the Scenario C circumstance may be attributable to the fact that the FSFR is greater than the OSFR. The difference between the reaction of the capacitance $C_{fringe}$ to Scenario B and Scenario C may be a difference of degree and may involve configurable thresholds $C_{f,threshold}$ and $C_{f,touch}$. Accordingly, a processor could be configured to generate and/or output one or more signals indicating that pointing element 5 is touching, but not applying force to cluster sensor 100 (e.g. Scenario C) based on $C_{fringe}$ decreasing below $C_{f,touch}$ and $C_{overlap}$ not varying above $C_{o,threshold}$. A processor could additionally or alternatively be configured to generate and/or output one or more signals indicating that pointing element 5 is touching but not applying force to cluster sensor 100 (e.g. Scenario C) based only on $C_{fringe}$ decreasing past $C_{f,touch}$). Unlike other deformable capacitive sensor implementations, in this approach no force is required to be applied to cluster sensor 100 to obtain the change in signal.

Scenario D represents when pointing element 5 is in contact with cluster sensor unit 100 and is applying increasing contact force to cluster sensor unit 100. Scenario D is represented as time period $t_{c4}$ on the FIG. 2 graph. As can be seen from the FIG. 2 graph, the estimated value of $C_{fringe}$ increases from $C_{f,touch}$. Also, the estimated value of $C_{overlap}$ increases above a threshold range around the nominal overlap capacitance $C_{o,nom}$ (i.e. $C_{overlap}$ increases above $C_{o,threshold}$). The fact that both capacitances $C_{fringe}$ and $C_{overlap}$ increase may be attributable to the fact that their respective electrodes 112, 114 and 152, 154 are deformed by the application of force to be closer to one another. In some embodiments, the relative increase in $C_{overlap}$ may be greater than the relative increase in $C_{fringe}$. This may be attributable to the fact that the OSFR is less than the FSFR. More specifically, overlap sensor 150 has a greater relative proportion of proximate flux ($\Phi_{proximate,overlap}$) than the proximate flux ($\Phi_{proximate,fringe}$) of fringe sensor 110. As pointing element 5 applies force to cluster sensor unit 100 and electrodes 112, 114 and 152, 154 get closer to one another, the capacitance due to this proximate flux may increase. Since overlap sensor 150 has a greater proportion of proximate flux ($\Phi_{proximate,overlap}$) than the proximate flux ($\Phi_{proximate,fringe}$) of fringe sensor 110, the overlap capacitance $C_{overlap}$ may be relatively more sensitive to the deformation caused by the force applied by pointing element 5 than the capacitance $C_{fringe}$ of fringe sensor 110 and the overlap capacitance $C_{overlap}$ of overlap sensor 150 may therefore increase more dramatically than the fringe capacitance $C_{fringe}$. Accordingly, a processor could be configured to generate and/or output one or more signals indicating that pointing element 5 is in contact with cluster sensor 100 and is applying contact force to cluster sensor 100 (e.g. Scenario D) based on $C_{fringe}$ increasing above $C_{f,touch}$ and $C_{overlap}$ increasing above $C_{o,threshold}$ A processor could additionally or alternatively be configured to generate and/or output one or more signals indicating that pointing element 5 is in contact with cluster sensor 100 and is applying contact force to cluster sensor 100 (e.g. Scenario D) based only on $C_{overlap}$ increasing above $C_{o,threshold}$. As can be seen from FIG. 2, the amount of pressure applied to cluster sensor 100 may be determined by measuring the amount of change of $C_{overlap}$ and/or $C_{fringe}$.

Scenario E represents when pointing element 5 is in contact with cluster sensor unit 100 and is reducing the contact force being applied to cluster sensor unit 100. Scenario E is represented as time period $t_{c5}$ on the FIG. 2 graph. At the conclusion of Scenario E, (i.e. at the conclusion of $t_{c5}$) the Scenario is substantially similar to that of Scenario C i.e. there is contact of pointing element 5 to cluster sensor unit 100, but no force is applied by pointing element 5 on cluster sensor unit 100. As can be seen from the FIG. 2 graph, the estimated value of $C_{fringe}$ decreases in Scenario E back toward $C_{f,touch}$. Also, the estimated value of $C_{overlap}$ decreases back toward a threshold range around the nominal overlap capacitance $C_{o,nom}$ (i.e. decreases back toward $C_{o,threshold}$). Accordingly, a processor could be configured to generate and/or output one or more signals indicating that pointing element 5 is in contact with cluster sensor 100 and is decreasing the contact force on cluster sensor 100 (e.g. Scenario E) based on $C_{fringe}$ and $C_{overlap}$ both decreasing. The circumstance at the end of Scenario E (contact with zero force) is reached when $C_{fringe}$ decreases below $C_{f,touch}$ and $C_{overlap}$ decreases below $C_{o,threshold}$ and/or returns to a vicinity of $C_{o,nom}$. A processor could additionally or alternatively be configured to generate and/or output one or more signals indicating that pointing element 5 is in contact with cluster sensor 100 and has decreased the contact force on cluster sensor 100 to zero (e.g. at the end of Scenario E) based only on $C_{overlap}$ decreasing below $C_{o,threshold}$ and returning to $C_{o,nom}$. It is also possible that not all contact force is released from cluster sensor 100. In that case, $C_{fringe}$ will decrease but may not return below $C_{f,touch}$ and $C_{overlap}$ will decrease but may not return below $C_{o,threshold}$.

Scenario F represents when pointing element 5 is moving away from, but is still proximate to, cluster sensor unit 100 and is not applying contact force to cluster sensor unit 100. Scenario F is represented as time period $t_{c6}$ on the FIG. 2 graph. As can be seen from the FIG. 2 graph, the estimated value of $C_{fringe}$ increases toward a threshold range around the nominal fringe capacitance, $C_{f,nom}$ (i.e. increases toward $C_{f,threshold}$) as pointing element 5 moves away from cluster sensor unit 100. In contrast, the estimated value of $C_{overlap}$ remains within a threshold range around the nominal overlap capacitance $C_{o,nom}$ (i.e. does not increase above $C_{o,threshold}$). This difference between the reactions of the capacitances, $C_{fringe}$ and $C_{overlap}$ to the Scenario F circumstance is similar to the Scenario B circumstance described above and may be attributable to the fact that the FSFR is greater than the OSFR. More specifically, fringe sensor 110 has a greater relative proportion of distal flux ($\Phi_{distal,fringe}$) than the distal flux ($\Phi_{distal,overlap}$) of overlap sensor 150. As pointing element 5 moves away from cluster sensor unit 100, some distal flux which did terminate (or start depending on polarity) in pointing element 5, starts to terminate (or start) in the respective second electrodes 114, 154. Since fringe sensor 110 has a greater proportion of distal flux ($\Phi_{distal,fringe}$) than the distal flux ($\Phi_{distal,overlap}$) of overlap sensor 150, the fringe capacitance $C_{fringe}$ is relatively more sensitive to the proximity of pointing element 5 than the capacitance $C_{overlap}$ of overlap sensor 150 and the fringe capacitance $C_{fringe}$ of fringe sensor 110 increases more dramatically as shown in Scenario F of FIG. 2. Accordingly, a processor could be configured to generate and/or output one or more signals indicating that pointing element 5 is moving away from, but is still proximate to, cluster sensor 100 (e.g. Scenario F) based on $C_{fringe}$ increasing toward $C_{f,threshold}$ and $C_{overlap}$ remaining below $C_{o,threshold}$. Once $C_{fringe}$ increases above $C_{f,threshold}$, pointing element will no longer be within proximity of cluster sensor unit 100, as in Scenario A.

Figure 2A:
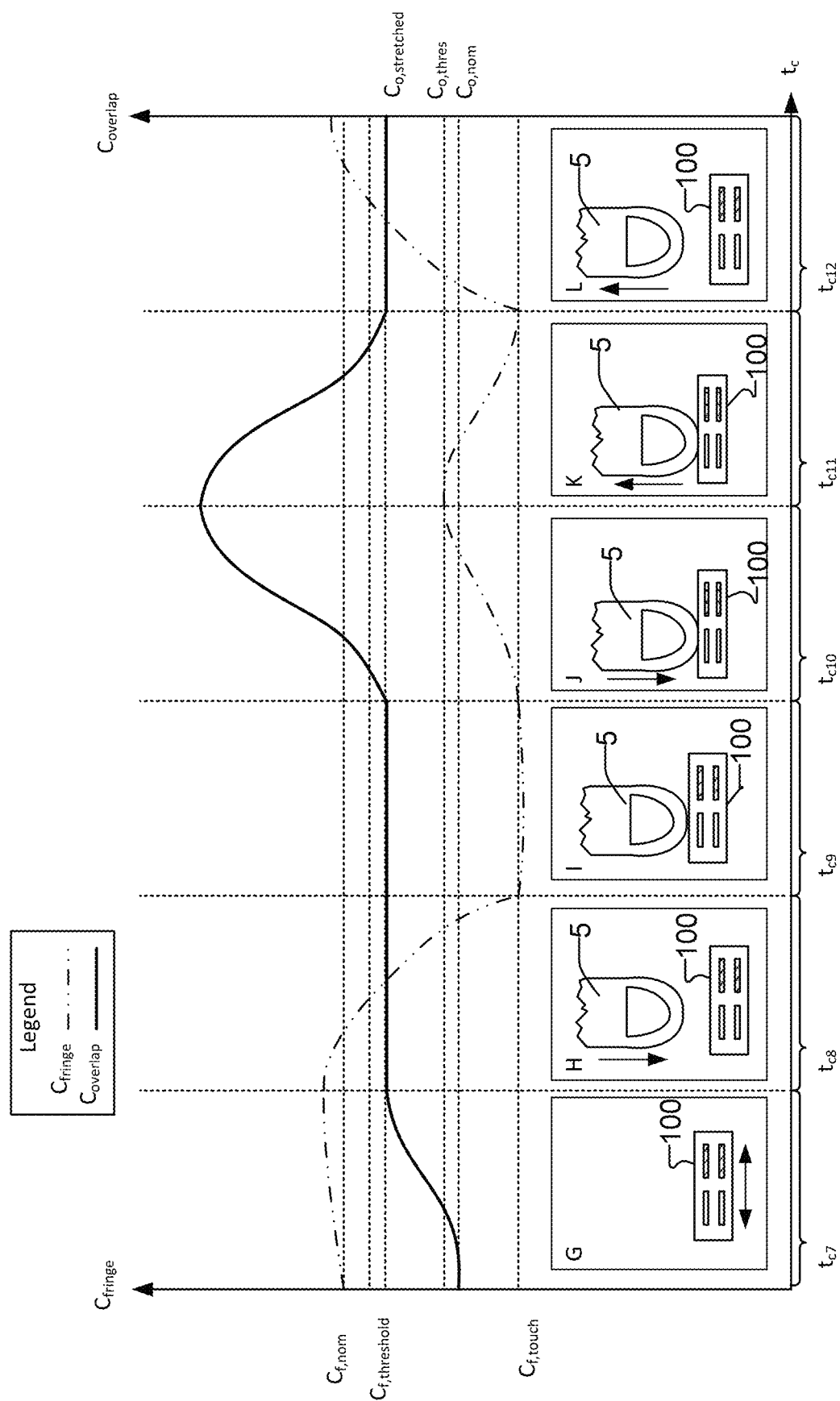

FIG. 2A depicts a series of Scenarios, G through L, of cluster sensor unit 100 being stretched in the X direction and/or Y direction while a pointing element 5 interacts with the stretched cluster sensor 100 and a graph showing both of $C_{fringe}$ and $C_{overlap}$ of cluster sensor unit 100 during each of Scenarios G through L.

Scenario G represents when cluster sensor unit 100 is being stretched in the X direction and/or Y direction without a pointing element 5 in the proximity of cluster sensor unit 100. Scenario G is represented as time period $t_{c7}$ on the FIG. 2A graph. As can be seen from the FIG. 2A graph, the estimated value of $C_{fringe}$ slightly increases from $C_{f,nom}$ (in some embodiments, this $C_{fringe}$ increase may be negligible). In contrast, the estimated value of $C_{overlap}$ increases above a threshold range around the nominal overlap capacitance $C_{o,nom}$ (i.e. above $C_{o,threshold}$) to a value $C_{o,stretched}$. This difference between the increases reactions of the capacitances, $C_{fringe}$ and $C_{overlap}$ to the Scenario G circumstance may be attributable to the fact that the FSFR is greater than the OSFR. More specifically, overlap sensor 150 has a greater proportion of proximate flux ($\Phi_{proximate,overlap}$) than the proximate flux ($\Phi_{proximate,fringe}$) of fringe sensor 110 due to the shape and/or relative locations of their respective electrodes. When the individual sensors are stretched, the increase in Z-direction overlapping surface area and corresponding increases in $\Phi_{proximate,overlap}$ and $C_{overlap}$ are greater for overlap sensor 150, than the increase in Z-direction overlapping surface area and corresponding increases in $\Phi_{proximate,fringe}$ and $C_{fringe}$ for fringe sensor 110. Accordingly, a processor could be configured to generate and/or output one or more signals indicating cluster sensor unit 100 is being stretched in the X direction and/or Y direction without a pointing element 5 in the proximity of cluster sensor unit 100 (e.g. Scenario G) based on $C_{fringe}$ increasing slightly above $C_{f,nom}$ and $C_{overlap}$ increasing above $C_{o,threshold}$ (e.g. to a vicinity of $C_{o,stretched}$). As cluster sensor unit 100 is stretched, the nominal capacitances, threshold capacitance, touch capacitance etc. of each of fringe sensor 110 and overlap sensor 150 may be changed (e.g. by a suitably configured processor) to reflect the stretched cluster sensor unit 100. As will be discussed below, in some embodiments, Scenario J may be difficult to distinguish from Scenario G if only the relative changes of $C_{fringe}$ and $C_{overlap}$ are considered (as compared to the absolute changes which require tracking prior and/or subsequent time periods, or the capacitances of neighbouring sensors in the case of an array of cluster sensors 100).

Scenario H represents when pointing element 5 is approaching (e.g. is proximate to) stretched cluster sensor unit 100, but is not touching or applying contact force to stretched cluster sensor unit 100. Scenario H is represented as time period $t_{c8}$ on the FIG. 2A graph. As can be seen from the FIG. 2A graph, the estimated value of $C_{fringe}$ decreases outside of a threshold range around the nominal fringe capacitance, $C_{f,nom}$ (i.e. decreased below $C_{f,threshold}$). In contrast, the estimated value of $C_{overlap}$ remains relatively constant at or near $C_{o,stretched}$. This difference between the reactions of the capacitances, $C_{fringe}$ and $C_{overlap}$ to the Scenario H circumstance may be similar to the Scenario B circumstance described above (except for the fact that the capacitances of the stretched cluster sensor unit 100) may be starting from different levels due to the stretching) and may be attributable to the fact that the FSFR is greater than the OSFR. Accordingly, a processor could be configured to generate and/or output one or more signals indicating that pointing element 5 is approaching (e.g. is proximate to) a stretched cluster sensor 100 (e.g. Scenario H) based on $C_{fringe}$ decreasing below $C_{f,threshold}$ and $C_{overlap}$ remaining at or near $C_{o,stretched}$.

Scenario I represents when pointing element 5 is in contact with stretched cluster sensor unit 100, but is not applying contact force to stretched cluster sensor unit 100. Scenario I is represented as time period $t_{c9}$ on the FIG. 2A graph. As can be seen from the FIG. 2A graph, the estimated value of $C_{fringe}$ decreases by more than a contact threshold amount from the nominal fringe capacitance, $C_{f,nom}$ (i.e. $C_{fringe}$ decreases below $C_{f,touch}$). In contrast, the estimated value of $C_{overlap}$ remains at or near $C_{o,stretched}$. This difference between the reactions of the capacitances, $C_{fringe}$ and $C_{overlap}$ to the Scenario I circumstance may be similar to the Scenario C circumstance described above (except for the fact that the capacitances of the stretched cluster sensor unit 100) may be starting from different levels due to the stretching) and may be attributable to the fact that the FSFR is greater than the OSFR. The difference between the reaction of the capacitance $C_{fringe}$ to Scenario H and Scenario I may be a difference of degree and may involve configurable thresholds $C_{f,threshold}$ and $C_{f,touch}$. Accordingly, a processor could be configured to generate and/or output one or more signals indicating that pointing element 5 is touching, but not applying force to, stretched cluster sensor unit 100 (e.g. Scenario I) based on $C_{fringe}$ decreasing below $C_{f,touch}$ and $C_{overlap}$ remaining at or near $C_{f,stretched}$. A processor could additionally or alternatively be configured to generate and/or output one or more signals indicating that pointing element 5 is touching but not applying force to stretched cluster sensor 100 (e.g. Scenario I) based only on $C_{fringe}$ decreasing below $C_{f,touch}$).

Scenario J represents when pointing element 5 is in contact with stretched cluster sensor unit 100 and is applying contact force to stretched cluster sensor unit 100. Scenario J is represented as time period $t_{c10}$ on the FIG. 2A graph. As can be seen from the FIG. 2A graph, the estimated value of $C_{fringe}$ increases from $C_{f,touch}$. Also, the estimated value of $C_{overlap}$ increases from $C_{o,stretched}$. The fact that both capacitances $C_{fringe}$ and $C_{overlap}$ increase may be attributable to the fact that their respective electrodes 112, 114 and 152, 154 are deformed by the application of force to be closer to one another. In some embodiments, the relative increase in $C_{overlap}$ may be greater than the relative increase in $C_{fringe}$. This may be attributable to the fact that the OSFR is less than the FSFR. More specifically, overlap sensor 150 has a greater relative proportion of proximate flux ($\Phi_{proximate, overlap}$) than the proximate flux ($\Phi_{proximate,fringe}$) of fringe sensor 110. As pointing element 5 applies force to cluster sensor unit 100 and electrodes 112, 114 and 152, 154 get closer to one another, the capacitance due to this proximate flux may increase. Since overlap sensor 150 has a greater proportion of proximate flux ($\Phi_{proximate,overlap}$) than the proximate flux ($\Phi_{proximate,fringe}$) of fringe sensor 110, the overlap capacitance $C_{overlap}$ may be relatively more sensitive to the deformation caused by the force applied by pointing element 5 than the capacitance $C_{fringe}$ of fringe sensor 110 and the overlap capacitance $C_{overlap}$ of overlap sensor 150 may increase more dramatically. Accordingly, a processor could be configured to generate and/or output one or more signals indicating that pointing element 5 is in contact with stretched cluster sensor 100 and is applying contact force to stretched cluster sensor 100 (e.g. Scenario J) based on $C_{fringe}$ increasing above $C_{f,touch}$ and $C_{overlap}$ increases (e.g. by a suitable threshold amount) from $C_{o,stretched}$. A processor could additionally or alternatively be configured to generate and/or output one or more signals indicating that pointing element 5 is in contact with stretched cluster sensor 100 and is applying contact force to stretched cluster sensor 100 (e.g. Scenario J) based only on $C_{overlap}$ increasing (e.g. by a suitable threshold amount) from $C_{o,stretched}$. As can be seen from FIG. 2A, the amount of pressure applied to stretched cluster sensor 100 may be determined by measuring the amount of change of $C_{overlap}$ and/or $C_{fringe}$. As alluded to above, Scenario J may be indistinguishable from Scenario G if only the relative changes of $C_{fringe}$ and $C_{overlap}$ are considered (as compared to the absolute changes which require tracking prior and/or subsequent time periods, or the capacitances of neighbouring sensors in the case of an array of cluster sensors 100). Alternative methods for distinguishing between Scenario G and Scenario J are discussed further herein.

Scenario K represents when pointing element 5 is in contact with stretched cluster sensor unit 100 and is reducing the contact force being applied to stretched cluster sensor unit 100. Scenario K is represented as time period $t_{c11}$ on the FIG. 2A graph. At the conclusion of Scenario K, (i.e. at the conclusion of $t_{c5}$), the Scenario is substantially similar to that of Scenario I i.e. there is no contact of pointing element 5 to stretched cluster sensor unit 100, but no force is applied by pointing element 5 on stretched cluster sensor unit 100. As can be seen from the FIG. 2A graph, the estimated value of $C_{fringe}$ decreases in Scenario K back toward $C_{f,touch}$. Also, the estimated value of $C_{overlap}$ decreases back toward $C_{o,stretched}$. Accordingly, a processor could be configured to generate and/or output one or more signals indicating that pointing element 5 is in contact with stretched cluster sensor 100 and is decreasing the contact force being applied to stretched cluster sensor 100 (e.g. Scenario K) based on $C_{fringe}$ and $C_{overlap}$ both decreasing. The circumstance at the end of Scenario K (contact with zero force) is reached when $C_{fringe}$ decreases below $C_{f,touch}$ and $C_{overlap}$ decreases to a vicinity of $C_{o,stretched}$. A processor could additionally or alternatively be configured to generate and/or output one or more signals indicating that pointing element 5 is in contact with stretched cluster sensor 100 and has decreased the contact force being applied to stretched cluster sensor 100 to zero (e.g. at the end of Scenario K) based only on $C_{overlap}$ decreasing back toward $C_{o,stretched}$. It is also possible that not all contact force is released from cluster sensor 100. In that case, $C_{fringe}$ will decrease but may not return below $C_{f,touch}$ and $C_{overlap}$ will decrease but may not return to $C_{o,stretched}$.

Scenario L represents when pointing element 5 is moving away from, but is still proximate to stretched cluster sensor unit 100 and is not applying contact force to stretched cluster sensor 100. Scenario L is represented as time period $t_{c12}$ on the FIG. 2A graph. As can be seen from the FIG. 2A graph, the estimated value of $C_{fringe}$ increases toward a threshold range around the nominal fringe capacitance, $C_{f,nom}$ (i.e. increases toward and possibly even above $C_{f,threshold}$). In contrast, the estimated value of $C_{overlap}$ remains at or near (i.e. within a threshold range of) $C_{o,stretched}$. This difference between the reactions of the capacitances, $C_{fringe}$ and $C_{overlap}$ to the Scenario L circumstance is similar to the Scenario H circumstance described above and may be attributable to the fact that the FSFR is greater than the OSFR. More specifically, fringe sensor 110 has a greater relative proportion of distal flux ($\Phi_{distal,fringe}$) than the distal flux ($\Phi_{distal,overlap}$) of overlap sensor 150. As pointing element 5 moves away from stretched cluster sensor unit 100, some distal flux which did terminate (or start depending on polarity) in pointing element 5, starts to terminate (or start) in the respective second electrodes 114, 154. Since fringe sensor 110 has a greater proportion of distal flux ($\Phi_{distal,fringe}$) than the distal flux ($\Phi_{distal,overlap}$) of overlap sensor 150, the fringe capacitance $C_{fringe}$ is relatively more sensitive to the proximity of pointing element 5 than the capacitance $C_{overlap}$ of overlap sensor 150 and the fringe capacitance $C_{fringe}$ of fringe sensor 110 increases more dramatically as shown in Scenario L of FIG. 2A. Accordingly, a processor could be configured to generate and/or output one or more signals indicating that pointing element 5 is moving away from, but is still proximate to, stretched cluster sensor 100 (e.g. Scenario L) based on $C_{fringe}$ increasing toward (and possibly even above) $C_{f,threshold}$ and $C_{overlap}$ remaining at or near (i.e. within a threshold range of) $C_{o,stretched}$. Once $C_{fringe}$ increases above $C_{f,threshold}$, pointing element will no longer be within proximity of cluster sensor 100, as in Scenario G.

Figure 3:
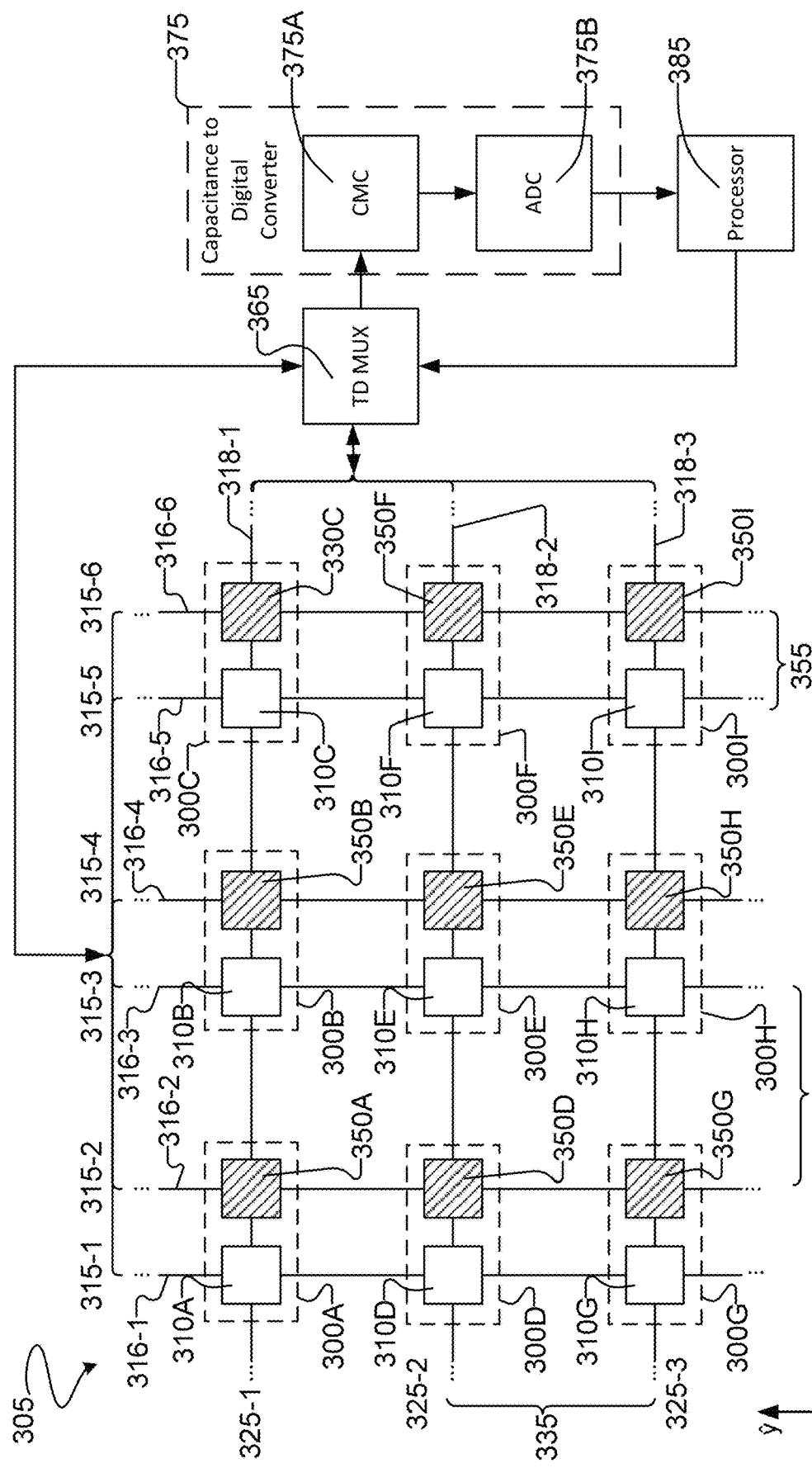
FIG. 3 depicts a schematic plan view of a sensor array according to one embodiment of the invention.

One aspect of the invention provides a sensor array for sensing the location of proximity, touch and/or pressure of a pointing element with respect to a sensing surface. In some embodiments, the sensor array is stretchable or otherwise deformable. FIG. 3 depicts a cluster sensor array 305 according to a particular embodiment comprising a plurality of cluster sensors 300A to 300I (collectively referred to as cluster sensors 300) organized in sensor columns 315-1 to 315-6 (collectively referred to as sensor columns 315) and sensor rows 325-1 to 325-3 (collectively referred to as sensor rows 325). In the illustrated embodiment of FIG. 3, each one of sensors 300 comprises a corresponding fringe sensor 310A-301I (collectively, fringe sensors 310) and a corresponding overlap sensor 350A-350I (collectively, overlap sensors 350) which are located along a corresponding one of sensor rows 325. Consequently, in the illustrated embodiment of FIG. 3, each cluster sensor unit 300 is located at an intersection of one of sensor rows 325 and a pair of sensor columns 315 (i.e. one column 315 for fringe sensors 310 and one column for overlap sensors 350). It will be appreciated that in other embodiments, array 305 and/or other individual cluster sensor units 300 could have other geometries. For example, the fringe sensor 310 and overlap sensor 350 of a cluster sensor unit 300 could be aligned along a corresponding sensor column 315 (in which case, each cluster sensor unit 300 could be located at the intersection of one column 325 and a pair of rows) or the fringe sensor 310 and overlap sensor 350 of a cluster sensor unit 300 could be offset in two dimensions from one another (in which case, each cluster sensor unit 300 could be located at the intersection of a pair of columns 325 and a pair of rows). Each of cluster sensors 300 may comprise a cluster sensor unit 100, cluster sensor unit 200, 500, 500-1, 600, 750 or any other cluster sensor or cluster sensor unit described herein. For convenience, FIG. 3 only shows six sensor columns 315 and three sensor rows 325, but it should be understood that sensor array 305 may comprise any suitable number of sensor columns 315 and sensor rows 325 for a surface to be sensed.

As depicted in the FIG. 3 embodiment, the cluster sensors 300 (more particularly the first fringe electrodes of fringe sensors 310 and the first overlap electrodes of first overlap sensor 350) of a particular sensor row 325 are connected by a row trace 318. For example, in sensor row 325-1, cluster sensors 300A, 300B, 300C are ionically or electrically connected by row trace 318-1. All of the fringe sensors 310 of the cluster sensors 300 (more particularly the second fringe electrodes of fringe sensors 310 and the second overlap electrodes of first overlap sensor 350) of a particular sensor column are connected by a column trace 316 and all of the overlap sensors of the cluster sensors 300 of a particular sensor column are connected by a column trace 316. For example, fringe sensors 310A, 310D, and 310G (more particularly, the second fringe electrodes) of sensor column 315-1 are ionically or electrically connected by a column trace 316-1 and overlap sensors 350A, 350D, and 350G (more particularly, the second fringe electrodes) of sensor column 315-2 are ionically or electrically connected by a column trace 316-2.

In the illustrated FIG. 3 embodiment, each cluster sensor unit 300 is spaced apart from adjacent cluster sensor units 300 by a Y direction cluster spacing 335 and/or an X direction cluster spacing 345. For example, cluster sensor 300A is spaced apart from cluster sensor 300D by a Y direction cluster spacing 335, is spaced apart from cluster sensor 300B by an X direction cluster spacing 345 and is spaced apart from cluster sensor 300E by an X direction cluster spacing 345 and a Y direction cluster spacing 335. In some embodiments, X direction cluster spacing 345 and Y direction cluster spacing 335 are equal. For example, X direction cluster spacing 345 and Y direction spacing may be between 3 and 8 mm (e.g. 5 mm). In some embodiments, X direction cluster spacing 345 and Y direction cluster spacing 335 are not equal and/or X direction spacing and Y direction cluster spacing 335 are not constant across array 305.

In the illustrated FIG. 3 embodiment, each fringe sensor 310 and overlap sensor 350 of a particular cluster sensor 300 is spaced apart in the X direction by an X direction sensor spacing 355. As discussed above, X direction sensor spacing 355 may be any suitable spacing. In some embodiments, X direction sensor spacing 355 is chosen based on the size of the pointing element used in a particular application. In particular applications, such as where a fingertip is used as a pointing element, X direction spacing may be between 0.5 and 2 mm (e.g. 1 mm), for example.

In some embodiments, cluster sensor units 300 (and each fringe sensor 310 and overlap sensor 350 within a cluster sensor unit 300) of sensor array 305 are spaced apart by a dielectric 313. Dielectric 313 may comprise any suitable dielectric material. In some embodiments, dielectric 313 is deformable. For example, dielectric 313 may comprise a silicone material such as a silicon elastomer matrix or another material discussed herein. In some embodiments, each cluster sensor unit 300 (and each fringe sensor 310 and overlap sensor 350 within each cluster sensor unit 300) of sensor array 305 is surrounded by dielectric 313, as will be discussed further herein.

Each column trace 316 is connected to transmit to and/or receive signals from a processor 385. Each individual column trace 316 may be connected directly to processor 385 or may be connected via one or more time-division multiplexers 365. Similarly, each row trace 318 is connected to transmit to and/or receive signals from a processor 385. Each individual row trace 318 may be connected directly to processor 385 or may be connected via one or more time-division multiplexers 365. Column traces 316 and row traces 318 may be connected via the same or different time-division multiplexers 365. As will be appreciated from the discussion herein, suitable signal conditioning circuitry may be interposed between column traces 316 and processor 385 and/or between row traces 318 and processor 385. For clarity and simplicity of the drawing, such circuitry, which will be understood to those skilled in the art, is not shown in FIG. 3.

In the illustrated embodiment, signals from column traces 316 and row traces 318 are directed to capacitance measurement circuit (CMC) 375A prior to being received at processor 385. As will be described in more detail below, CMC 375A may be employed to determine a capacitance value for each fringe and overlap sensor 310, 350 based on the signals from column traces 316 and row traces 318. CMC 375A may be employed in conjunction with an analog to digital converter (ADC) 375B. ADC 375B and CMC 375A may be integrated in the form of a capacitance to digital converter 375 or ADC 375 may be implemented separately from CMC 375A. In some embodiments, a Delta-Sigma ADC is employed to convert a changing analog voltage signal on traces 316, 318 into a quantized digital signal by sampling the signal at a very high frequency and feeding the sampled data into a comparator. In some embodiments, the output of the Delta-Sigma ADC is then integrated to obtain a digital signal. Where ADC 375B and CMC 375A are combined, a constant voltage input may be employed while the feedback capacitor of the integrator is employed as the sense capacitor. Changes in the feedback capacitor of the integrator may cause the digital output to change while the input voltage is kept constant and/or changes in the input voltage may cause the digital output to change. Processor 385 may be connected and configured to control multiplexer 365 while capacitance to digital converter 375 transmits final data to processor 385, where digital values of the capacitances of fringe sensors 310 and overlap sensors 350 can be acquired and displayed.

In some embodiments, processor 385 is configured to individually sample each cluster sensor unit 300. Individual sampling of cluster sensor units 300 may occur sequentially. Sampling may occur at any desired rate. For example, for near real-time results, sampling may occur at between 2 to 4 times per second. A form of running averaging of the signal may be employed by processor 385 or some other suitable conditioning circuit to reduce effects of noise and drift in signals from cluster sensor units 300.

Processor 385 may be configured to sample an individual cluster sensor unit 300 in various ways. Processor 385 may be configured to sample each of fringe sensor 310A and overlap sensor 350A of cluster sensor 350A simultaneously or in series. For example, processor 385 may be configured to apply a voltage across column trace 316-1 and row trace 318-1 while either: allowing the remaining columns traces 316 (i.e. column traces 316-2 to 316-6) and the remaining row traces 318 (i.e. row traces 318-2 and 318-3) to float (i.e. not applying a voltage to the remaining columns and rows or not grounding the remaining columns and rows); or grounding the remaining column traces 316 and the remaining row traces 318. After the voltage is applied across column trace 316-1 and row trace 318-1, the capacitance of fringe sensor 310A can be distinguished from the capacitance of any other fringe sensor 310 or overlap sensor 350 at a particular time. To finish sampling cluster sensor 300A, processor 385 may be configured to apply a voltage across column trace 316-2 and row trace 318-1 while either: allowing the remaining columns traces 316 (i.e. column traces 316-1 and 316-3 to 316-6) and the remaining row traces 318 (i.e. row traces 318-2 and 318-3) to float; or grounding the remaining column traces 316 and the remaining row traces 318. After the voltage is applied across column trace 316-2 and row trace 318-1, the capacitance of overlap sensor 350A can be distinguished from the capacitance of any other fringe sensor 310 or overlap sensor 350 at a particular time. Subsequently, each remaining cluster sensor unit 300 (i.e. cluster sensor units 300B to 300I) may each be sampled in a similar way.

Figure 3A:
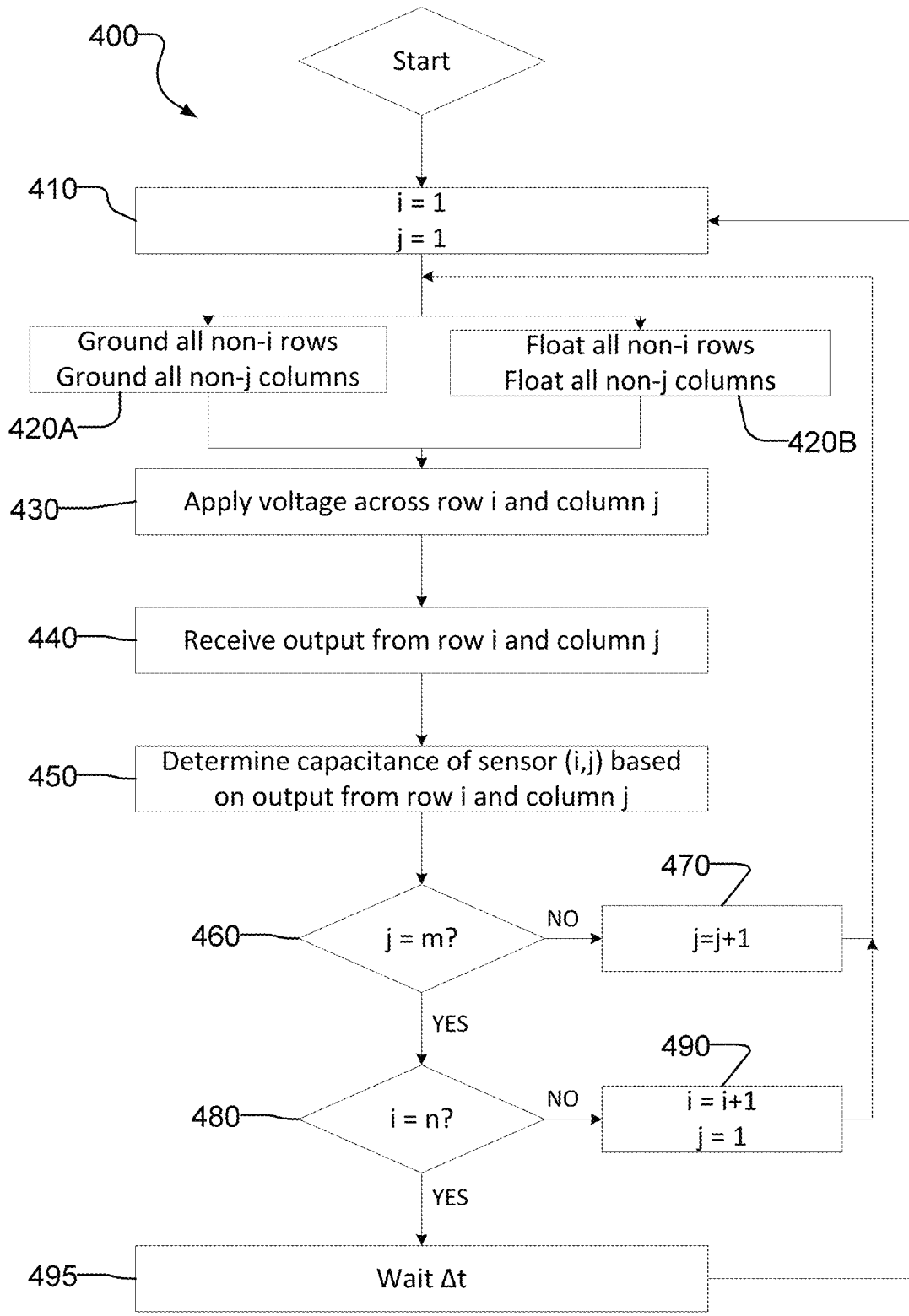
FIG. 3A depicts a method of determining capacitances for each sensor of a sensor array according to one embodiment of the invention.

FIG. 3A depicts one exemplary method 400 (which may be performed by processor 385) for sampling each fringe sensor 310 and each overlap sensor 350 of a sensor array 305 where sensor array 305 contains a number, n, of sensor rows 325 and a number, m, of sensor columns 315 and each sensor row 325 can be represented by a row index, i, from 1 to n and each sensor column 315 can be represented by a column index, j, from 1 to m. A particular sensor may then be represented by a coordinate (i, j). For example, fringe sensor 310A may be represented as sensor (1, 1), as it is located at the intersection of sensor row 325-1 and sensor column 315-1 and overlap sensor 350F may be represented as sensor (2, 6) as it is located at the intersection of sensor row 325-2 and sensor column 315-6.

Processor 385 may be configured to maintain a counter for keeping track of which sensor (i, j) is currently being sampled. Method 400 starts at block 410 by initializing the value of row index, i, to 1 and also initializing the counter value sensor index, j, to 1.

After block 410, method 400 may continue to either of blocks 420A or 420B. At block 420A, all non-i rows and all non-j columns are connected to ground. In other words, in the FIG. 3 embodiment, when the counter (i, j) is set to (1, 1), row traces 318-2, 318-3 and column traces 316-2, 316-3, 316-4, 316-5, 316-6 are connected to ground. Block 420A may be accomplished by suitably controlling multiplexer 365. Similarly, in block 420B, all non-i rows and all non-j columns are allowed to float. In other words, the non-i rows and the non-j columns are not grounded and there is no current or charge directed to them. Block 420B may be accomplished by suitable controlling multiplexer 365.

After either of blocks 420A or 420B, method 400 continues to block 430 which comprises applying a voltage across sensor row i and column row j. The voltage may be applied through row trace 318-i or column trace 316-j. In practice, this is equivalent to applying a voltage across the first and second electrodes of sensor (i, j) which may be used to measure the capacitance of sensor (i, j).

At block 440, processor 385 may receive output from sensor row i and sensor column j via row trace 318-i and column trace 316-j. The output from sensor row i and sensor column j may be used to determine the capacitance of sensor (i, j) at block 450 using, for example, capacitance to digital converter 375 as described herein.

After determining the capacitance of sensor (i, j), method 400 continues to block 460 where, if the column index, j, is not equal to m (i.e. method 400 is not at the last column of row i), column index, j, is incremented at block 470 and method 400 returns to block 420A or 420B. For example, if the capacitance of sensor (1, 1) (i.e. fringe sensor 310A) was just determined, block 460 would move method 400 on to measure the capacitance of sensor (1, 2) (i.e. overlap sensor 350A) at blocks 420A/B to 450.

If column index, j, is equal to m (i.e. method 400 is at the last column of row i), then method 400 moves on to block 480 where, if the row index, i, is not equal to n (i.e. method 400 is not at the last row i), row index, i, is incremented at block 470 and column index, j, is reinitialized to 1 before method 400 returns to block 420A or 420B. For example, if the capacitance of sensor (1, 6) (i.e. overlap sensor 350C) was just determined, block 480 and block 490 would move method 400 on to measure the capacitance of sensor (2, 1) (i.e. fringe sensor 310D).

If row index, i, is equal to n (i.e. method 400 is at the last row i), then method 400 moves on to block 495 where method 400 waits for a time, Δt, before returning to block 410 to commence again. Time, Δt, may be set based on a desired rate of sampling of cluster sensors 300 of sensor array 305. For example, time, Δt, may be set to a particular value if sensor array 305 is set to be sampled three times per second or a greater value if sensor array is set to be sampled 2 times per second. In some embodiments, sampling occurs continuously and time, Δt, is set to zero.

Figure 3B:
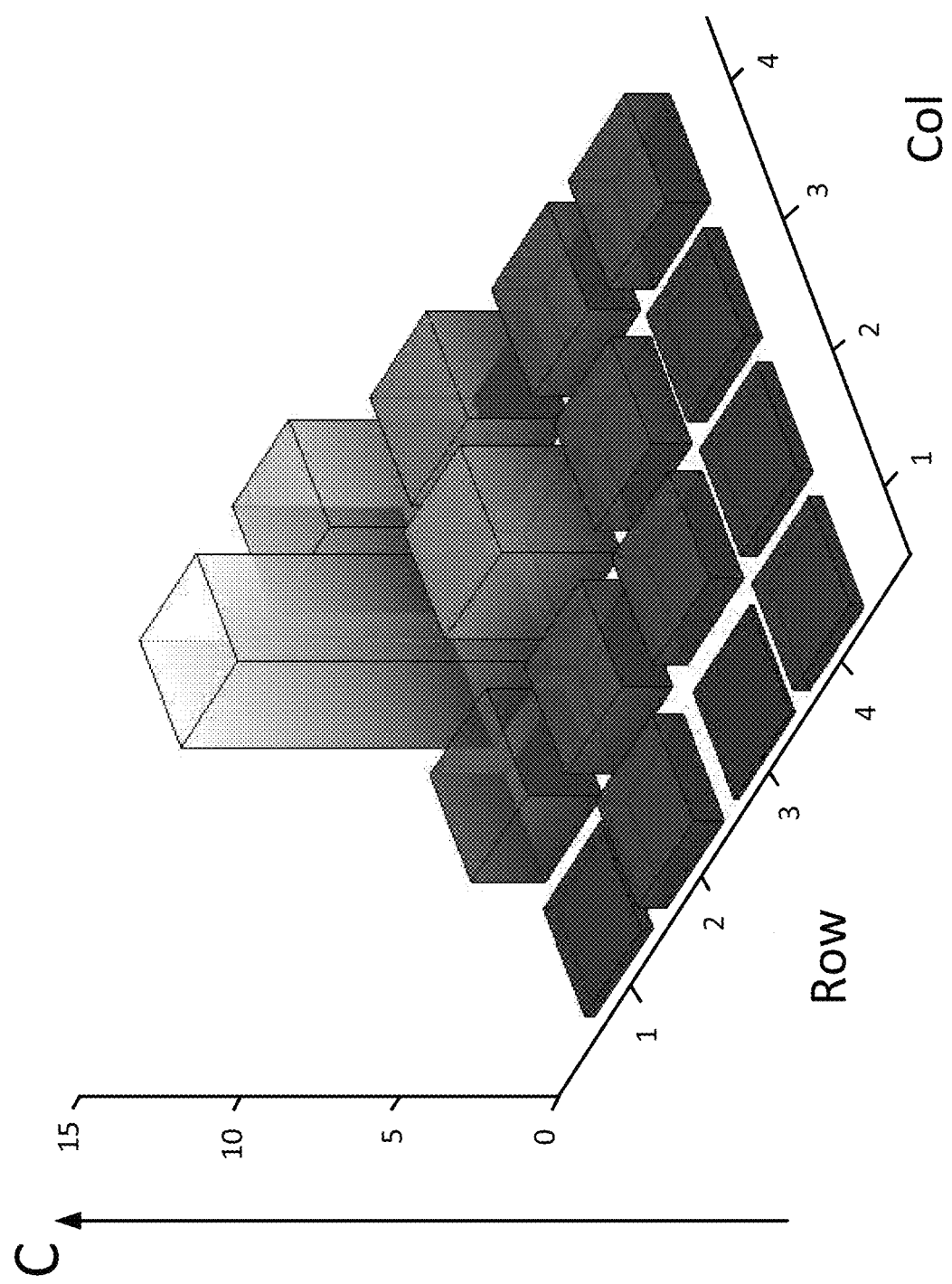
FIG. 3B depicts a map of capacitance changes for the sensors of a sensor array according to one embodiment of the invention.

In some embodiments, each combination of row and column electrodes is scanned and the capacitances of all sensors 310, 350 are determined to create a two dimensional map (or array) of capacitances indexed by sensor row and sensor column, such as is depicted in FIG. 3B. Processor 385 may be configured to monitor such a map (e.g. to monitor the capacitance of each fringe sensor 310 and each overlap sensor 350 of each cluster sensor unit 300) for changes in capacitance. The two-dimensional position of a pointing element can be detected based on the capacitance changes observed, as set out herein. For example, the FIG. 3B map may represent a change in capacitance of fringe sensors 310 as pointing element 5 touches sensor array 305.

In some embodiments, processor 385 may be configured to recognize Scenarios A to L for each cluster sensor unit 300 of sensor array 305. Scenarios A to L may be recognized as described above by monitoring the capacitance of each fringe sensor 310 and each overlap sensor 350 that make up the cluster sensor units 300. As mentioned above, additional information may be desirable for processor 385 to distinguish between Scenario G (stretching of a cluster sensor unit 300 from its nominal shape) and Scenario J (applying pressure to a cluster sensor 300, when cluster sensor unit 300 is stretched). In some embodiments, it is possible for processor 385 to discriminate between Scenarios G and J for a particular cluster sensor unit 300 by comparing the capacitances of neighbouring cluster sensor units 300 within sensor array 305. For example, if cluster sensor 300A shows a slight increase in capacitance of fringe sensor 310A and a significant increase in capacitance of overlap sensor 350A, this may represent either of Scenario G or Scenario J. To discriminate between Scenario G and Scenario J, processor 385 may consider the capacitances of neighbouring cluster sensor units 300B, 300D (or more). If the neighbouring cluster sensor units 300B, 300D exhibit similar changes in capacitance of fringe sensors 310B, 310D and overlap sensors 350B, 350D, then processor 385 may recognize that sensor array 305 is being stretched in the X direction and/or the Y direction. Alternatively, if only cluster sensor unit 300A exhibits the aforementioned changes in capacitance of fringe sensor 310A and overlap sensor 350A, then processor 385 may recognize that pressure is being applied in a vicinity of cluster sensor unit 300A.

Due to the proximity of neighbouring cluster sensor units 300, the capacitance of more than one cluster sensor unit 300 may be affected by a single pointing element (this can be seen in the FIG. 3B map, for example). For example, a pointing element that touches sensor array 305 between cluster sensor unit 300A and cluster sensor unit 300B may have an effect on the capacitances of both of cluster sensor unit 300A and cluster sensor unit 300B. The example map in FIG. 3B shows that a pointing element may principally impact the capacitances of one cluster sensor unit 300 and may have a subsidiary impact on the capacitances of neighboring cluster sensor units 300. This effect may be employed to locate a "center of activation" on the surface covered by sensor array 305 using further signal processing to enhance the spatial resolution, if desired.

Unlike other deformable capacitive sensor implementations, no force is required to obtain changes in the measured capacitances of cluster sensor units 300. The ability to sense proximity allows for non-contact gestures to be detected. Contact gestures such as the translational motion of a finger on the sensor surface (commonly referred to as a "swipe") can also be detected without the need to press firmly on the surface of sensor array 305, minimizing stiction the surface of sensor array 305. Sensor array 305 is able to detect gestures such as a swipe, where a pointing element, such as a finger in light contact with the surface of sensor array 305, is moved across sensor array 305. Sensor array 305 may also have multi-touch capability, in which the presence of one, two or more pointing elements are simultaneously or near-simultaneously detectable.

The inventors have determined, based on material based models, that sensor array 305 can be very large approximately 50 m×50 m with a 20 cm grid (e.g. spacing between cluster sensor units 300 of 20 cm), if refreshed twice per second. Such a format might be used to detect the presence of, for example, feet or other similarly large pointing elements (in addition to or in the alternative to fingers or other similarly small pointing elements).

An attractive feature of any capacitive sensor technology is that its resolution scales in proportion to the dimensions of the electrodes. For a parallel plate capacitor whose dimensions are uniformly scaled up or down, the magnitude of the projected capacitance also scales linearly, as do the X, Y and Z-direction resolutions. Devices can be constructed to sense at much larger or smaller scales than millimeter levels, subject to limitations of fabrication methods, and instrumentation considerations. MEMS devices sense very low capacitances, suggesting that operation with micrometer resolution is possible if desired.

Figure 4:
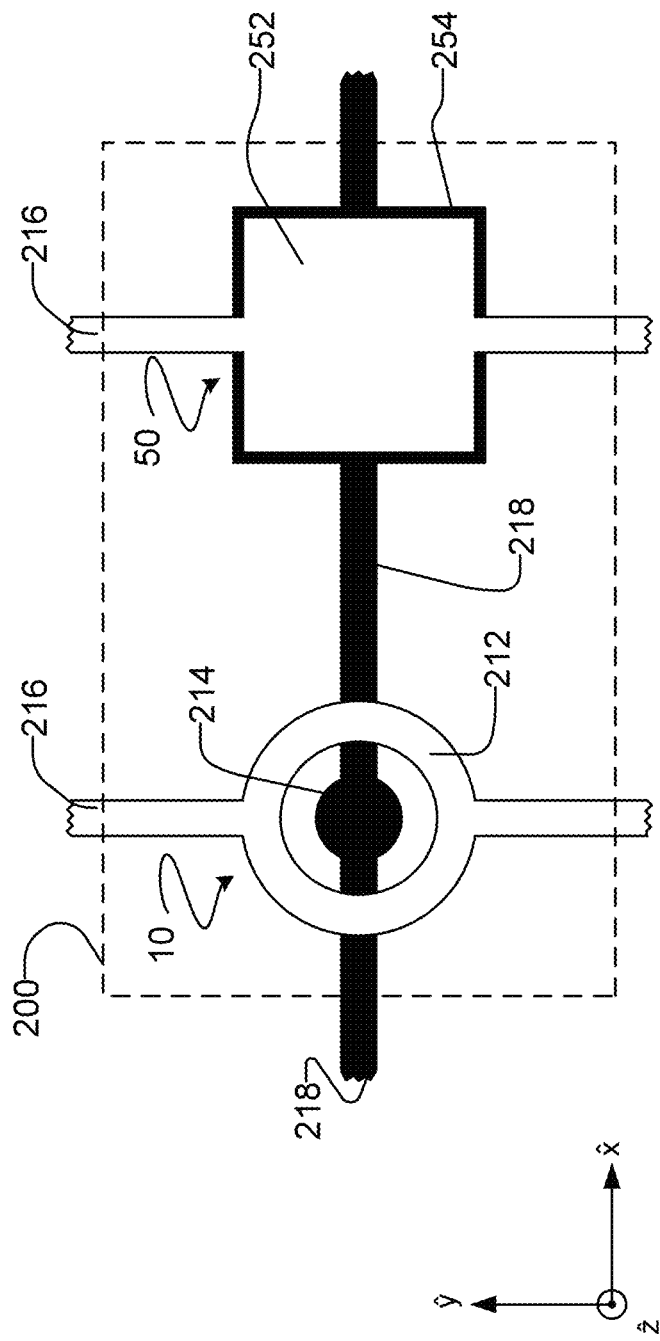
FIG. 4 depicts a schematic plan view of a sensor according to one embodiment of the invention.

FIG. 4 depicts one embodiment of a cluster sensor 200 according to one aspect of the invention. Cluster sensor 200 comprises a fringe sensor 10 and an overlap sensor 50. Cluster sensor 200 is similar in many respects to cluster sensor 100 describe herein. Fringe sensor 10 and overlap sensor 50 of cluster sensor 200 are described in more detail as follows.

FIGS. 5, 6A and 6B depict one embodiment of a fringe sensor 10 of the type used in the FIG. 4 cluster sensor 200. Fringe sensor 10 has a fringe capacitance, $C_{fringe}$. Fringe sensor 10 comprises a first fringe electrode 12 and a second fringe electrode 14. First fringe electrode 12 extends in the X direction and the Y direction. Second fringe electrode 14 also extends in the X direction and the Y direction. The first and second fringe electrodes are spaced apart in the Z direction by a Z direction spacing 26, as depicted in FIG. 6A.

As best seen from FIG. 5, first fringe electrode 12 of the illustrated embodiment has a generally annular XY-plane cross-sectional shape. As will be discussed below, this shape is not mandatory. Annulus 12A of first fringe electrode 12 defines a void 12B (also referred to as a cut-out 12B) within annulus 12A. Annulus 12A of the illustrated embodiment has an outer diameter, $d_{1,outer}$, and an inner diameter, $d_{1,inner}$. Second fringe electrode 14 has a generally circular XY-plane cross-sectional shape. Disc 14A of second fringe electrode 14 has an outer diameter, $d_{2,outer}$. In some embodiments, the outer diameter, $d_{2,outer}$ of second fringe electrode 14 is less than the inner diameter $d_{1,inner}$ of first fringe electrode 12, such as is depicted in FIG. 5. This is not necessary. In some embodiments $d_{1,inner}$ is equal to $d_{2,outer}$. Although spaced apart in the Z direction, annulus 12A and circle 14A may be concentric (i.e. a Z direction oriented line may pass through an XY-plane center of annulus 12A and an XY-plane center of circle 14A). This is not mandatory. In some embodiments, the XY-plane cross-sectional shapes of first and second fringe electrodes 12, 14 need not be circularly symmetric and may have other XY-plane cross-sectional shapes. For example, in some embodiments, the XY-plane cross-sectional shape of first fringe electrode 12 may comprise a rectangular annular shape (i.e. an annular shape having rectangular edges in the place of circular edges), an elliptical annular shape (i.e. an annular shape having elliptical edges in the place of circular edges), a polygonal annular shape (i.e. an annular shape having polygonal edges in the place of circular edges) and/or the like. Similarly, in some embodiments, the XY-plane cross-sectional shape of second fringe electrode 14 may be rectangular, elliptical, polygonal and/or the like. Further, it is not necessary that the shape of second fringe electrode 14 match the shape of first fringe electrode 12. For example, first fringe electrode 12 may have a rectangular annular shape in XY-plane cross-section and second fringe electrode 14 may have a circular shape in XY-plane cross-section.

As can be seen in FIG. 6A, first fringe electrode 12 comprises a first distal fringe surface 12C and a first proximate fringe surface 12D. In the illustrated view of FIG. 6A, first proximate fringe surface 12D faces in the negative-Z direction (i.e. generally towards second fringe electrode 14) while first distal fringe surface 12C faces in the positive-Z direction (i.e. generally away from second fringe electrode 14). Similarly, second fringe electrode 14 comprises a second distal fringe surface 14B and a second proximate fringe surface 14C. Second proximate fringe surface 14C faces in the positive-Z direction (i.e. generally towards first fringe electrode 12) while second distal fringe surface 14B faces in the negative-Z direction (i.e. generally away from first fringe electrode 12).

First fringe electrode 12 may be spaced apart from second fringe electrode 14 by a dielectric 13. Dielectric 13 may contact both of first proximate fringe surface 12D and second proximate fringe surface 14C and may occupy the volume therebetween. Dielectric 13 may be similar to and have any of the characteristics of dielectric 113 described herein. In some embodiments, dielectric 13 surrounds first and second fringe electrodes 12, 14, as is discussed further herein.

A circuit may be connected to first and second fringe traces 16, 18 (FIG. 5), such that a voltage may be applied across first and second fringe electrodes 12, 14 to produce a fringe sensor electric field, $\vec{E}_{fringe}$, in the vicinity of fringe sensor 10. FIG. 6B depicts fringe field lines 20 representative of the shape of fringe electric field, $\vec{E}_{fringe}$. One skilled in the art would understand that fringe field lines 20 are not drawn to scale and do not represent the entirety of the fringe sensor electric field, $\vec{E}_{fringe}$, but instead are merely provided to illustrate concepts discussed herein.

The electric field $\vec{E}_{fringe}$ associated with any fringe voltage applied between first and second fringe electrodes 12, 14 comprises a flux characteristic referred to herein as the distal fringe flux, $\Phi_{distal,fringe}$ which comprises the flux of the fringe electric field $\vec{E}_{fringe}$ into (or out of depending on polarity) first distal fringe surface 12C and/or into (or out of) a notional plane spaced infinitesimally apart from first distal fringe surface 12C in a direction away from second fringe electrode 14 (e.g. spaced infinitesimally apart from first distal fringe surface 12C in a positive Z direction). The electric field $\vec{E}_{fringe}$ associated with any fringe voltage applied between first and second fringe electrodes 12, 14 also comprises a flux characteristic referred to herein as the proximate fringe flux, $\Phi_{prox,fringe}$ which comprises the flux of the fringe electric field $\vec{E}_{fringe}$ into (or out of depending on polarity) first proximate fringe surface 12D and/or a notional plane spaced infinitesimally apart from first proximate fringe surface 12D in a direction toward second fringe electrode 14 (e.g. spaced infinitesimally apart from first proximate fringe surface 12D in a negative Z direction).

Like fringe sensor 110 described above, the electric field, $\vec{E}_{fringe}$ of fringe sensor 10, can be characterized by a fringe sensor flux ratio ("FSFR") defined by:

$$FSFR = \frac{\Phi_{distal,fringe}}{\Phi_{prox,fringe}}$$

As the FSFR increases, the sensitivity of fringe sensor 10 to the proximity of pointing element 5 (as opposed to pressure on fringe sensor 10 applied by pointing element 5) increases. Consequently, there is desire for the electrodes 12, 14 of fringe sensor 10 to be shaped to provide relatively high FSFR and, in particular, to provide a FSFR that is greater than the OSFR of overlap sensor 50 (FIG. 4) of cluster sensor 200.

Figure 7:
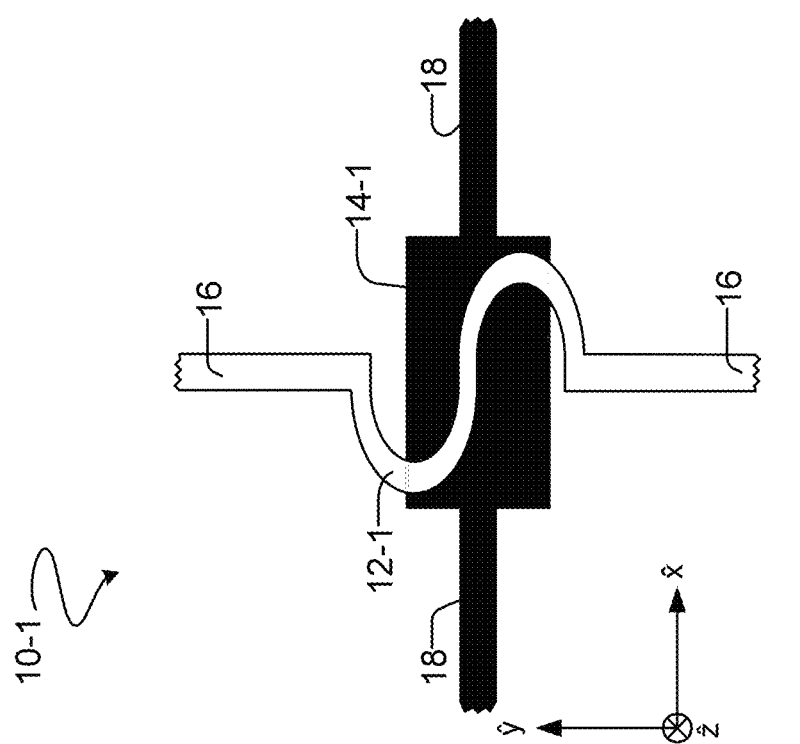
FIG. 7 depicts a schematic plan view of a sensor according to one embodiment of the invention.

First and second fringe electrodes 12, 14 may have other shapes while still achieving a desired (e.g. sufficiently high) FSFR of fringe sensor 10. FIG. 7 depicts a fringe sensor 10-1 having a first fringe electrode 12-1 that has an XY-plane cross-section that is "S" shaped. The "S" shape of first fringe electrode 12-1 increases the length of the edges (as compared to a square, rectangular or circular electrode) without overly increasing the overlap in the Z direction with second fringe electrode 14-1. As would be understandable to one of skill in the art, fringe electrodes 12, 14 may be provided with various other shapes to achieve a desired FSFR and the description herein should not be interpreted as being limited to either of the FIGS. 5 and 7 embodiments. For example, the "S" shape of FIG. 7 could be modified to include more or fewer curves than as depicted.

Figure 8F:
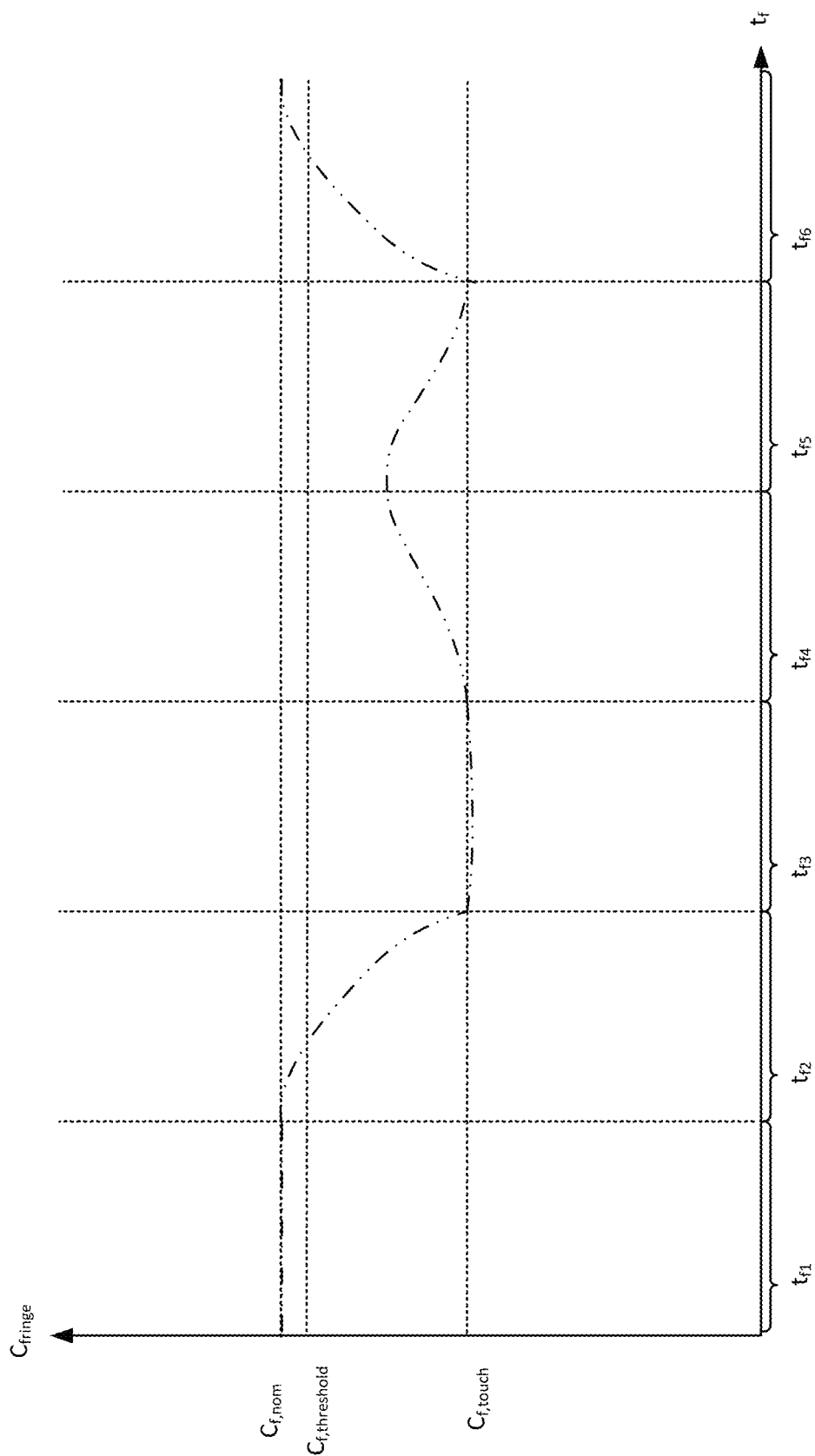
FIGS. 8F and 8L depict graphs of capacitance as a function of time for sensor interacting with a pointing element according to FIGS. 8A to 8E and 8G to 8K.

FIG. 8A represents fringe sensor 10 when pointing element 5 is not proximate to cluster sensor unit 200 and $C_{fringe}$ is within a threshold range of $C_{f,nom}$. Other than minor fluctuations in $C_{fringe}$ due to interference, error or the like, $C_{fringe}$ remains substantially constant within a threshold range around $C_{f,nom}$ and does not fall below $C_{f,threshold}$. $C_{f,threshold}$ may be any suitable threshold. For example, in some embodiments, $C_{f,threshold}$ may be 3%, 2% or 1% lower than $C_{f,nom}$. The FIG. 8A Scenario is represented by time, $t_{f1}$, in FIG. 8F.

FIG. 8B represents fringe sensor 10 as pointing element 5 approaches cluster sensor unit 200. The FIG. 8B Scenario is represented by time, $t_{f2}$, in FIG. 8F. As can be seen in FIG. 8F, $C_{fringe}$ decreases as pointing element 5 approaches fringe sensor 10. The decrease in $C_{fringe}$ occurs since pointing element 5 acts as a third electrode, which capacitively couples to fringe sensor 10, reducing the coupling between first and second fringe electrodes 12, 14. In particular, the portion of the electric field that previously emanated from distal fringe surface 12C and entered second fringe electrode 14 is decreased since at least some of this electric field emanating from distal fringe surface 12C enters pointing element 5 when pointing element 5 couples with fringe sensor 10. The coupling between first fringe electrode 12 and pointing element 5 is represented by field lines 20' emanating from distal fringe surface 12C and leading to pointing element 5. As pointing element 5 approaches cluster sensor unit 200, some of the electric field from (or into depending on polarity) first distal fringe surface 12C of first electrode 12 terminates (or starts depending on polarity) in pointing element 5, rather than second electrode 14. As discussed above, fringe sensor 10 preferably has a high FSFR and correspondingly high distal flux ($\Phi_{distal,fringe}$), which makes fringe sensor 10 particularly sensitive to this effect caused by the proximity of pointing element 5. In particular, the capacitance $C_{fringe}$ of fringe sensor 10 may be relatively more sensitive than the capacitance $C_{overlap}$ of its corresponding overlap sensor 50 to this effect caused by the proximity of pointing element 5 to cluster sensor 200.

In some embodiments, as pointing element 5 approaches (but does not touch) cluster sensor unit 200, the capacitance, $C_{fringe}$, may be reduced to a range between 3-10% of $C_{f,nom}$. In exemplary embodiments, the capacitance, $C_{fringe}$, is reduced by 5-7% of $C_{f,dm}$ as pointing element 5 approaches (but does not touch) fringe sensor 10. Notably, as pointing element 5 approaches closer to overlap sensor 50, $C_{fringe}$ may tend to decrease at an increasing rate. Accordingly, by measuring the capacitance, $C_{fringe}$, of fringe sensor 10, a suitably configured processor (see processor 385 of FIG. 3) could determine that pointing element 5 is approaching fringe sensor 10 by monitoring for a reduction of $C_{fringe}$ from $C_{f,nom}$ by an amount greater than $C_{f,threshold}$.

FIG. 8C represents fringe sensor 10 as pointing element 5 touches cluster sensor unit 200 without applying any pressure or force on cluster sensor unit 200. The FIG. 8C Scenario is represented by time, $t_{f3}$, in FIG. 8F. As can be seen in FIG. 8F, in the FIG. 8C Scenario, $C_{fringe}$ is further reduced to below a contact threshold $C_{f,touch}$. Again, this reduction is due to pointing element 5 acting as a third electrode, which capacitively couples to fringe sensor 10, thereby reducing the coupling) between first and second fringe electrodes 12, 14. In particular, the portion of the electric field that previously emanated from distal fringe surface 12C and entered second fringe electrode 14 is decreased since at least some of this electric field emanating from distal fringe surface 12C enters pointing element 5 when pointing element 5 couples with fringe sensor 10.

The difference between the reaction of the capacitance $C_{fringe}$ to the Scenario of FIG. 8B and the Scenario of FIG. 8C may be a difference of degree and may involve configurable thresholds $C_{f,threshold}$ and $C_{f,touch}$. $C_{f,touch}$ may represent a further reduction of $C_{fringe}$ as compared to the reduction of $C_{fringe}$ during time, $t_{f2}$. In some embodiments, $C_{f,touch}$ represents a reduction of an additional 5 to 10% of $C_{f,nom}$ (e.g. $C_{f,touch}$ is 10% to 20% lower than $C_{f,nom}$). Accordingly, it may be possible to determine if pointing element 5 is touching fringe sensor 10 by monitoring for a reduction of $C_{fringe}$ to $C_{f,touch}$. In some embodiments, $C_{f,touch}$ may be 10% lower than $C_{f,nom}$. In other embodiments, $C_{f,touch}$ may be 15% lower than $C_{nominal}$. In further embodiments still, $C_{f,touch}$ may be 20% lower than $C_{f,nom}$. $C_{f,touch}$ may be determined experimentally by measuring $C_{fringe}$ when pointing element 5 first touches fringe sensor 10.

FIG. 8D represents fringe sensor 10 as pointing element 5 is in contact with and applies increasing pressure or contact force to cluster sensor unit 200. In FIG. 8D, first fringe electrode 12 is spaced apart in the Z direction from second fringe electrode 14 by a spacing 26'. Because fringe sensor 10 is deformable and fabricated from deformable materials, spacing 26' is less than spacing 26 (FIG. 6A). In other words, by applying contact force to fringe sensor 10, pointing element 5 causes first and second fringe electrodes 12, 14 to be closer to one another. The FIG. 8D Scenario is represented by time, $t_{f4}$, in FIG. 8F. As can be seen from FIG. 8F, $C_{fringe}$ increases as the amount of contact force on fringe sensor 10 increases. This increase in $C_{fringe}$ can be attributed to a reduction in spacing 26 to spacing 26' since capacitance is inversely proportional to this spacing.

As the contact force applied by pointing element 5 is reduced, spacing 26' grows and begins to approach spacing 26. This Scenario is represented in FIG. 8F by time, $t_{f5}$. As can be seen from FIG. 8F, $C_{fringe}$ decreases as the amount of contact force on fringe sensor 10 decreases. This decrease in $C_{fringe}$ can be attributed to an increase in the distance between first and second fringe electrodes 12, 14, since capacitance is inversely proportional to this spacing.

FIG. 8E represents fringe sensor 10 as pointing element 5 is retracted from cluster sensor unit 200. The FIG. 8E Scenario is represented by time, $t_{f6}$, in FIG. 8F. As can be seen in FIG. 8F, $C_{fringe}$ may increase to a level above $C_{f,touch}$ as pointing element 5 is retracted. This increase in capacitance to a level above $C_{f,touch}$ may be due to a reduction in the coupling between pointing element 5 and fringe sensor 10, thereby allowing the coupling between first and second fringe electrodes 12, 14 to increase. In particular, the portion of the electric field that previously emanated from distal fringe surface 12C and entered second fringe electrode 14 is increased since less of the electric field emanating from distal fringe surface 12C enters pointing element 5 when coupling between fringe sensor 10 and pointing element 5 is reduced. If pointing element 5 is removed from the vicinity of fringe sensor 10 altogether, $C_{fringe}$ may return to $C_{f,nom}$, as represented by the end of time, $t_{f6}$, in FIG. 8F. Absent some other indicator (e.g. historical data, information from some other sensor and/or the like), it may be challenging to use the capacitance $C_{fringe}$ of fringe sensor 10 alone to reliably discriminate between the Scenarios of FIGS. 8D and 8E. However, as discussed above, the Scenario of FIGS. 8D and 8E can be discriminated using the capacitance $C_{overlap}$ of overlap sensor 50 see below discussion of FIGS. 11J and 11K, which describe the response of the capacitance $C_{overlap}$ of overlap sensor 50 in similar Scenarios to those of FIGS. 8D and 8E.

FIG. 8G represents when cluster sensor unit 200 is being stretched in the X and/or Y direction (stretched fringe sensor 10 may be referred to herein as fringe sensor 10'). With such stretching, the surface areas of the distal and proximate surfaces of the fringe electrodes increase. For example, in the case of the illustrated embodiment of FIGS. 5, 6A and 6B, the outer diameter of, $d_{1,outer}'$, of first fringe electrode 12' and the outer diameter, $d_{2,outer}'$, of second fringe electrode 14' are greater than the outer diameter of, $d_{1,outer}$, of first fringe electrode 12 and the outer diameter, $d_{2,outer}$, of second fringe electrode 14. The FIG. 8G Scenario is represented by time, $t_{f7}$, in FIG. 8L. As can be seen from FIG. 8L, as fringe sensor 10' is stretched, $C_{fringe}$ remains substantially constant at or near $C_{f,nom}$ or may increase slightly to $C_{f,stretched}$ (e.g. $C_{f,stretched}$ may represent a change of less than 3% of $C_{fringe}$ in some embodiments, although the percentage change may depend on additional factors such as the elasticity of first and second fringe electrodes 12, 14). In some embodiments, $C_{fringe}$ may remain substantially constant at or near $C_{f,nom}$ since first fringe electrode 12 does not overlap (or has negligible overlap) with second fringe electrode 14 in the Z direction. In some embodiments, stretching of fringe sensor 10 may increase the Z direction overlap between first fringe electrode 12 and second fringe electrode 14, thereby causing a small increase in $C_{fringe}$ to $C_{f,stretched}$. In some embodiments, the Z direction spacing between first fringe electrode 12 and second fringe electrode 14 may decrease, thereby causing a small increase in $C_{fringe}$ to $C_{f,stretched}$.

FIG. 8H represents stretched fringe sensor 10' as pointing element 5 begins to approach cluster sensor unit 200. The FIG. 8H Scenario is represented by time, $t_{f8}$, in FIG. 8L. As can be seen from FIG. 8L, $C_{fringe}$ decreases as pointing element 5 approaches fringe sensor 10'. In particular, $C_{fringe}$ decreases outside of a threshold range around the nominal fringe capacitance, $C_{f,nom}$ (i.e. decreases below $C_{f,threshold}$). As discussed above in connection with FIG. 8B, this decrease in $C_{fringe}$ occurs since pointing element 5 acts as a third electrode, which capacitively couples to fringe sensor 10', reducing the coupling between first and second fringe electrodes 12', 14'. In particular, the portion of the electric field that previously emanated from distal fringe surface 12C' and entered second fringe electrode 14 is decreased since at least some of this electric field emanating from distal fringe surface 12C' enters pointing element 5 when pointing element 5 couples with fringe sensor 10'. The coupling between first fringe electrode 12' and point element 5 is represented by field lines 20'' emanating from distal fringe surface 12C' and leading to pointing element 5. As pointing element 5 approaches stretched cluster sensor unit 200, some of the electric field emanating from (or into depending on polarity) first distal fringe surface 12C of first electrode 12' terminates (or starts depending on polarity) in pointing element 5, rather than second electrode 14'. As discussed above, fringe sensor 10 preferably has a high FSFR and correspondingly high distal flux ($\Phi_{distal,fringe}$), which makes fringe sensor 10 particularly sensitive to this effect caused by the proximity of pointing element 5. In particular, the capacitance $C_{fringe}$ of fringe sensor 10 may be relatively more sensitive than the capacitance $C_{overlap}$ of its corresponding overlap sensor 50 to this effect caused by the proximity of pointing element 5 to cluster sensor 200.

Figure 8L:
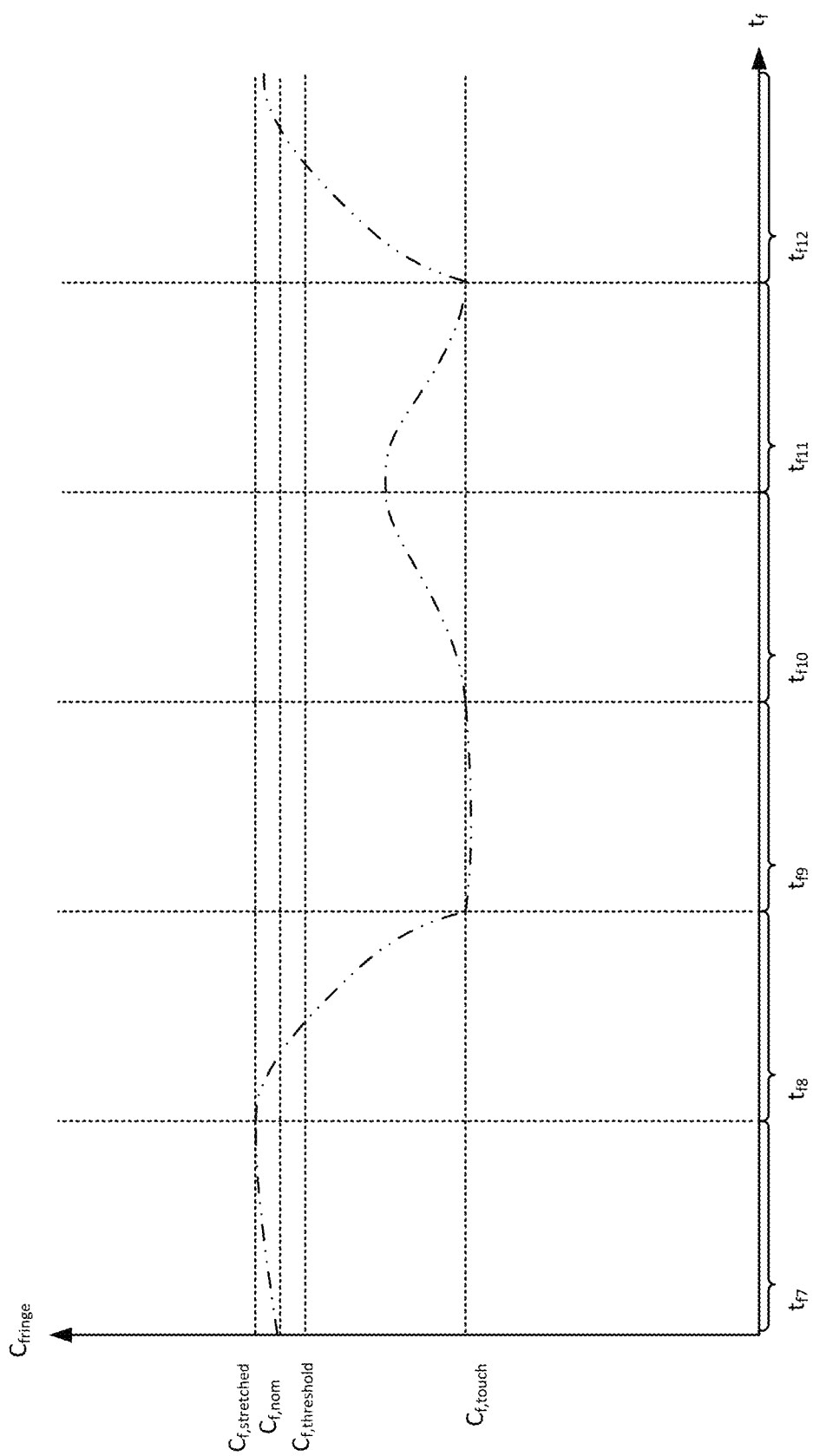

FIG. 8I represents stretched fringe sensor 10' as pointing element 5 touches stretched cluster sensor unit 200 without applying contact force on fringe sensor 10'. The FIG. 8I Scenario is represented by time, $t_{f9}$, in FIG. 8L. As can be seen in FIG. 8L, $C_{fringe}$ reaches $C_{f,touch}$. Again, this reduction is due to pointing element 5 acting as a third electrode, which capacitively couples to fringe sensor 10', thereby reducing the coupling between first and second fringe electrodes 12', 14'. In particular, the portion of the electric field that previously emanated from distal fringe surface 12C' and entered second fringe electrode 14 is decreased since at least some of this electric field emanating from distal fringe surface 12C' enters pointing element 5 when pointing element 5 couples with fringe sensor 10'. The difference between the reaction of the capacitance $C_{fringe}$ to the Scenario of FIG. 8H and the Scenario of FIG. 8I may be a difference of degree and may involve configurable thresholds $C_{f,threshold}$ and $C_{f,touch}$.

FIG. 8J represents stretched fringe sensor 10' as pointing element 5 applies contact force to stretched cluster sensor unit 200. In FIG. 8J, first fringe electrode 12' is spaced apart in the Z direction from second fringe electrode 14' by a spacing 26'. Because fringe sensor 10 is deformable and fabricated from deformable materials, spacing 26' is less than spacing 26. In other words, by applying contact forces to stretched fringe sensor 10', pointing element 5 causes first and second fringe electrodes 12', 14' to be closer to one another. The FIG. 8J Scenario is represented by time, $t_{f9}$, in FIG. 8F. As can be seen from FIG. 8F, $C_{fringe}$ increases as the amount of contact on fringe sensor 10 increases. This increase in $C_{fringe}$ can be attributed to a reduction in the distance between first and second fringe electrodes 12', 14', since capacitance is inversely proportional to this spacing.

As the contact force applied by pointing element 5 is reduced, spacing 26' grows and begins to approach spacing 26. This Scenario is represented in FIG. 8F as time, $t_{f,11}$. As can be seen from FIG. 8F, $C_{fringe}$ decreases as the amount of contact force on fringe sensor 10' decreases. This decrease in $C_{fringe}$ can be attributed to an increase in the distance between first and second fringe electrodes 12, 14, since capacitance is inversely proportional to this spacing.

FIG. 8K represents stretched fringe sensor 10' as pointing element 5 is retracted from stretched cluster sensor unit 200. The FIG. 8K Scenario is represented by time, $t_{f12}$) in FIG. 8L. As can be seen in FIG. 8L, $C_{fringe}$ may increase as pointing element 5 is retracted. This increase in capacitance may be due to a reduction in the coupling between pointing element 5 and stretched fringe sensor 10', thereby allowing the coupling between first and second fringe electrodes 12', 14' to increase. In particular, the portion of the electric field that previously emanated from distal fringe surface 12C' and entered second fringe electrode 14 is increased since less of the electric field emanating from distal fringe surface 12C' enters pointing element 5 when coupling between fringe sensor 10' and pointing element 5 is reduced. If pointing element is removed from the vicinity of fringe sensor 10' altogether, $C_{fringe}$ may return to $C_{f,stretched}$, as represented by the end of time, $t_{f12}$, in FIG. 8L.

FIGS. 9, 10A and 10B depict one exemplary embodiment of an overlap sensor 50 suitable for use with the FIG. 4 cluster sensor unit 200. Overlap sensor 50 has an overlap capacitance, $C_{overlap}$. Overlap sensor 50 comprises a first overlap electrode 52 and a second overlap electrode 54. First overlap electrode 52 extends in the X direction and the Y direction. Second overlap electrode 54 also extends in the X direction and the Y direction. First and second electrodes 32, 54 planes are spaced apart in the Z direction by a Z direction spacing 66, as depicted in FIG. 10A.

As best seen from FIG. 9, first overlap electrode 52 of the illustrated embodiment has an XY-plane cross-sectional shape like a rectangle (or more particularly, a square) having an X direction dimension $X_1$ and a Y direction dimension $Y_1$. $X_1$ may be equal to $Y_1$, although this is not required. Similarly, second overlap electrode 54 has an XY-plane cross-sectional shape like a rectangle (or more particularly, a square) having an X direction dimension $X_2$ and a Y direction dimension $Y_2$. $X_2$ may be equal to $Y_2$, although this is not required. In some embodiments, $X_1$ is equal to $X_2$ and $Y_1$ is equal to $Y_2$. To facilitate showing of second overlap electrode 54, FIGS. 3, 4 and 9 have been drawn such that $X_2$ is greater than $X_1$ and $Y_2$ is greater than $Y_1$. Although spaced apart in the Z direction, first overlap electrode 52 and second overlap electrode 54 may be concentric (i.e. a Z direction line may pass through an XY-plane center of first overlap electrode 52 and an XY-plane center of second overlap electrode 54). This is not mandatory. In some embodiments, the XY-plane cross-sectional shapes of first and second overlap electrodes 52, 54 need not be rectangular or square and may have other XY-plane cross-sectional shapes. For example, in some embodiments, the XY-plane cross-sectional shapes of first and second overlap electrodes 52, 54 may comprise a circular shape, an elliptical shape, a polygonal shape and/or the like. Further, it is not necessary that the shape of second overlap electrode 54 match the shape of first overlap electrode 52. For example, first overlap electrode 52 may have a rectangular shape in XY-plane cross-section and second overlap electrode 54 may have a circular shape in XY-plane cross-section.

As can be seen in FIGS. 10A and 10B, first overlap electrode 52 comprises a first distal overlap surface 52A and a first proximate overlap surface 52B. In the illustrated view of FIG. 10A, first proximate overlap surface 52B faces in the negative-Z direction (i.e. generally towards second overlap electrode 54) while first distal overlap surface 52A faces in the positive-Z direction (i.e. generally away from second overlap electrode 54). Similarly, second overlap electrode 14 comprises a second distal overlap surface 54B and a second proximate overlap surface 54A. Second proximate overlap surface 54A faces in the positive-Z direction (i.e. generally towards first overlap electrode 52) while second distal overlap surface 54B faces in the negative-Z direction (i.e. generally away from first overlap electrode 52).

First overlap electrode 52 may be spaced apart from second overlap electrode 54 by a dielectric 53. Dielectric 53 may contact both of first proximate overlap surface 52A and second proximate overlap surface 54A and may occupy the volume therebetween. Dielectric 53 may be similar to and have any of the characteristics of dielectric 113 described herein. In some embodiments, dielectric 53 surrounds first and second overlap electrodes 52, 54, as will be discussed further herein.

A circuit may be connected to first and second overlap traces 56, 58 (FIG. 9), such that a voltage may be applied across first and second overlap electrodes 52, 54 to produce an overlap sensor electric field, $\vec{E}_{overlap}$, in the vicinity of overlap sensor 50. FIG. 6B depicts some overlap field lines 60 representative of the direction of overlap electric field, $\vec{E}_{overlap}$ One skilled in the art would understand that overlap field lines 60 are not drawn to scale and do not represent the entirety of the overlap sensor electric field, $\vec{E}_{overlap}$, but instead are merely provided to illustrate concepts that are described herein.

The electric field $\vec{E}_{overlap}$ associated with any overlap voltage applied between first and second overlap electrodes 52, 54 comprises a flux characteristic referred to herein as the distal overlap flux, $\Phi_{distal,overlap}$ which comprises the flux of the overlap electric field $\vec{E}_{overlap}$ into (or out of depending on polarity) first distal overlap surface 52A and/or into (or out of) a notional plane spaced infinitesimally apart from first distal overlap surface 52A in a direction away from second overlap electrode 54 (e.g. spaced infinitesimally apart from first distal overlap surface 52A in a positive Z direction). The electric field $\vec{E}_{overlap}$ associated with any overlap voltage applied between first and second overlap electrodes 52, 54 also comprises a flux characteristic referred to herein as the proximate overlap flux, $\Phi_{prox,overlap}$ which comprises the flux of the overlap electric field $\vec{E}_{overlap}$ into (or out of depending on polarity) first proximate overlap surface 52B and/or a notional plane spaced infinitesimally apart from first proximate overlap surface 52B in a direction toward second overlap electrode 54 (e.g. spaced infinitesimally apart from first proximate overlap surface 52B in a negative Z direction).

Like overlap sensor 150 described above, the electric field, $\vec{E}_{overlap}$ of overlap sensor 50, can be characterized by an overlap sensor flux ratio ("OSFR"). The overlap sensor flux ratio may be defined by:

$$OSFR = \frac{\Phi_{distal,overlap}}{\Phi_{prox,overlap}}$$

As the OSFR decreases, the sensitivity of overlap sensor 50 to touching/pressure applied by pointing element 5 (as opposed to proximity of pointing element to overlap sensor 50 without touching) increases. Consequently, there is desire for the electrodes 52, 54 of overlap sensor 50 to be shaped to provide relatively low OSFR and, in particular, to provide a OSFR that is less than the FSFR of fringe sensor 10 (FIG. 4) of cluster sensor 200.

Figure 11F:
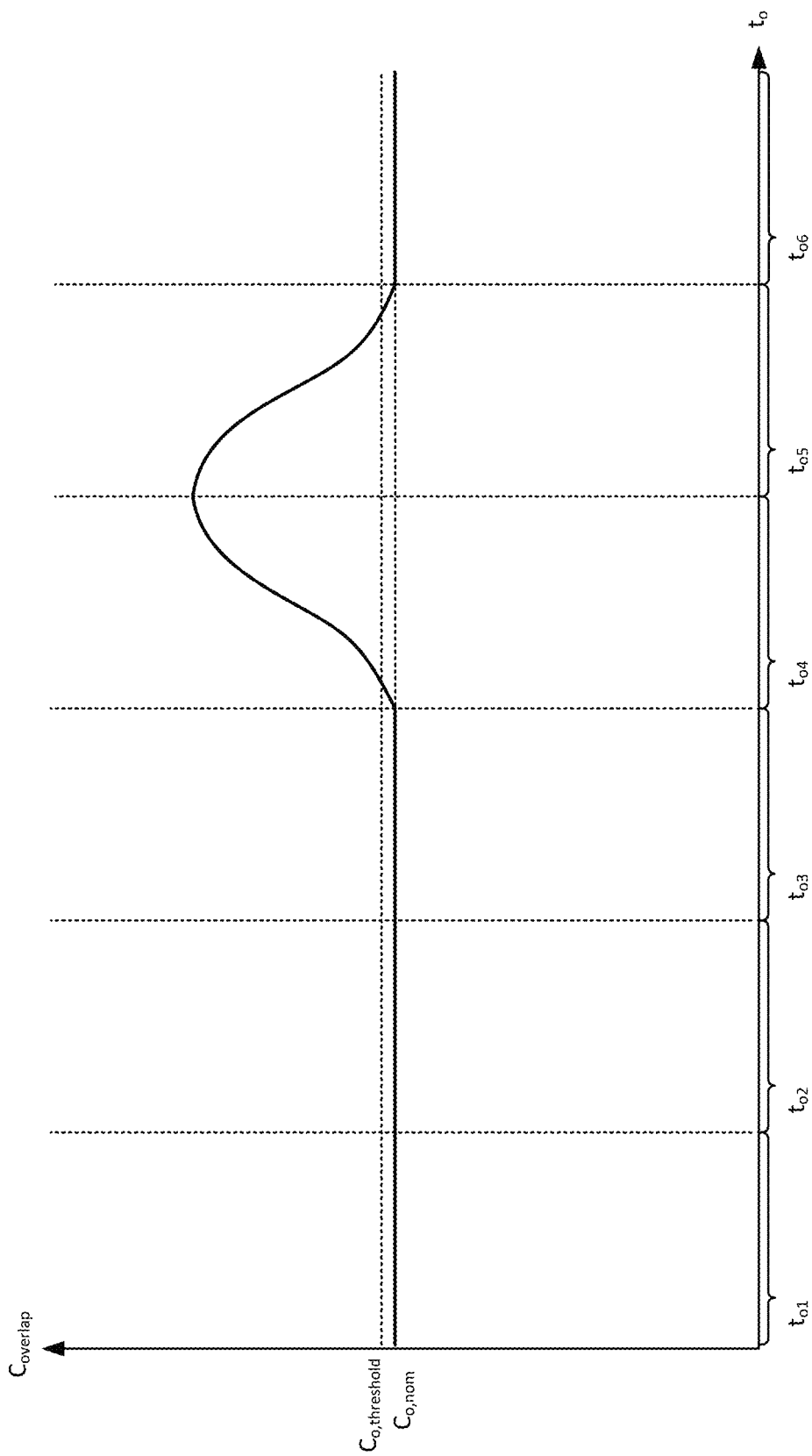
FIGS. 11F and 11L depict graphs of capacitance as a function of time for sensor interacting with a pointing element according to FIGS. 11A to 11E and 11G to 11K.

FIG. 11A represents overlap sensor 50 when pointing element 5 is not proximate to cluster sensor unit 200 and $C_{overlap}$ is within a threshold range of $C_{o,nom}$. Other than minor fluctuations in $C_{overlap}$ due to interference, error or the like, $C_{overlap}$ remains substantially constant within a threshold range around $C_{o,nom}$ during steady state. During the FIG. 11A Scenario, $C_{overlap}$ does not increase above $C_{o,threshold}$. $C_{o,threshold}$ may be any suitable threshold. For example, in some embodiments, $C_{o,threshold}$ may be 3%, 2% or 1% lower than $C_{o,nom}$. The FIG. 11A Scenario is represented by time, $t_{o1}$, in FIG. 11F.

FIG. 11B represents overlap sensor 50 as pointing element 5 begins to approach cluster sensor unit 200. The FIG. 11B Scenario is represented by time, $t_{o2}$, in FIG. 11F. As can be seen in FIG. 11F, $C_{overlap}$ does not vary above $C_{o,threshold}$ during $t_{o2}$. Unlike $C_{fringe}$ discussed above, $C_{overlap}$ remains relatively constant as pointing element 5 approaches overlap sensor 50, since overlap sensor 50 has a relatively low OSFR. In particular, overlap sensor 50 has relatively low distal flux ($\Phi_{distal,overlap}$) as compared to its proximate flux ($\Phi_{prox,overlap}$) While some of the electric field of overlap sensor 50 may be diverted from overlap capacitor 50 by the presence of pointing element 5 (e.g. overlap sensor couples to pointing element 5), the proportion of distal flux ($\Phi_{distal,overlap}$) as compared to proximate flux ($\Phi_{prox,overlap}$), of overlap sensor 50 is so small that the overall capacitance $C_{overlap}$ of overlap sensor 50 is relatively unaffected by the proximity of pointing element 5.

FIG. 11C represents overlap sensor 50 as pointing element 5 touches cluster sensor unit 200 without applying any pressure or force on cluster sensor unit 200. The FIG. 11C Scenario is represented by time, $t_{o3}$, in FIG. 11F. As can be seen in FIG. 11F, $C_{overlap}$ does not vary more than a threshold amount from $C_{o,nom}$ during the FIG. 11C Scenario, and in particular does not rise above $C_{o,threshold}$ during the FIG. 11C Scenario. $C_{overlap}$ remains relatively constant as pointing element 5 touches cluster sensor 200 (without applying any contact force thereon), since overlap sensor 50 has a relatively low OSFR and, consequently, is relatively unaffected by the proximity and even zero force contact of pointing element 5, as discussed above. In practice, $t_{o3}$ would be a relatively short time period, since it is not practical to touch something without applying any contact force on it. Absent some other indicator (e.g. historical data, information from some other sensor and/or the like), it may be challenging to use the capacitance $C_{overlap}$ of overlap sensor 50 alone to reliably discriminate between the Scenarios of FIGS. 11A, 11B and 11C. However, as discussed above, the Scenario of FIGS. 11A, 11B and 11C can be discriminated using the capacitance $C_{fringe}$ of fringe sensor 10—see above discussion of FIGS. 8A, 8B and 8C, which describe the response of the capacitance $C_{fringe}$ of fringe sensor 10 in similar Scenarios to those of FIGS. 11A, 11B, 11C.

FIG. 11D represents overlap sensor 50 as pointing element 5 is in contact with and applies increasing pressure or contact force to cluster sensor unit 200 in the negative Z direction. In FIG. 11D, first overlap electrode 52 is spaced apart in the Z direction from second overlap electrode 54 by a spacing 66'. Because overlap sensor 50 is deformable and fabricated from deformable materials, spacing 66' is less than spacing 66 (see FIG. 10A). In other words, by applying contact force to overlap sensor 50, pointing element 5 causes first and second overlap electrodes 52, 54 to be closer to one another. The FIG. 11D Scenario is represented by time, $t_{o4}$, in FIG. 11F. As can be seen from FIG. 11F, $C_{overlap}$ increases as the amount of contact force on overlap sensor 50 increases. This increase in $C_{overlap}$ can be attributed to a reduction in the distance between first and second overlap electrodes 52, 54, since capacitance is inversely proportional to this spacing. Accordingly, by measuring the capacitance, $C_{overlap}$, of overlap sensor 50, a suitably configured processor (see processor 385 of FIG. 3) could detect contact force being applied to overlap sensor 50 by pointing element 5 by monitoring for an increase of $C_{overlap}$ from $C_{o,nom}$ by an amount greater than $C_{o,threshold}$. Such a processor could also detect increasing contact force being applied to overlap sensor 50 by pointing element 5 by observing increasing overlap capacitance $C_{overlap}$.

As the contact force applied by pointing element 5 in the negative Z direction is reduced, spacing 66' grows and begins to approach spacing 66. This Scenario is represented by time, $t_{o5}$, in FIG. 11F. As can be seen from FIG. 11F, $C_{overlap}$ decreases as the amount of contact force on overlap sensor 50 decreases. This decrease in $C_{overlap}$ can be attributed to an increase in the distance between first and second contact electrodes 52, 54, since capacitance is inversely proportional to this spacing. Accordingly, by measuring the capacitance, $C_{overlap}$, of overlap sensor 50, a suitably configured processor (see processor 385 of FIG. 3) could detect a decrease in contact force on overlap sensor 50 by pointing element 5.

At the conclusion of $t_{o5}$ in the illustrated example Scenarios of FIG. 11F, pointing element 5 again returns to the situation where pointing element 5 is in contact with cluster sensor unit 200, but is not applying contact force to cluster sensor unit 200. This circumstance is similar to the circumstance during $t_{o3}$. In particular, $C_{overlap}$ may fall below $C_{o,threshold}$. When the contact force applied by pointing element 5 becomes zero, $C_{overlap}$ returns to within a threshold vicinity of $C_{o,nom}$.

FIG. 11E represents overlap sensor 50 as pointing element 5 is retracted (moves away) from cluster sensor unit 200. The FIG. 11E Scenario is represented by time, $t_{o6}$, in FIG. 11F. As can be seen in FIG. 11F, $C_{overlap}$ remains within a threshold vicinity of $C_{o,nom}$ during $t_{o6}$. $C_{overlap}$ remains relatively constant as pointing element 5 moves away from overlap sensor 50, since overlap sensor 50 has a relatively low OSFR. In particular, overlap sensor 50 has relatively low distal flux ($\Phi_{distal,overlap}$) as compared to its proximate flux ($\Phi_{prox,overlap}$) While some of the electric field of overlap sensor 50 may be exchanged between overlap capacitor 50 and pointing element 5, the proportion of distal flux ($\Phi_{distal,overlap}$), as compared to proximate flux ($\Phi_{prox,overlap}$), of overlap sensor 50 is so small that the overall capacitance $C_{overlap}$ of overlap sensor 50 is relatively unaffected by the proximity of pointing element 5.

FIG. 11G represents overlap sensor 50 when cluster sensor unit 200 is being stretched in the X and/or Y direction (stretched overlap sensor 50 may be referred to herein as overlap sensor 50'). With such stretching, the surface areas of the distal and proximate surfaces of the overlap electrodes increase. For example, in the case of the illustrated embodiment of 9, 10A and 10B, the X direction dimension, $X_1'$, of first overlap electrode 52' and the X direction dimension, $X_2'$, of second overlap electrode 54' are greater than the X direction dimension, $X_1$, of first overlap electrode 52 and the X direction dimension, $X_2$, of second overlap electrode 54. The FIG. 11G Scenario is represented by time, $t_{o7}$, in FIG. 11L (where $t_{o1}$ represents sensor 50 as in the FIG. 11A Scenario). As can be seen from FIG. 11L, $C_{overlap}$ increases to $C_{o,stretched}$ as the amount of stretch of overlap sensor 50' increases. This increase in $C_{overlap}$ can be attributed to an increase in the overlapping surface areas of proximate overlap surface 52B' and proximate overlap surface 54A', since the capacitance, $C_{overlap}$, of overlap sensor 50' is directly proportional to the overlapping surface areas of proximate overlap surface 52B' and proximate overlap surface 54A'. In some embodiments, the Z direction spacing between first overlap electrode 52 and second overlap electrode 54 may decrease, thereby contributing in the increase of $C_{overlap}$. Accordingly, by measuring $C_{overlap}$, a suitably configured processor (see processor 385 of FIG. 3) can detect an increase in stretch of overlap sensor 50, 50' by detecting an increase of $C_{overlap}$ to a level $C_{o,stretched}$ that is greater than $C_{o,threshold}$. Stretch may be discriminated from contact force, since the capacitance, $C_{fringe}$, of fringe sensor 10 does not increase substantially during stretching (see description of FIG. 8G above). Stretch may also be discriminated from contact force when a plurality of overlap sensors 50 are employed (as part of cluster sensor units 200 or alone) since multiple overlap sensors 50 will experience stretch and exhibit an increase of $C_{overlap}$ to a level $C_{o,stretched}$ that is greater than $C_{o,threshold}$ while contact force would lead to fewer (e.g. one) overlap sensor 50 exhibiting an increase in capacitance, $C_{overlap}$.

Figure 11L:
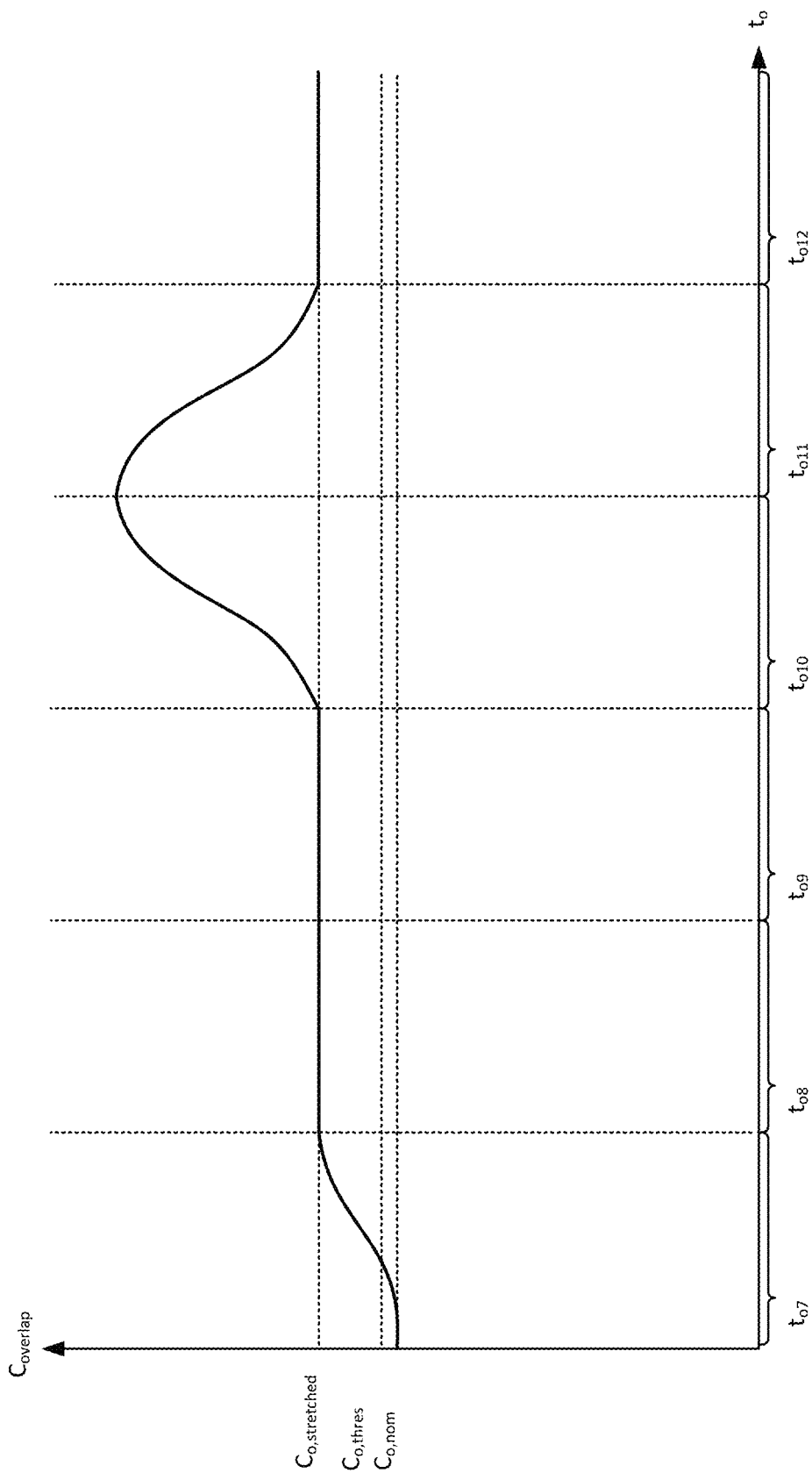

FIG. 11H represents stretched overlap sensor 50' as pointing element 5 approaches stretched overlap sensor 50'. The FIG. 11H Scenario is represented by time, $t_{o8}$, in FIG. 11L. As can be seen in FIG. 11L, $C_{overlap}$ remains relatively constant within a threshold vicinity of $C_{o,stretched}$ as pointing element 5 approaches stretched overlap sensor 50'. Unlike $C_{fringe}$ discussed above, $C_{overlap}$ remains relatively constant as pointing element 5 approaches stretched overlap sensor 50', since stretched overlap sensor 50' has a relatively low OSFR. In particular, stretched overlap sensor 50' has relatively low distal flux ($\Phi_{distal,overlap}$) as compared to its proximate flux ($\Phi_{prox,overlap}$) While some of the electric field of overlap sensor 50 may be diverted from stretched overlap sensor 50' by the presence of pointing element 5, the proportion of distal flux ($\Phi_{distal,overlap}$)) as compared to proximate flux ($\Phi_{prox,overlap}$), of stretched overlap sensor 50' is so small that the overall capacitance $C_{overlap}$ of stretched overlap sensor 50' is relatively unaffected by the proximity of pointing element 5.

FIG. 11I represents stretched overlap sensor 50' as pointing element 5 touches stretched cluster sensor unit 200 without applying any pressure or contact force on stretched cluster sensor unit 200. The FIG. 11I Scenario is represented by time, $t_{o9}$, in FIG. 11L. As can be seen in FIG. 11L, $C_{overlap}$ remains relatively constant within a threshold vicinity of $C_{o,stretched}$ during the FIG. 11I Scenario, where pointing element 5 contact cluster sensor unit 200 without applying any contact force thereon. $C_{overlap}$ remains relatively constant as pointing element 5 touches cluster sensor 200 (without applying any contact force or pressure thereon), since overlap sensor 50 has a relatively low OSFR and, consequently, is relatively unaffected by the proximity and even zero force contact of pointing element 5, as discussed above. In practice, $t_{o9}$ would be a relatively short time period, since it is not practical to touch something without applying any contact force on it.

FIG. 11K represents stretched overlap sensor 50' as pointing element 5 is in contact with and applies pressure or contact force to stretched cluster sensor unit 200. In FIG. 11K, first overlap electrode 52' is spaced apart in the Z direction from second overlap electrode 54' by a spacing 66". Because overlap sensor 50 is deformable and fabricated from deformable materials, spacing 66" is less than spacing 66 (see FIG. 10A). In other words, by applying contact force to stretched overlap sensor 50', pointing element 5 causes first and second overlap electrodes 52', 54' to be closer to one another. The FIG. 11K Scenario is represented by time, $t_{o10}$, in FIG. 11L. As can be seen from FIG. 11L, $C_{overlap}$ increases as the amount of contact force on stretched overlap sensor 50' increases. This increase in $C_{overlap}$ can be attributed to a reduction in the distance between first and second overlap electrodes 52', 54', since capacitance is inversely proportional to this spacing. Accordingly, by measuring the capacitance, $C_{overlap}$, of stretched overlap sensor 50', a suitably configured processor (see processor 385 of FIG. 3) could detect contact force being applied to stretched overlap sensor 50' by pointing element 5 by monitoring for an increase of $C_{overlap}$ from $C_{o,stretched}$ by an amount greater than a suitable threshold. Such a processor could also detect increasing contact force being applied to stretched overlap sensor 50' by pointing element 5 by observing increasing overlap capacitance $C_{overlap}$.

As the contact force applied by pointing element 5 is reduced, spacing 66' grows and begins to approach spacing 66. This Scenario is represented by time, $t_{o11}$, in FIG. 11L. As can be seen from FIG. 11L, $C_{overlap}$ decreases as the amount of contact force on stretched overlap sensor 50' decreases. This decrease in $C_{overlap}$ can be attributed to an increase in the distance between first and second overlap electrodes 52', 54', since capacitance is inversely proportional to this spacing. Accordingly, by measuring the capacitance, $C_{overlap}$, of stretched overlap sensor 50', a suitably configured processor (see processor 385 of FIG. 3) could detect a decrease in contact force on stretched overlap sensor 50' by pointing element 5.

At the conclusion of $t_{o11}$ in the illustrated example Scenarios of FIG. 11L, pointing element 5 again returns to the situation where pointing element 5 is in contact with stretched cluster sensor unit 200, but is not applying contact force to stretched cluster sensor unit 200. This circumstance is similar to the circumstance during $t_{o9}$. When the contact force applied by pointing element 5 becomes zero, $C_{overlap}$ returns to within a threshold vicinity of $C_{o,stretched}$.

FIG. 11J represents stretched overlap sensor 50' as pointing element 5 is retracted from stretched cluster sensor unit 200. The FIG. 11J Scenario is represented in FIG. 11L as time, $t_{o12}$. As can be seen from FIG. 11L, $C_{overlap}$ remains relatively constant within a threshold vicinity of $C_{o,stretched}$. $C_{overlap}$ remains relatively constant as pointing element 5 moves away from overlap sensor 50, since overlap sensor 50 has a relatively low OSFR. In particular, overlap sensor 50 has relatively low distal flux ($\Phi_{distal,overlap}$) as compared to its proximate flux ($\Phi_{prox,overlap}$) While some of the electric field of overlap sensor 50 may be exchanged between overlap capacitor 50 and pointing element 5, the proportion of distal flux ($\Phi_{distal,overlap}$)) as compared to proximate flux ($\Phi_{prox,overlap}$), of overlap sensor 50 is so small that the overall capacitance $C_{overlap}$ of overlap sensor 50 is relatively unaffected by the proximity of pointing element 5.

Figure 12A:
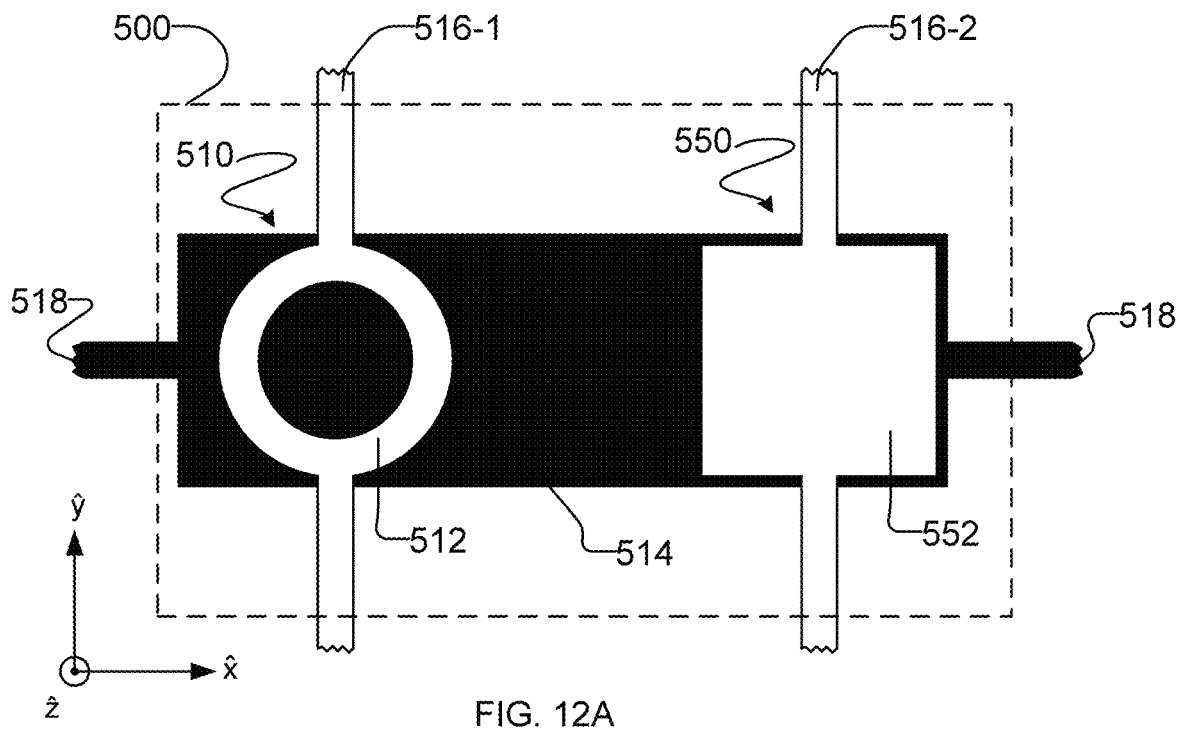
FIGS. 12A through 12C depict schematic plan views of sensors according to particular embodiments of the invention.

FIG. 12A depicts a cluster sensor 500 according to an exemplary embodiment of the invention. Cluster sensor 500 comprises a fringe sensor 510 and an overlap sensor 550. Cluster sensor 500 is substantially similar to cluster sensor 200, except that first fringe electrode 512 and first overlap electrode 552 share a second electrode 514 instead of having separate second fringe and second overlap electrodes as in cluster sensor 200.

Second electrode 514 may comprise any suitable shape in the XY plane. Second electrode 514 is spaced apart from first fringe electrode 512 and first overlap electrode 552 in the Z direction. In the illustrated embodiment, second electrode 514 is rectangular in shape. This is not necessary. Second electrode 314 may comprise a circular shape, an elliptical shape, a polygonal shape or an arbitrary shape which provides a suitably high FSFR for fringe sensor 310 and a suitably low OSFR for overlap sensor 550.

To measure the capacitance of fringe sensor 510, a voltage is applied across first fringe electrode 512 and second electrode 514, while column trace 516-2 is grounded or allowed to float. Similarly, to measure the capacitance of overlap sensor 550, a voltage is applied across first overlap electrode 552 and second electrode 514, while column trace 516-1 is grounded or allowed to float.

Cluster sensor 500 may be employed to determine a proximity, or pressure applied by pointing element 5 in substantially the same way as cluster sensors 100, 200 discussed above. That is, Scenarios A through L depicted in FIGS. 2 and 2A will have similar effects on the capacitances of fringe sensor 510 and overlap sensor 550 as would be the case for fringe sensor 110, 50 etc. and overlap sensor 150, 50, etc. as described herein.

Figure 12B:
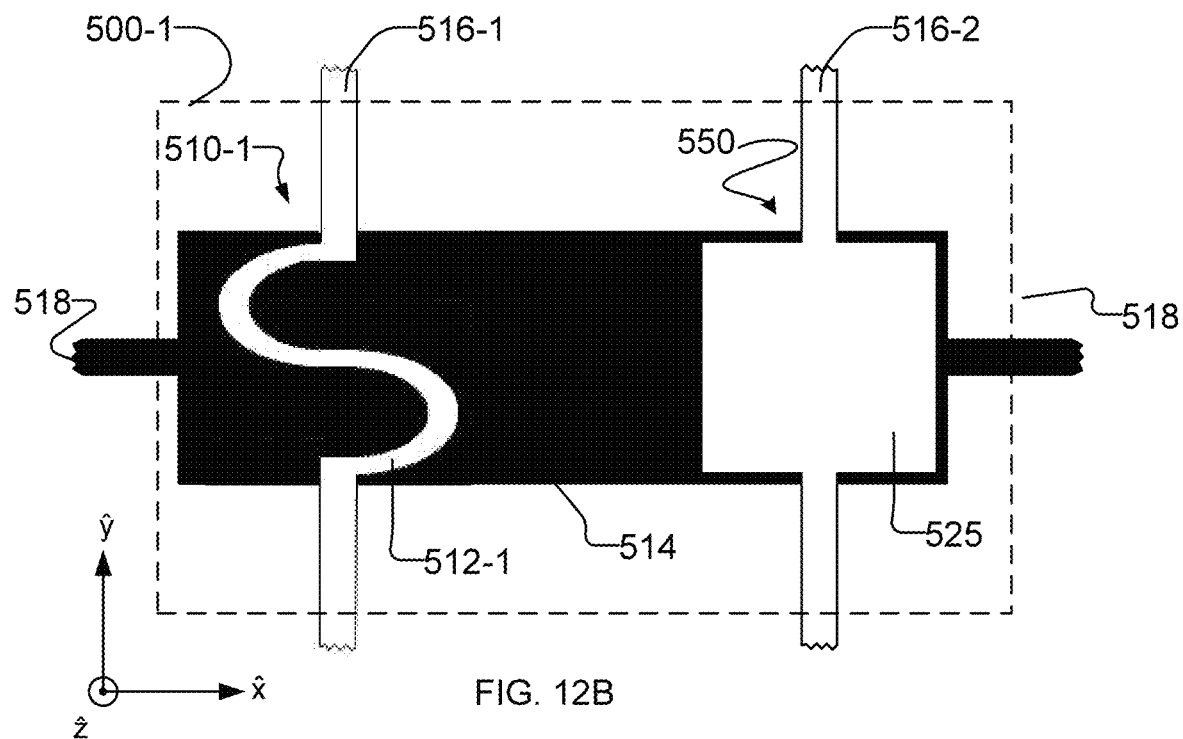

FIG. 12B depicts a cluster sensor 500-1 according to an exemplary embodiment of the invention. Cluster sensor 500 comprises a fringe sensor 510-1 and an overlap sensor 550. Cluster sensor 500-1 is substantially similar to cluster sensor 500, except that first fringe electrode 512-1 has a different XY plane shape than first fringe electrode 512. In particular, first fringe electrode 512-1 is substantially similar to first fringe electrode 12-1 (FIG. 7).

Cluster sensor 500-1 may be employed to determine a proximity, or pressure applied by pointing element 5 in substantially the same way as cluster sensors 100, 200 discussed above. That is, Scenarios A through L depicted in FIGS. 2 and 2A will have similar effects on the capacitances of fringe sensor 510-1 and overlap sensor 550 as would be the case for fringe sensor 110, 50 etc. and overlap sensor 150, 50, etc. as described herein.

Figure 12C:
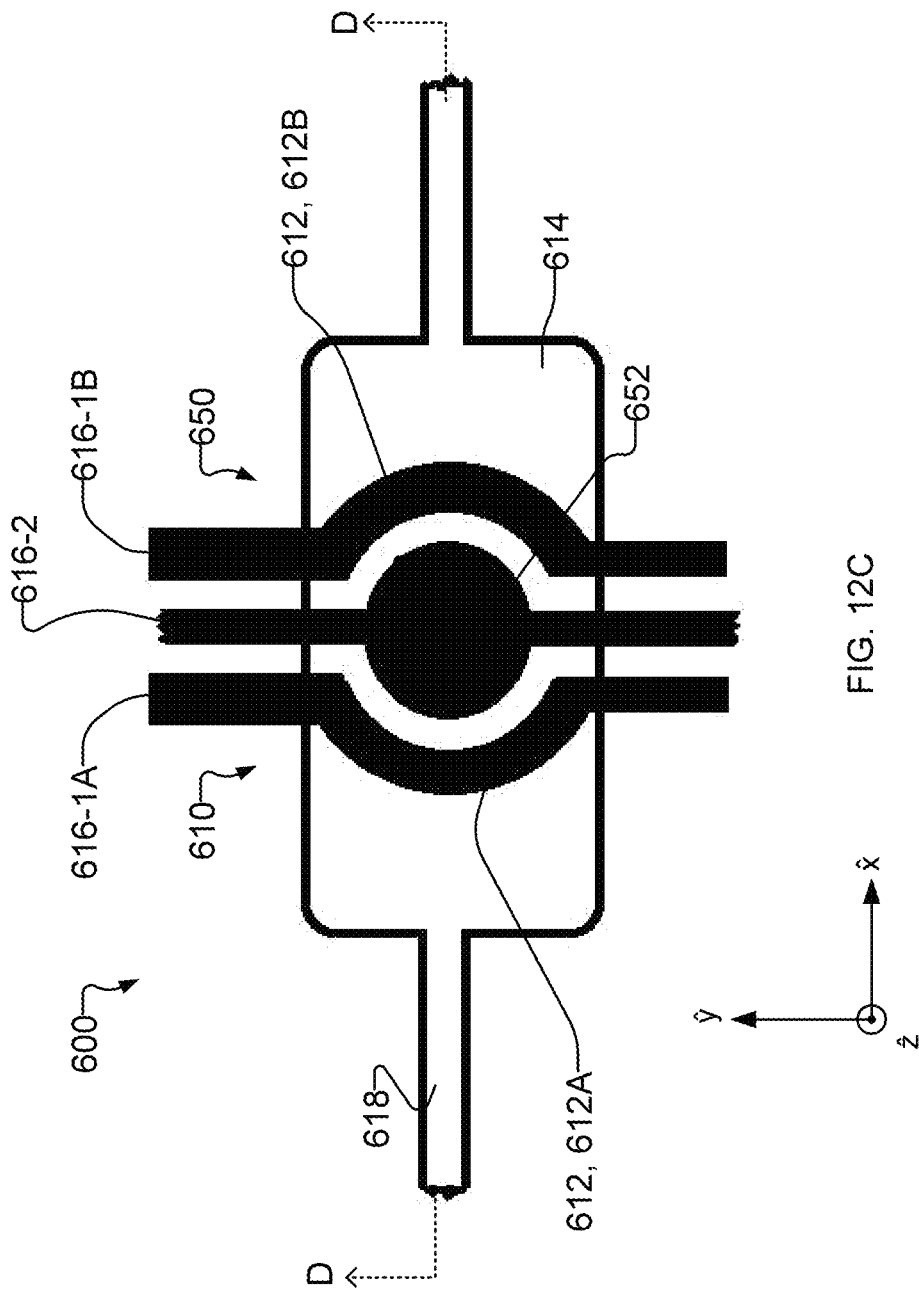

FIG. 12C depicts a cluster sensor 600 according to an exemplary embodiment of the invention. Cluster sensor 600 is similar in many respect to cluster sensor 500, except that instead of first fringe electrode 612 being spaced apart in the X direction from first overlap electrode 652 as are first fringe electrode 512 and first overlap electrode 552, first overlap electrode 652 is interposed within a space defined by spaced apart parts 612A, 612B of first fringe electrode 612, as depicted in FIG. 12C. Interposing first overlap electrode 652 within a space defined by parts 612A, 612B of first fringe electrode 612 may help to minimize the size (in the XY plane) of cluster sensor 600 relative to cluster sensor 100, 200, 500, etc.

As can be seen from FIG. 12C, first fringe electrode 612 is split into a first part 612A and a second part 612B. First and second parts 612A, 612B of first fringe electrode 612 may be connected by way of traces 616-1A, 616-1B. Traces 616-1A, 616-1B may be connected to one another (not shown in the illustrated view of FIG. 12C) by connectors that go over trace 616-2 of first overlap electrode 652 in the positive-Z direction (e.g. out of the page in FIG. 12C) or under trace 616-2 in the negative-Z direction (e.g. into the page in FIG. 12C), although this is not depicted. Accordingly, traces 616-1A, 616-1B act as a single trace and first and second parts 612A, 612B of first fringe electrode 612 act as a single first fringe electrode 612.

To measure the capacitance of fringe sensor 610, a voltage is applied across first fringe electrode 612 (via traces 616-1A, 616-1B) and second electrode 614 (via trace 618) while column trace 616-2 is grounded or allowed to float. Similarly, to measure the capacitance of overlap sensor 650, a voltage is applied across first overlap electrode 652 (via trace 616-2) and second electrode 614 (via trace 618) while traces 616-1A, 616-1B are grounded or allowed to float. This may be accomplished, for example, by using a suitably configured multiplexer.

In some embodiments, first fringe electrode 612 may interfere with the electric field of overlap sensor 650 and cause the capacitance of overlap sensor 650 to increase. To minimize the interference of first fringe electrode 612 on the capacitance of overlap sensor 650, first fringe electrode 612 may be grounded or otherwise set to the same voltage as second electrode 614 while measuring the capacitance, $C_{overlap}$, of overlap sensor 650.

Cluster sensor 600 may be employed to determine a proximity of, or pressure applied by pointing element 5 in substantially the same way as cluster sensors 100, 200 discussed above. That is, Scenarios A through L depicted in FIGS. 2 and 2A will have similar effects on the capacitances of fringe sensor 610 and overlap sensor 650 as compared to fringe sensor 110, 50 etc. and overlap sensor 150, 50, etc. described herein.

FIGS. 13A and 13B depict a sensor 750 according to one exemplary aspect of the invention. Sensor 750 may be employed for detecting and distinguishing between increasing and decreasing proximity of a pointing element, touch by a pointing element, change in contact force applied by a pointing element, stretching of sensor 750, increasing and decreasing proximity of a pointing element while stretching sensor 750, and touch and pressure applied by a pointing element while stretching sensor 750.

As can be seen from FIG. 13B, sensor 750 of the illustrated embodiment is similar in many respects to overlap sensor 50, as described herein, except that sensor 750 comprises one or more gas bubbles 715 arranged between first electrode 752 and second electrode 754. Gas bubble 715 may comprise any suitable gas which has a higher compressibility than dielectric 713, such as oxygen, carbon dioxide, air (some combination of nitrogen, oxygen, carbon dioxide, water vapor or the like), etc. In some embodiments, gas bubble 715 is replaced with a volume of a non-gaseous dielectric material having a different compressibility than dielectric material 713. In other embodiments, gas bubble 715 is replaced by a plurality of gas bubbles spread through dielectric 713 (e.g. dielectric 713 comprises a porous material).

Like overlap sensor 50, first and second electrodes 752, 754 of the illustrated FIG. 13B embodiment each extend in an XY plane and are spaced apart in the Z direction by a spacing 766. Although depicted as being rectangular/square, first and second electrodes 752, 754 may have any suitable XY plane cross sectional shape such as those described in connection with the electrodes of overlap sensor 50 (or any other sensor described herein). Like overlap sensor 50, first and second electrodes 752, 754 may be spaced apart and/or surrounded by a dielectric material 713. Dielectric material 713 may be similar to or the same as any dielectric material described herein such as dielectric material 13.

Unlike overlap sensor 50, first electrode 752 is depicted as having an equal X dimension width as trace 756 and second electrode 754 is depicted as having an equal Y direction width as trace 758. Although this may simplify manufacturing of sensor 750, this is not required.

Like overlap sensor 50, sensor 750 has a capacitance, C, and exhibits an electric field, E. Electric field, $\vec{E}$ may exhibit properties similar to those of the electric fields of the fringe sensors and the overlap sensors described herein. For example, electric field, $\vec{E}$, may exhibit a distal flux, $\Phi_{distal}$ which comprises the flux of the electric field $\vec{E}$ into (or out of depending on polarity) first distal surface 752A and/or into (or out of) a notional plane spaced infinitesimally apart from first distal surface 752A in a direction away from second electrode 754 (e.g. spaced infinitesimally apart from first distal surface 752A in a positive Z direction). The electric field $\vec{E}$ associated with any voltage applied between first and second overlap electrodes 752, 754 also comprises a flux characteristic referred to herein as the proximate flux, $\Phi_{prox}$ which comprises the flux of the electric field $\vec{E}$ into (or out of depending on polarity) first proximate surface 752B and/or a notional plane spaced infinitesimally apart from first proximate surface 752B in a direction toward second electrode 754 (e.g. spaced infinitesimally apart from first proximate surface 752B in a negative Z direction.

By altering the ratio of distal flux, $\Phi_{distal}$ to proximate flux, $\Phi_{prox}$, it may be possible to alter the relative sensitivity of sensor 750 to proximity of a pointing element 5 and pressure by a pointing element 5. For example, by raising the amount distal flux, $\Phi_{distal}$, relative to the amount of proximate flux, $\Phi_{prox}$, sensor 750 becomes relatively more sensitive to proximity. Conversely, by lowering the amount distal flux, $\Phi_{distal}$, relative to the amount of proximate flux, $\Phi_{prox}$, sensor 750 becomes relatively more sensitive to pressure, as discussed above.

Figure 13C:
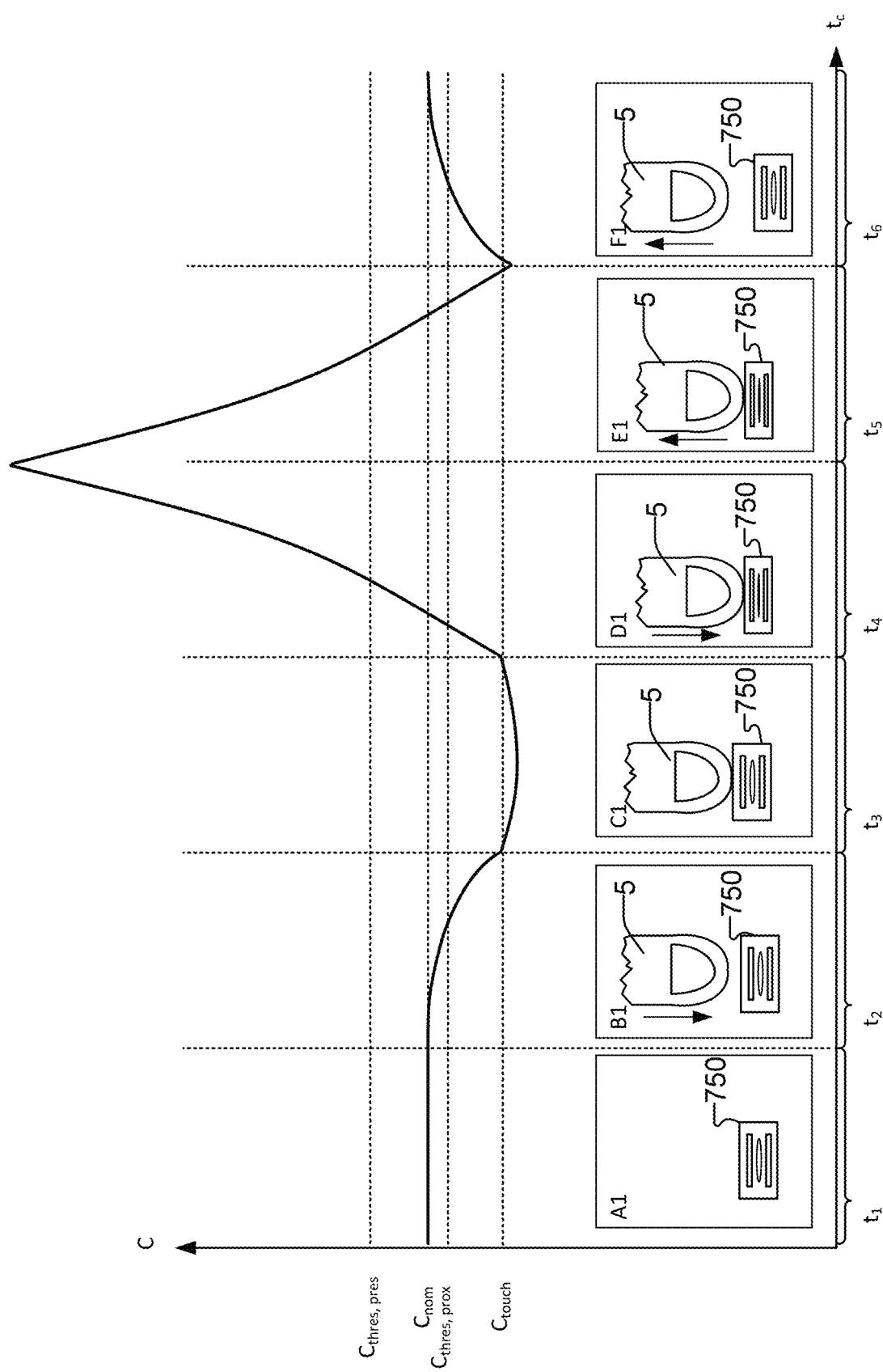
FIGS. 13C and 13D depict graphs of capacitance over time for a sensor in various Scenarios according to one embodiment of the invention.

FIG. 13C depicts Scenarios A1 through F1 and a graph representing the capacitance, C, of sensor 750 during Scenarios A1 through F1.

Scenario A1 represents when pointing element 5 is not proximate to sensor 750 and is not applying contact force to sensor 750. Scenario A1 is represented as time period $t_1$ on the FIG. 13C graph which plots estimated values of sensor 750 capacitance, C, as a function of time. As can be seen from the FIG. 13C graph, in Scenario A1, the estimated value of sensor 750 capacitance, C, is within a threshold range around the nominal capacitance, $C_{nom}$ (i.e. does not fall below $C_{thres,prox}$). Accordingly, a processor could be configured to generate and/or output one or more signals indicating that pointing element 5 is not proximate to sensor 750 (e.g. Scenario A1) based on sensor 750 capacitance, C, not varying below $C_{thres,prox}$.

Scenario B1 represents when pointing element 5 is approaching (e.g. is proximate to) sensor 750, but is not applying contact force to sensor 750. Scenario B1 is represented as time period $t_2$ on the FIG. 13C graph. As can be seen from the FIG. 13C graph, the estimated value of sensor 750 capacitance, C, decreases outside of a threshold range around the nominal capacitance, $C_{nom}$ (i.e. decreases below $C_{thres,prox}$) as pointing element 5 approaches. The decrease in sensor 750 capacitance, C, occurs since pointing element 5 acts as a third electrode, which capacitively couples to sensor 750, reducing the capacitive coupling between first and second electrodes 752, 754. Accordingly, a processor could be configured to generate and/or output one or more signals indicating that pointing element 5 is approaching (e.g. is proximate to) sensor 750 (e.g. Scenario B1) based on sensor 750 capacitance, C, decreasing below $C_{thres,prox}$. As will become clear with the description below, the capacitance C of sensor 750 is also decreasing (and may fall below $C_{thres,prox}$) in Scenario E1 (where contact force of pointing element 5 is being reduced). The Scenario of B1 and E1 can be discriminated from one another based on the magnitude of sensor 750 capacitance, C, or the rate of decrease of the capacitance C of sensor 750. Specifically, the magnitude of sensor 750 capacitance, C, at the transition between time, $t_4$, and time, $t_5$, will be significantly greater than the $C_{nom}$, as depicted in FIG. 13C, because of the presence of gas bubble 715 in sensor 750, as explained in more detail below. Similarly, the rate of decrease of the capacitance C of sensor 750 may be greater in Scenario E1, because of the presence of gas bubble 715 in sensor 750, as explained in more detail below. A processor may be configured to make this distinction based the differences between the magnitudes of capacitance C of sensor 750 and/or the rate at which capacitance C of sensor 750 is changing. Further, a processor may use additional indicators (e.g. historical data, information from some other sensor and/or the like) to help make this distinction.

Scenario C1 represents when pointing element 5 is in contact with sensor 750, but is not applying contact force to sensor 750. Scenario C1 is represented as time period $t_3$ on the FIG. 13C graph. As can be seen from the FIG. 13C graph, the estimated value of sensor 750 capacitance, C, decreases from the nominal capacitance, $C_{nom}$ to below a contact threshold $C_{touch}$. Again, this reduction is due to pointing element 5 acting as a third electrode, which capacitively couples to sensor 750, thereby reducing the coupling between first and second electrodes 752, 754. The difference between the reaction of the capacitance C to Scenario B1 and Scenario C1 may be a difference of degree and may involve configurable thresholds $C_{thres,prox}$ and $C_{touch}$. Accordingly, a processor could be configured to generate and/or output one or more signals indicating that pointing element 5 is touching, but not applying force to sensor 750 (e.g. Scenario C1) based on sensor 750 capacitance, C, decreasing below $C_{touch}$.

Scenario D1 represents when pointing element 5 is in contact with sensor 750 and is applying contact force to sensor 750. Scenario D1 is represented as time period $t_4$ on the FIG. 13C graph. As can be seen from the FIG. 13C graph, the estimated value of sensor 750 capacitance, C, increases as the contact force applied to sensor 750 by pointing element 5 increases. Notably, sensor 750 capacitance, C, increases substantially above $C_{nom}$ and above a threshold capacitance for pressure, $C_{thres,pres}$ with minimal pressure. In practice, it may be difficult to apply pressure to sensor 750 without sensor 750 capacitance, C, increasing above $C_{nom}$ and above a threshold capacitance for pressure, $C_{thres,pres}$. This increase in sensor 750 capacitance, C, can be attributed, at least in part, to deformation of sensor 750 and specifically a reduction in spacing 766, since capacitance is inversely proportional to this spacing 766. The increase in sensor 750 capacitance, C, can also be attributed, at least in part, due to a change of the relative permittivity of the dielectric material between first electrode 752 and second electrode 754, because gas bubble 715 is squeezed and/or compressed more than dielectric 713. The relative permittivity of the dielectric material between first electrode 752 and second electrode 754 is based on the relative permittivity of each of dielectric material 713 and gas bubble 715 and is proportional to the ratio of the volume of dielectric material 713 to the volume of gas bubble 715 present between first and second electrodes 752, 754. Since gas bubble 715 is squeezed and/or compressed more than dielectric 713, as pressure on sensor 750 increases, the ratio of volume of dielectric material 713 to volume of gas bubble 715 also increases, thereby causing the relative permittivity between first and second electrodes 752, 754 to increase (since gas bubble 715 may have a lower permittivity than dielectric 713) and in turn causing the capacitance of sensor 750, C, to increase. Accordingly, a processor could be configured to generate and/or output one or more signals indicating that pointing element 5 is in contact with sensor 750 and is applying contact force to sensor 750 (e.g. Scenario D1) based on sensor 750 capacitance, C, increasing above $C_{thres,pres}$. Accordingly, a processor may be configured to discriminate between Scenario D1 and Scenario F1 (described below as representing pointing element 5 moving away from sensor 750) based on sensor 750 capacitance, C, increasing above $C_{thres,pres}$ in Scenario D1 but not in Scenario F1. A processor may also be configured to discriminate between Scenario D1 and Scenario F1 based on the rate of change of sensor 750 capacitance, C, or additional indicators (e.g. historical data, information from some other sensor and/or the like) to help make this distinction.

Scenario E1 represents when pointing element 5 is in contact with sensor 750 and is decreasing contact force from sensor 750. Scenario E1 is represented as time period $t_5$ on the FIG. 13C graph. At the conclusion of Scenario E1, (i.e. at the conclusion of $t_5$), the Scenario is substantially similar to that of Scenario C1—i.e. there is contact of pointing element 5 to sensor 750, but no force is applied by pointing element 5 on sensor 750. As can be seen from the FIG. 13C graph, the estimated value of sensor 750 capacitance, C, decreases in Scenario E1 back toward $C_{touch}$. The rate of change of sensor 750 capacitance, C, is similar (although opposite) to that in Scenario D1 since the same factors are contributing to the change in capacitance, C. Accordingly, a processor could be configured to generate and/or output one or more signals indicating that pointing element 5 is in contact with sensor 750 and is decreasing the contact force on sensor 750 (e.g. Scenario E1) based on sensor 750 capacitance, C, decreasing below $C_{thres,pres}$ A processor can therefore be configured to distinguish between Scenarios E1 and B1 since sensor 750 capacitance, C is not above $C_{thres,pres}$ in Scenario B1. A processor may also be configured to discriminate between Scenario D1 and Scenario F1 based on the rate of change of sensor 750 capacitance, C, or additional indicators (e.g. historical data, information from some other sensor and/or the like) to help make this distinction. The circumstance at the end of Scenario E1 (contact with zero force) is reached when sensor 750 capacitance, C, decreases below $C_{touch}$.

Scenario F1 represents when pointing element 5 is moving away from, but is still proximate to, sensor 750 and is not applying contact force to sensor 750. Scenario F1 is represented as time period $t_6$ on the FIG. 13C graph. As can be seen from the FIG. 13C graph, the estimated value of sensor 750 capacitance, C, increases toward a threshold range around the nominal capacitance, $C_{nom}$ (i.e. increases toward $C_{thres,prox}$) as pointing element 5 moves away from sensor 750. Accordingly, a processor could be configured to generate and/or output one or more signals indicating that pointing element 5 is moving away from, but is still proximate to, sensor 750 (e.g. Scenario F1) based on sensor 750 capacitance, C, increasing toward $C_{thres,prox}$ while remaining at less than $C_{thres,pres}$. In Scenario F1, when pointing element 5 is no longer within proximity of sensor 750, sensor 750 capacitance, C, will increases above $C_{thres,prox}$, as in Scenario A1.

Figure 13D:
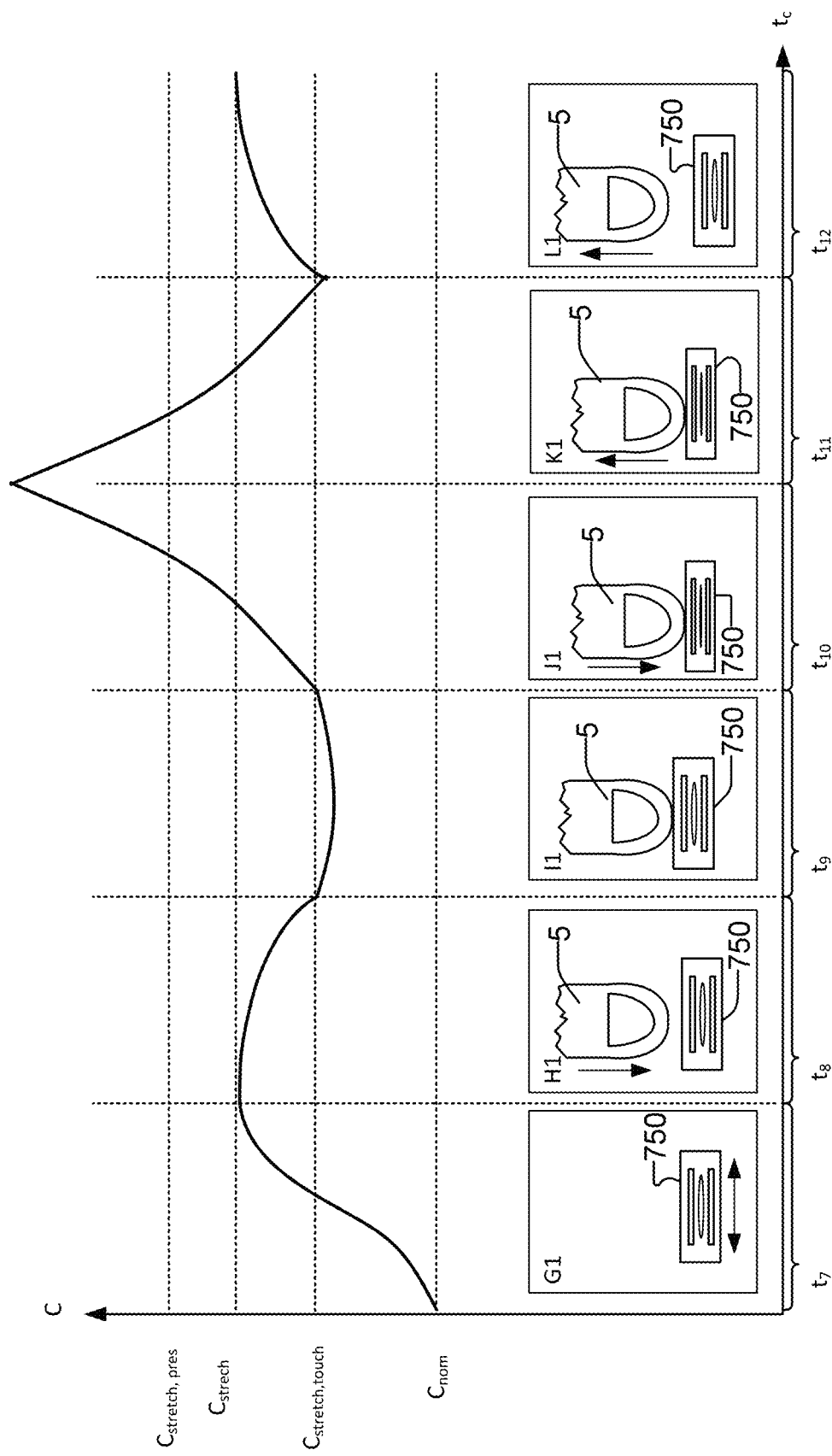

FIG. 13D depicts a series of Scenarios, G1 through L1, of sensor 750 being stretched in the X direction and/or Y direction while a pointing element 5 interacts with the stretched sensor 750 and a graph showing the changes to sensor 750 capacitance, C, during each of Scenarios G1 through L1.

Scenario G1 represents when sensor 750 is being stretched in the X direction and/or Y direction without a pointing element 5 in proximity of sensor 750. Scenario G1 is represented as time period $t_7$ on the FIG. 13D graph. As can be seen from the FIG. 13D graph, the estimated value of sensor 750 capacitance, C, increases above a threshold range around the nominal capacitance $C_{nom}$ (i.e. increases above $C_{thres,stretch}$) to a level $C_{stretch}$. The increase of sensor 750 capacitance, C, may be attributed to an increase in the overlapping surface areas of first and second electrodes 752, 754, since capacitance is directly proportional to the overlapping surface areas. The increase of sensor 750 capacitance, C, may also be attributed to a reduction in spacing 766 as sensor 750 is stretched. The increase of sensor 750 capacitance, C, may also be attributed to a change in the volume of gas bubble 715 relative to the volume of dielectric 713 between first and second electrodes 752, 754, which would affect the combined dielectric effect of dielectric 713 and gas bubble 715 between first and second electrodes 752, 754, as discussed above.

Referring back to FIG. 13C, it can be seen that the increase of sensor 750 capacitance, C, during time $t_4$ (representing Scenario D1) is similar in shape and magnitude to the increase of sensor 750 capacitance, C, during time $t_7$ (representing Scenario G1). In some embodiments, Scenarios D1 and G1 are distinguished by comparing sensor 750 capacitance, C, to the capacitance of one or more additional sensors 750 in an array of sensors 750. If a number of adjacent sensors 750 in an array are experiencing the same change in capacitance as is represented by time $t_7$ in FIG. 13D, a processor may be configured to determine that sensors 750 are being stretched. Conversely, if only the one sensor 750 or a small number of immediately adjacent sensors 750 in an array exhibit this change in capacitance, C, the processor may be configured to determine that pressure is being applied as in Scenario D1.

Once sensor 750 is stretched, such as in Scenario G1 of FIG. 13D, sensor 750 capacitance, C, behaves in substantially the same way as when sensor 750 is not stretched except that the values of sensor 750 capacitance, C, are all raised by the difference between $C_{stretch}$ and $C_{nom}$, as depicted in FIG. 13D. For example, capacitance, C, decreases when pointing element 5 approaches sensor 750, decreases past $C_{stretch,touch}$ when pointing element 5 touches sensor 750, increases past $C_{stretch,pres}$ as pointing element 5 applies pressure to sensor 750, decreases past $C_{stretch,pres}$ as the pressure is removed from sensor 750 and returns to $C_{stretch}$ when the pointing element 5 is moved away from sensor 750, as is depicted in Scenarios H1 to L1 of FIG. 13D which correspond generally to Scenarios B1 to F1 of FIG. 13C.

Another aspect of the invention provides a method for fabricating a sensor or a sensor array. The sensor or sensor array may comprise any of the sensor arrays described herein (such as fringe sensor 10, overlap sensor 50, cluster sensors 200, 500, 500-1, sensor 750 etc. and sensor arrays 305, etc.)

As depicted in FIGS. 14A to J, method 800 comprises three main steps: molding, bonding and polymerizing. In some embodiments, method 800 comprises molding and polymerizing and entire sensors are molded as a single (e.g. monolithic) piece.

Figure 14A:
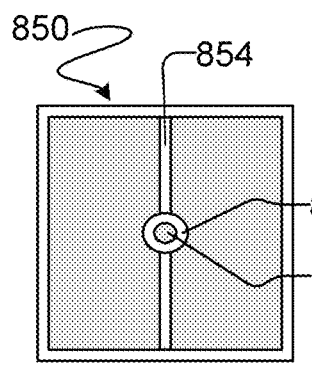
FIGS. 14A and 14B depict top plan and perspective views of a first electrode mold according to one aspect of the invention.
Figure 14B:
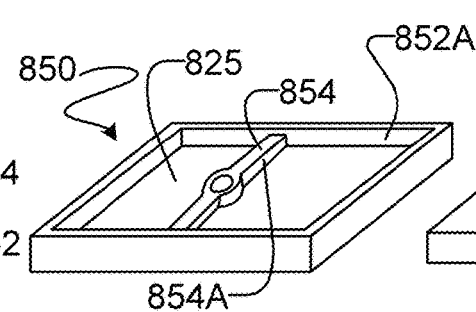

As discussed above, sensors 10, 50, 250 etc. and sensor arrays 305 may each be substantially contained within a dielectric material 13, 213, 313, 613, 713 etc. (each and/or all referred to as dielectric material 840 for the purpose of describing method 800). Molding comprises shaping dielectric material 840 to form channels for receiving the electrode material(s) 845. Dielectric material 840 is shaped using a first electrode mold 850, a second electrode mold 860 and a spacer mold 870. FIGS. 14A, B, D, E, G and H depict plan and perspective views of molds 850, 860 and 870 for forming a single fringe electrode 10. Molds 850, 860, 870 may be constructed from aluminum or another suitable material. It should be understood by those of skill in the art that molds 850, 860, 870 can be suitably modified for the geometry of any of the sensor or sensor arrays described or discussed herein.

Figure 14C:
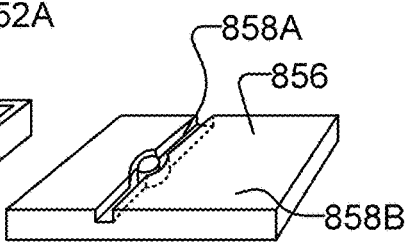
FIG. 14C depicts a first electrode layer according to one embodiment of the invention.

FIGS. 14A and B depict an exemplary first electrode mold 850. As can be seen from FIG. 14A, first electrode mold 850 comprises a first electrode mold negative space 852 having a Z direction depth 852A for receiving dielectric material 840 and a first electrode positive space 854 having a Z direction height 854A for forming a channel for eventually receiving electrode material 845. The Z direction depth 852A of first electrode mold negative space 852 may be greater than the Z direction height 854A of first electrode positive space 854 such that dielectric material 840 will fill over first electrode mold positive space 854. In some embodiments, the Z direction depth of first electrode negative space 852A is between 500 and 900 μm (e.g. 800 μm) and the Z direction height of first electrode positive space 854A is between 200 and 600 μm (e.g. 400 μm). Dielectric material 840 may be cured within first electrode mold 850 to produce a first layer 856. For example, dielectric material 840 may be cured in an oven for 0.5 to 1.5 hours at a temperature between 60° C. and 100° C. First layer 856 comprises cured dielectric material 840 that defines a first electrode groove 858A which is the negative shape of first fringe electrode 12 and cuts into first layer surface 858B, as depicted in FIG. 14C.

Figure 14D:
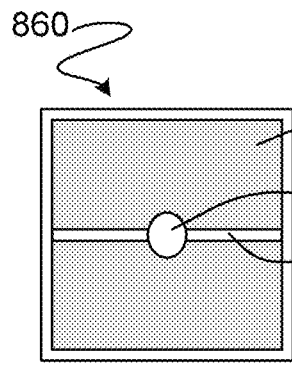
FIGS. 14D and 14E depict top plan and perspective views of a second electrode mold according to one aspect of the invention.
Figure 14E:
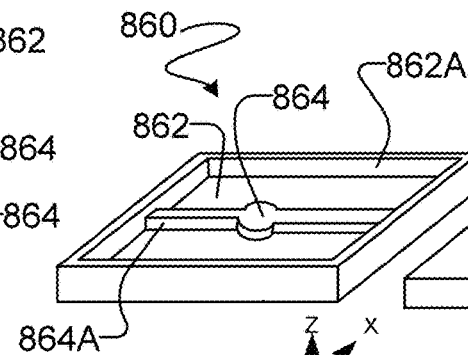
Figure 14F:
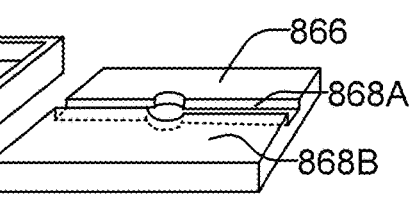
FIG. 14F depicts a second electrode layer according to one embodiment of the invention.

FIGS. 14D and E depict an exemplary second electrode mold 860. As can be seen from FIG. 14D, second electrode mold 860 comprises a second electrode mold negative space 862 having a Z direction depth 862A for receiving dielectric material 840 and a second electrode positive space 864 having a Z direction height 864A for forming a channel for eventually receiving electrode material 845. The Z direction depth 862A of second electrode mold negative space 862 may be greater than the Z direction height 864A of second electrode positive space 864 such that dielectric material 840 will fill over second electrode mold positive space 864. Dielectric material 840 may be cured within second electrode mold 860 to produce a second layer 866. For example, dielectric material 840 may be cured in an oven for 0.5 to 1.5 hours at a temperature between 60° C. and 100° C. Second layer 866 comprises cured dielectric material 840 that defines a second electrode groove 868A which is the negative shape of second fringe electrode 14 and cuts into second layer surface 868B, as depicted in FIG. 14F.

Figure 14G:
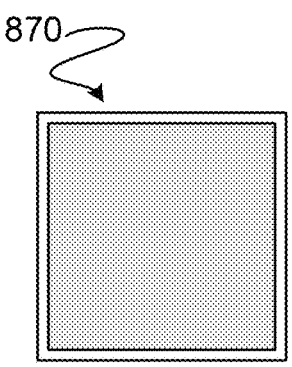
FIGS. 14G and 14H depict top plan and perspective views of a spacer mold according to one aspect of the invention.
Figure 14H:
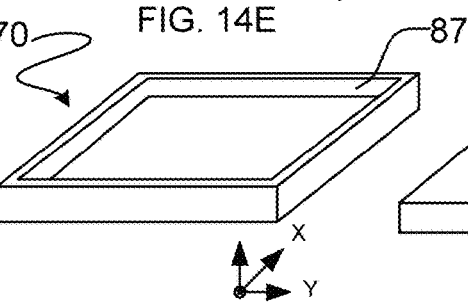
Figure 14I:
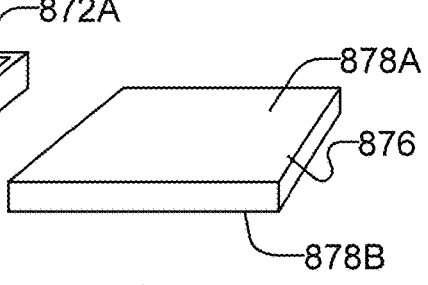
FIG. 14I depicts a spacer layer according to one embodiment of the invention.

FIGS. 14G and H depicts an exemplary spacer mold 870. As can be seen from FIG. 14G, spacer mold 870 comprises a spacer mold negative space 872 having a Z direction depth 872A for receiving dielectric material 840. Dielectric material 840 may be cured within spacer mold 870 to produce a spacer layer 876. For example, dielectric material 840 may be cured in an oven for 0.5 to 1.5 hours at a temperature between 60° C. and 100° C. Spacer layer 876 comprises cured dielectric material 840 for spacing apart first electrode layer 856 from second electrode layer 866, as depicted in FIG. 14I. Spacer layer 876 comprises a first spacer surface 878A which extends in the X and Y directions and a second spacer surface 878B which extends in the X and Y directions and is opposite to first spacer surface 878A.

In another embodiment, spacer layer 876 is obtained by spin coating an uncured PDMS layer on a silicon wafer. The dielectric material 840 may then be cured in an oven for 0.5 to 1.5 hours at a temperature between 60° C. and 100° C.

Dielectric material 840 may comprise any suitable dielectric. For example, dielectric material 840 may comprise silicone elastomer polydimethylsiloxane (PDMS), or a platinum-catalyzed silicone. In some embodiments, dielectric material 840 comprises a substantially transparent material having a transmittance in the range of greater than 90%. In some embodiments, the PDMS (e.g. Sylgard™ 184 silicone elastomer) is mixed in a 10 (base): 1 (cross-linker) ratio and then degassed to get rid of air bubbles.

Figure 14J:
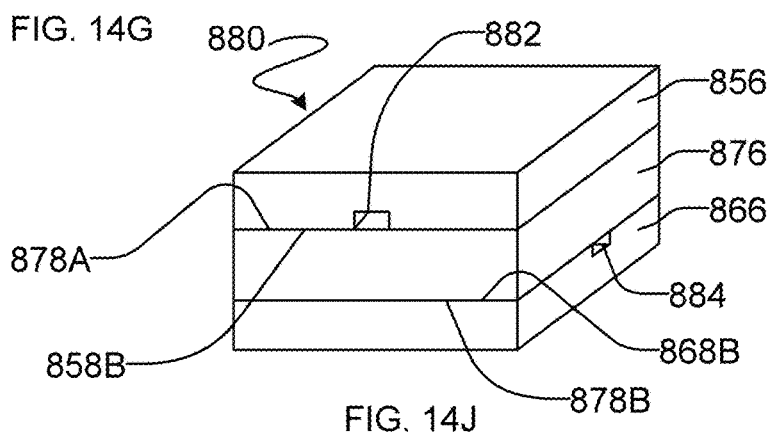
FIG. 14J depicts a sensor body according to one embodiment of the invention.

After the molding step is complete and first layer 856, second layer 866 and spacer 876 are cured, a bonding step may be performed. The bonding step comprises bonding first layer surface 858B to first spacer surface 878A and bonding second layer surface 868B to second spacer surface 878B to thereby form a sensor body 880, as depicted in FIG. 14J. Any suitable form of bonding may be employed. For example, plasma bonding may be employed (e.g. a Harrick Plasma Cleaner (PDC-001) may be employed by exposing the surfaces to be bonded to oxygen plasma at a pressure of 600 mTorr for 110 seconds) to bond first layer 856 and second layer 866 to spacer layer 876. In another embodiment, first layer 856, second layer 866 and spacer layer 876 are bonded using partially cured PDMS and ultraviolet curable adhesive.

As can be seen from FIG. 14J, sensor body 880 comprises a first sensor body channel 882 defined by first spacer surface 878A and first electrode groove 858A, and a second sensor body channel 884 defined by second spacer surface 878B and second electrode groove 868A. As can be seen from FIG. 14J, first sensor body channel 882 extends in the X direction while second sensor body channel 884 extends in the Y direction.

After sensor body 880 is formed and bonding step is complete, a polymerization step may be performed. Electrode material 845 is injected into first sensor body channel 882 and into second sensor body channel 884. After injection the electrode material 845 is polymerized. Any suitable polymerization technique as is known in the art may be employed. For example, either of at least a UV initiated or thermal initiated polymerization technique could be used.

Electrode material 845 may comprise any suitable material. In some embodiments, electrode material 845 comprises an ionically conductive gel, such as polyacrylamide. Such ionically conductive gels are highly deformable and transparent. In some embodiments, electrode material may comprise a monomer mixture with a salt, such as sodium chloride or a polyacrylamide hydrogel. In another embodiment, lithium chloride is employed within electrode material 845 to reduce evaporation of water through dielectric material 840. In other embodiments, a glycerol sodium chloride solution may be employed in place of the hydrogel to reduce evaporation. In some embodiments, electrode material 845 comprises metal mesh, silver nanowires, carbon nanotubes, conducting polymers (e.g. PEDOT:PSS), ionically conducting hydrogels (e.g. polyacrylamide), or the like. Gel-based ionic conductor pairs can propagate signals with a high effective diffusion rate.

In some embodiments, electrode material comprises a polyacrylamide as follows. A solution containing 2.2 M acrylamide (AAm) and 2.74 M NaCl is prepared. 1.5 wt % ammonium persulfate (AP) may be added as an initiator and 0.06 wt % of the cross-linker N,N-methylenebisacrylamde (MBAA) may be dissolved, with respect to the weight of the AAm monomer. The mixture is then degassed. 1.0 wt % of N,N,N',N'-tetramethylethylenediamine (TEMED) is added as the accelerator to cause rapid polymerization. The stoichiometry of AP and TEMED has been developed for specifically timed polymerization. Upon the addition of the accelerator, the mixture may be injected into channels 682, 684 within one minute to allow the mixture to polymerize as it flows through channels 682, 684. The process is timed such that the polymerization is complete as the channel is filled. Finally, silver plated copper wires 250 μm in diameter may be inserted into the openings of the channels and the channels may then be sealed using silicone epoxy (Sil-Poxy from Smooth-On).

In some embodiments, the transmittance of visible light wavelengths each or any of sensors 10, 50, 100, 200 etc. in air is greater than 80%. In some embodiments, the transmittance may be greater than 90%. Sources of light attenuation include: reflective losses at the air-sensor interfaces due to refractive index mismatch (in some embodiments, this is estimated to account for 6% out of the 10% loss) and the electrode-dielectric interfaces such as the hydrogel-PDMS interfaces in some embodiments (this is estimated to account for less than 1% loss). The remaining 4% loss may be a result of surface imperfections. Both surface scattering and reflections may be reduced by adding anti-reflection coatings and using molds with an optical finish. When a sensor (e.g. sensor 10, 50, 100, 200 etc.) is placed on a surface of relatively high index, such as on an LCD display the reflection losses and surface scattering effects may be significantly reduced (e.g. by close to half).

A potential application of the transparent sensor array is to place it on a stretchable display to enable touch and gesture-based interactions even during bending and stretching. If the device is also made sensitive to stretch, image distortion could be corrected. In general, the compliance and transparency offer the promise of applying the sensor arrays to virtually any surface.

In some embodiments, in addition to detecting and distinguishing between increasing and decreasing proximity of a pointing element, touch by a pointing element, pressure applied by a pointing element, stretching (and/or other deformation) of the sensor, and any of the above while stretching and/or otherwise deforming the sensor, any of the sensors described or depicted herein may be employed (e.g. in conjunction with a processor such as processor 385, for example) to quantitatively determine or estimate the proximity of a pointing element, the pressure applied by a pointing element to the sensor, the amount of stretch and/or other deformation of the sensor and combinations thereof. Such quantitative determinations or estimations may be based at least in part on the magnitude of the capacitance (e.g. fringe capacitance $C_{fringe}$, and/or overlap capacitance $C_{overlap}$) of the sensor. The relationship between capacitance and such quantitative determinations or estimations may be derived experimentally or otherwise. In some embodiments, such quantitative determinations or estimations may be relative (e.g. may describe a change in proximity of a pointing element, a change in pressure applied by a pointing element and/or a change in stretch or deformation of the sensor) while in other embodiments, such quantitative determinations or estimations may be absolute values.

Embodiments of the invention may be implemented using specifically designed hardware, configurable hardware, programmable data processors (e.g. processor 385 and/or any other processors described herein) configured by the provision of software (which may optionally comprise "firmware") capable of executing on the data processors, special purpose computers or data processors that are specifically programmed, configured, or constructed to perform one or more steps in a method and/or to provide the functionality as explained in detail herein and/or combinations of two or more of these. Examples of specifically designed hardware are: logic circuits, application-specific integrated circuits ("ASICs"), large scale integrated circuits ("LSIs"), very large scale integrated circuits ("VLSIs"), and the like. Examples of configurable hardware are: one or more programmable logic devices such as programmable array logic ("PALs"), programmable logic arrays ("PLAs"), and field programmable gate arrays ("FPGAs")). Examples of programmable data processors are: microprocessors, digital signal processors ("DSPs"), embedded processors, graphics processors, math co-processors, general purpose computers, server computers, cloud computers, mainframe computers, computer workstations, and the like. For example, one or more data processors in a control circuit for a device may implement methods and/or provide functionality as described herein by executing software instructions in a program memory accessible to the processors.

Processing may be centralized or distributed. Where processing is distributed, information including software and/or data may be kept centrally or distributed. Such information may be exchanged between different functional units by way of a communications network, such as a Local Area Network (LAN), Wide Area Network (WAN), or the Internet, wired or wireless data links, electromagnetic signals, or other data communication channel.

While processes or blocks of some methods are presented herein in a given order, alternative examples may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed in parallel, or may be performed at different times. In addition, while elements are at times shown as being performed sequentially, they may instead be performed simultaneously or in different sequences. It is therefore intended that the following claims are interpreted to include all such variations as are within their intended scope.

Software and other modules may reside on servers, workstations, personal computers, tablet computers, image data encoders, image data decoders, PDAs, media players, and other devices suitable for the purposes described herein. Those skilled in the relevant art will appreciate that aspects of the system can be practised with other communications, data processing, or computer system configurations, including: Internet appliances, hand-held devices (including personal digital assistants (PDAs)), wearable computers, all manner of cellular or mobile phones, multi-processor systems, microprocessor-based or programmable consumer electronics, network PCs, mini-computers, mainframe computers, and the like.

Where a component (e.g. a software module, processor, assembly, device, circuit, etc.) is referred to above, unless otherwise indicated, reference to that component (including a reference to a "means") should be interpreted as including as equivalents of that component any component which performs the function of the described component (i.e., that is functionally equivalent), including components which are not structurally equivalent to the disclosed structure which performs the function in the illustrated exemplary embodiments of the invention.

Specific examples of systems, methods and apparatus have been described herein for purposes of illustration. These are only examples. The technology provided herein can be applied to systems other than the example systems described above. While a number of exemplary aspects and embodiments have been discussed above, those of skill in the art will recognize certain modifications, permutations, additions and sub-combinations thereof. This invention includes variations on described embodiments that would be apparent to the skilled addressee, including variations obtained by: replacing features, elements and/or acts with equivalent features, elements and/or acts; mixing and matching of features, elements and/or acts from different embodiments; combining features, elements and/or acts from embodiments as described herein with features, elements and/or acts of other technology; and/or omitting combining features, elements and/or acts from described embodiments. For example:

In the embodiments described herein, arrays of cluster sensors are described as being generally planar and two-dimensional. This is not necessary. In some embodiments, cluster sensor arrays may be provided on surfaces having other shapes and may be used to locate the proximity and/or contact of pointing elements upon such surfaces.

It is therefore intended that the following appended claims and claims hereafter introduced are interpreted to include such modifications, permutations, additions and sub-combinations as are consistent with the broadest interpretation of the specification as a whole.

What is claimed is:

1. A method for detecting, and discerning between, proximity of a pointing element to a sensor unit and contact force applied to the sensor unit by the pointing element, the method comprising:
    providing a sensor unit comprising:
        a capacitive fringe sensor having a fringe capacitance ($C_{fringe}$) and comprising first and second deformable fringe electrodes spaced apart from one another, the first fringe electrode comprising a first distal fringe surface facing in a Z direction generally away from the second fringe electrode and a first proximate fringe surface facing in a negative-Z direction generally toward the second fringe electrode;
        a capacitive overlap sensor having an overlap capacitance ($C_{overlap}$) and comprising first and second deformable overlap electrodes spaced apart from one another, the first overlap electrode comprising a first distal overlap surface facing in the Z direction generally away from the second overlap electrode and a first proximate overlap surface facing generally in the negative-Z direction toward the second overlap electrode; and
    applying a fringe voltage between the first and second fringe electrodes and thereby creating a fringe electric field ($E_{fringe}$) in a vicinity of the fringe sensor;
    applying an overlap voltage between the first and second overlap electrodes and thereby creating an overlap electric field ($E_{overlap}$) in a vicinity of the overlap sensor;
    wherein the fringe electric field ($E_{fringe}$) has a distal fringe flux ($\Phi_{distal,fringe}$) of the fringe electric field into or out of the first distal fringe surface in the Z direction and a proximate fringe flux ($\Phi_{prox,fringe}$) of the fringe electric field into or out of the first proximate fringe surface in the negative-Z direction;

wherein the overlap electric field ($E_{overlap}$) has a distal overlap flux ($\Phi_{distal,overlap}$) of the overlap electric field into or out of the first distal overlap surface in the positive Z direction or negative direction and a proximate overlap flux ($\Phi_{prox,overlap}$) of the overlap electric field into or out of the first proximate overlap surface in the negative-Z direction or positive Z direction; and wherein a fringe-sensor flux ratio FSFR=$\Phi$_(distal, fringe)/$\Phi$_(prox, fringe) is greater than an overlap-sensor flux ratio OSFR=$\Phi$_(distal,ovelap)/($\Phi$_(prox, overlap)) to thereby make the fringe capacitance ($C_{fringe}$) relatively more sensitive to proximity of the pointing element than the overlap capacitance ($C_{overlap}$) and the overlap capacitance ($C_{overlap}$) relatively more sensitive to contact force applied to the sensor unit by the pointing element than the fringe capacitance ($C_{fringe}$);

estimating values of the fringe capacitance ($C_{fringe}$) and the overlap capacitance ($C_{overlap}$); and detecting, and discerning between, proximity of the pointing element to the sensor unit and contact force applied to the sensor unit by the pointing element based on the estimated values of the fringe capacitance ($C_{fringe}$) and the overlap capacitance ($C_{overlap}$);

connecting a circuit to apply the fringe voltage and the overlap voltage at nominal voltage levels;

determining the estimated values for the fringe capacitance ($C_{fringe}$) and the overlap capacitance ($C_{overlap}$) to be a nominal fringe capacitance level ($C_{f,nom}$) and a nominal overlap capacitance level ($C_{o,nom}$) respectively when the pointing element is not proximate to the sensor unit and is not applying contact force to the sensor unit; and at least one of generating and outputting one or more signals indicating that the pointing element is not proximate to the sensor unit and is not applying contact force to the sensor unit when the estimated value of the fringe capacitance ($C_{fringe}$) is within a threshold range around the nominal fringe capacitance level ($C_{f,nom}$) and the estimated value of the overlap capacitance ($C_{overlap}$) is within a threshold range around the nominal overlap capacitance level ($C_{o,nom}$).

2. A method for detecting, and discerning between, proximity of a pointing element to a sensor unit and contact force applied to the sensor unit by the pointing element, the method comprising:

providing a sensor unit comprising:

a capacitive fringe sensor having a fringe capacitance ($C_{fringe}$) and comprising first and second deformable fringe electrodes spaced apart from one another, the first fringe electrode comprising a first distal fringe surface facing in a Z direction generally away from the second fringe electrode and a first proximate fringe surface facing in a negative-Z direction generally toward the second fringe electrode;

a capacitive overlap sensor having an overlap capacitance ($C_{overlap}$) and comprising first and second deformable overlap electrodes spaced apart from one another, the first overlap electrode comprising a first distal overlap surface facing in the Z direction generally away from the second overlap electrode and a first proximate overlap surface facing generally in the negative-Z direction toward the second overlap electrode; and applying a fringe voltage between the first and second fringe electrodes and thereby creating a fringe electric field ($E_{fringe}$) in a vicinity of the fringe sensor;

applying an overlap voltage between the first and second overlap electrodes and thereby creating an overlap electric field ($E_{overlap}$) in a vicinity of the overlap sensor;

wherein the fringe electric field ($E_{fringe}$) has a distal fringe flux ($\Phi_{distal,fringe}$) of the fringe electric field into or out of the first distal fringe surface in the Z direction and a proximate fringe flux ($\Phi_{prox,fringe}$) of the fringe electric field into or out of the first proximate fringe surface in the negative-Z direction;

wherein the overlap electric field ($E_{overlap}$) has a distal overlap flux ($\Phi_{distal,overlap}$) of the overlap electric field into or out of the first distal overlap surface in the positive Z direction or negative direction and a proximate overlap flux ($\Phi_{prox,overlap}$) of the overlap electric field into or out of the first proximate overlap surface in the negative-Z direction or positive Z direction; and wherein a fringe-sensor flux ratio FSFR=$\Phi$_(distal, fringe)/$\Phi$_(prox, fringe) is greater than an overlap-sensor flux ratio OSFR=$\Phi$_(distal,ovelap)/($\Phi$_(prox, overlap)) to thereby make the fringe capacitance ($C_{fringe}$) relatively more sensitive to proximity of the pointing element than the overlap capacitance ($C_{overlap}$) and the overlap capacitance ($C_{overlap}$) relatively more sensitive to contact force applied to the sensor unit by the pointing element than the fringe capacitance ($C_{fringe}$);

estimating values of the fringe capacitance ($C_{fringe}$) and the overlap capacitance ($C_{overlap}$); and detecting, and discerning between, proximity of the pointing element to the sensor unit and contact force applied to the sensor unit by the pointing element based on the estimated values of the fringe capacitance ($C_{fringe}$) and the overlap capacitance ($C_{overlap}$);

connecting a circuit to apply the fringe voltage and the overlap voltage at nominal voltage levels;

determining the estimated values for the fringe capacitance ($C_{fringe}$) and the overlap capacitance ($C_{overlap}$) to be a nominal fringe capacitance level ($C_{f,nom}$) and a nominal overlap capacitance level (C) respectively when the pointing element is not proximate to the sensor unit and is not applying contact force to the sensor unit; and at least one of generating and outputting one or more signals indicating that the pointing element is proximate to the sensor unit but is not applying contact force to the sensor unit when the estimated value of the fringe capacitance ($C_{fringe}$) is below the nominal fringe capacitance level ($C_{f,nom}$) by more than a proximity threshold amount and the estimated value of the overlap capacitance ($C_{overlap}$) is within a threshold range around the nominal overlap capacitance level ($C_{o,nom}$).

3. A method for detecting, and discerning between, proximity of a pointing element to a sensor unit and contact force applied to the sensor unit by the pointing element, the method comprising:

providing a sensor unit comprising:

a capacitive fringe sensor having a fringe capacitance ($C_{fringe}$) and comprising first and second deformable fringe electrodes spaced apart from one another, the first fringe electrode comprising a first distal fringe surface facing in a Z direction generally away from the second fringe electrode and a first proximate fringe surface facing in a negative-Z direction generally toward the second fringe electrode;

a capacitive overlap sensor having an overlap capacitance ($C_{overlap}$) and comprising first and second deformable overlap electrodes spaced apart from one another, the first overlap electrode comprising a first distal overlap surface facing in the Z direction generally away from the second overlap electrode and a first proximate overlap surface facing generally in the negative-Z direction toward the second overlap electrode; and applying a fringe voltage between the first and second fringe electrodes and thereby creating a fringe electric field ($E_{fringe}$) in a vicinity of the fringe sensor;

applying an overlap voltage between the first and second overlap electrodes and thereby creating an overlap electric field ($E_{overlap}$) in a vicinity of the overlap sensor;

wherein the fringe electric field ($E_{fringe}$) has a distal fringe flux ($\Phi_{distal,fringe}$) of the fringe electric field into or out of the first distal fringe surface in the Z direction and a proximate fringe flux ($\Phi_{prox,fringe}$) of the fringe electric field into or out of the first proximate fringe surface in the negative-Z direction;

wherein the overlap electric field ($E_{overlap}$) has a distal overlap flux ($\Phi_{distal,overlap}$) of the overlap electric field into or out of the first distal overlap surface in the positive Z direction or negative direction and a proximate overlap flux ($\Phi_{prox,overlap}$) of the overlap electric field into or out of the first proximate overlap surface in the negative-Z direction or positive Z direction; and wherein a fringe-sensor flux ratio FSFR=$\Phi$_(distal, fringe)/$\Phi$_(prox, fringe) is greater than an overlap-sensor flux ratio OSFR=$\Phi$_(distal,ovelap)/($\Phi$_(prox, overlap)) to thereby make the fringe capacitance ($C_{fringe}$) relatively more sensitive to proximity of the pointing element than the overlap capacitance ($C_{overlap}$) and the overlap capacitance ($C_{overlap}$) relatively more sensitive to contact force applied to the sensor unit by the pointing element than the fringe capacitance ($C_{fringe}$);

estimating values of the fringe capacitance ($C_{fringe}$) and the overlap capacitance ($C_{overlap}$); and detecting, and discerning between, proximity of the pointing element to the sensor unit and contact force applied to the sensor unit by the pointing element based on the estimated values of the fringe capacitance ($C_{fringe}$) and the overlap capacitance ($C_{overlap}$);

connecting a circuit to apply the fringe voltage and the overlap voltage at nominal voltage levels;

determining the estimated values for the fringe capacitance ($C_{fringe}$) and the overlap capacitance ($C_{overlap}$) to be a nominal fringe capacitance level ($C_{f,nom}$) and a nominal overlap capacitance level ($C_{o,nom}$) respectively when the pointing element is not proximate to the sensor unit and is not applying contact force to the sensor unit; and at least one of generating and outputting one or more signals indicating that the pointing element is in contact with the sensor unit when the estimated value of the fringe capacitance ($C_{fringe}$) is below the nominal fringe capacitance level ($C_{f,nom}$) by more than a contact threshold amount and the estimated value of the overlap capacitance ($C_{overlap}$) is within a threshold range around the nominal overlap capacitance level ($C_{o,nom}$).

4. A method for detecting, and discerning between, proximity of a pointing element to a sensor unit and contact force applied to the sensor unit by the pointing element, the method comprising:

providing a sensor unit comprising:

a capacitive fringe sensor having a fringe capacitance ($C_{fringe}$) and comprising first and second deformable fringe electrodes spaced apart from one another, the first fringe electrode comprising a first distal fringe surface facing in a Z direction generally away from the second fringe electrode and a first proximate fringe surface facing in a negative-Z direction generally toward the second fringe electrode;

a capacitive overlap sensor having an overlap capacitance ($C_{overlap}$) and comprising first and second deformable overlap electrodes spaced apart from one another, the first overlap electrode comprising a first distal overlap surface facing in the Z direction generally away from the second overlap electrode and a first proximate overlap surface facing generally in the negative-Z direction toward the second overlap electrode; and applying a fringe voltage between the first and second fringe electrodes and thereby creating a fringe electric field ($E_{fringe}$) in a vicinity of the fringe sensor;

applying an overlap voltage between the first and second overlap electrodes and thereby creating an overlap electric field ($E_{overlap}$) in a vicinity of the overlap sensor;

wherein the fringe electric field ($E_{fringe}$) has a distal fringe flux ($\Phi_{distal,fringe}$) of the fringe electric field into or out of the first distal fringe surface in the Z direction and a proximate fringe flux ($\Phi_{prox,fringe}$) of the fringe electric field into or out of the first proximate fringe surface in the negative-Z direction;

wherein the overlap electric field ($E_{overlap}$) has a distal overlap flux ($\Phi_{distal,overlap}$) of the overlap electric field into or out of the first distal overlap surface in the positive Z direction or negative direction and a proximate overlap flux ($\Phi_{prox,overlap}$) of the overlap electric field into or out of the first proximate overlap surface in the negative-Z direction or positive Z direction; and wherein a fringe-sensor flux ratio FSFR=$\Phi$_(distal, fringe)/$\Phi$_(prox, fringe) is greater than an overlap-sensor flux ratio OSFR=$\Phi$_(distal,ovelap)/($\Phi$_(prox, overlap)) to thereby make the fringe capacitance ($C_{fringe}$) relatively more sensitive to proximity of the pointing element than the overlap capacitance ($C_{overlap}$) and the overlap capacitance ($C_{overlap}$) relatively more sensitive to contact force applied to the sensor unit by the pointing element than the fringe capacitance ($C_{fringe}$);

estimating values of the fringe capacitance ($C_{fringe}$) and the overlap capacitance ($C_{overlap}$); and detecting, and discerning between, proximity of the pointing element to the sensor unit and contact force applied to the sensor unit by the pointing element based on the estimated values of the fringe capacitance ($C_{fringe}$) and the overlap capacitance ($C_{overlap}$);

connecting a circuit to apply the fringe voltage and the overlap voltage at nominal voltage levels;

determining the estimated values for the fringe capacitance ($C_{fringe}$) and the overlap capacitance ($C_{overlap}$) to be a nominal fringe capacitance level ($C_{f,nom}$) and a nominal overlap capacitance level ($C_{o,nom}$) respectively when the pointing element is not proximate to the sensor unit and is not applying contact force to the sensor unit; and at least one of generating and outputting one or more signals indicating that the pointing element is applying contact force to the sensor unit when the estimated value of the overlap capacitance ($C_{overlap}$) is above the nominal overlap capacitance level ($C_{o,nom}$) by more than a contact threshold amount.

5. A method for detecting, and discerning between, proximity of a pointing element to a sensor unit and contact force applied to the sensor unit by the pointing element, the method comprising:

providing a sensor unit comprising:

a capacitive fringe sensor having a fringe capacitance ($C_{fringe}$) and comprising first and second deformable fringe electrodes spaced apart from one another, the first fringe electrode comprising a first distal fringe surface facing in a Z direction generally away from the second fringe electrode and a first proximate fringe surface facing in a negative-Z direction generally toward the second fringe electrode;

a capacitive overlap sensor having an overlap capacitance ($C_{overlap}$) and comprising first and second deformable overlap electrodes spaced apart from one another, the first overlap electrode comprising a first distal overlap surface facing in the Z direction generally away from the second overlap electrode and a first proximate overlap surface facing generally in the negative-Z direction toward the second overlap electrode; and applying a fringe voltage between the first and second fringe electrodes and thereby creating a fringe electric field ($E_{fringe}$) in a vicinity of the fringe sensor;

applying an overlap voltage between the first and second overlap electrodes and thereby creating an overlap electric field ($E_{overlap}$) in a vicinity of the overlap sensor;

wherein the fringe electric field ($E_{fringe}$) has a distal fringe flux ($\Phi_{distal,fringe}$) of the fringe electric field into or out of the first distal fringe surface in the Z direction and a proximate fringe flux ($\Phi_{prox,fringe}$) of the fringe electric field into or out of the first proximate fringe surface in the negative-Z direction;

wherein the overlap electric field ($E_{overlap}$) has a distal overlap flux ($\Phi_{distal,overlap}$) of the overlap electric field into or out of the first distal overlap surface in the positive Z direction or negative direction and a proximate overlap flux ($\Phi_{prox,overlap}$) of the overlap electric field into or out of the first proximate overlap surface in the negative-Z direction or positive Z direction; and wherein a fringe-sensor flux ratio FSFR=$\Phi$_(distal, fringe)/$\Phi$_(prox, fringe) is greater than an overlap-sensor flux ratio OSFR=$\Phi$_(distal,ovelap)/($\Phi$_(prox, overlap)) to thereby make the fringe capacitance ($C_{fringe}$) relatively more sensitive to proximity of the pointing element than the overlap capacitance ($C_{overlap}$) and the overlap capacitance ($C_{overlap}$) relatively more sensitive to contact force applied to the sensor unit by the pointing element than the fringe capacitance ($C_{fringe}$);

estimating values of the fringe capacitance ($C_{fringe}$) and the overlap capacitance ($C_{overlap}$); and detecting, and discerning between, proximity of the pointing element to the sensor unit and contact force applied to the sensor unit by the pointing element based on the estimated values of the fringe capacitance ($C_{fringe}$) and the overlap capacitance ($C_{overlap}$);

connecting a circuit to apply the fringe voltage and the overlap voltage at nominal voltage levels;

determining the estimated values for the fringe capacitance ($C_{fringe}$) and the overlap capacitance ($C_{overlap}$) to be a nominal fringe capacitance level ($C_{f,nom}$) and a nominal overlap capacitance level ($C_{o,nom}$) respectively when the pointing element is not proximate to the sensor unit and is not applying contact force to the sensor unit; and at least one of generating and outputting one or more signals indicating that the pointing element is proximate to the sensor unit and moving toward the sensor unit when the estimated value of the fringe capacitance ($C_{fringe}$) is below the nominal fringe capacitance level ($C_{f,nom}$) by more than a proximity threshold amount for a period of time and the estimated value of the fringe capacitance ($C_{fringe}$) is decreasing over the period of time.

6. A method for detecting, and discerning between, proximity of a pointing element to a sensor unit and contact force applied to the sensor unit by the pointing element, the method comprising:

providing a sensor unit comprising:

a capacitive fringe sensor having a fringe capacitance ($C_{fringe}$) and comprising first and second deformable fringe electrodes spaced apart from one another, the first fringe electrode comprising a first distal fringe surface facing in a Z direction generally away from the second fringe electrode and a first proximate fringe surface facing in a negative-Z direction generally toward the second fringe electrode;

a capacitive overlap sensor having an overlap capacitance ($C_{overlap}$) and comprising first and second deformable overlap electrodes spaced apart from one another, the first overlap electrode comprising a first distal overlap surface facing in the Z direction generally away from the second overlap electrode and a first proximate overlap surface facing generally in the negative-Z direction toward the second overlap electrode; and applying a fringe voltage between the first and second fringe electrodes and thereby creating a fringe electric field ($E_{fringe}$) in a vicinity of the fringe sensor;

applying an overlap voltage between the first and second overlap electrodes and thereby creating an overlap electric field ($E_{overlap}$) in a vicinity of the overlap sensor;

wherein the fringe electric field ($E_{fringe}$) has a distal fringe flux ($\Phi_{distal,fringe}$) of the fringe electric field into or out of the first distal fringe surface in the Z direction and a proximate fringe flux ($\Phi_{prox,fringe}$) of the fringe electric field into or out of the first proximate fringe surface in the negative-Z direction;

wherein the overlap electric field ($E_{overlap}$) has a distal overlap flux ($\Phi_{distal,overlap}$) of the overlap electric field into or out of the first distal overlap surface in the positive Z direction or negative direction and a proximate overlap flux ($\Phi_{prox,overlap}$) of the overlap electric field into or out of the first proximate overlap surface in the negative-Z direction or positive Z direction; and wherein a fringe-sensor flux ratio FSFR=$\Phi$_(distal, fringe)/$\Phi$_(prox, fringe) is greater than an overlap-sensor flux ratio OSFR=$\Phi$_(distal,ovelap)/($\Phi$_(prox, overlap)) to thereby make the fringe capacitance ($C_{fringe}$) relatively more sensitive to proximity of the pointing element than the overlap capacitance ($C_{overlap}$) and the overlap capacitance ($C_{overlap}$) relatively more sensitive to contact force applied to the sensor unit by the pointing element than the fringe capacitance ($C_{fringe}$);

estimating values of the fringe capacitance ($C_{fringe}$) and the overlap capacitance ($C_{overlap}$); and detecting, and discerning between, proximity of the pointing element to the sensor unit and contact force applied to the sensor unit by the pointing element based on the estimated values of the fringe capacitance ($C_{fringe}$) and the overlap capacitance ($C_{overlap}$);

connecting a circuit to apply the fringe voltage and the overlap voltage at nominal voltage levels;

determining the estimated values for the fringe capacitance ($C_{fringe}$) and the overlap capacitance ($C_{overlap}$) to be a nominal fringe capacitance level ($C_{f,nom}$) and a nominal overlap capacitance level ($C_{o,nom}$) respectively when the pointing element is not proximate to the sensor unit and is not applying contact force to the sensor unit; and at least one of generating and outputting one or more signals indicating that the pointing element is proximate to the sensor unit and moving away from the sensor unit when the estimated value of the fringe capacitance ($C_{fringe}$) is below the nominal fringe capacitance level ($C_{f,nom}$) by more than a proximity threshold amount for a period of time and the estimated value of the fringe capacitance ($C_{fringe}$) is increasing over the period of time.

\* \* \* \* \*